United States Patent [19]
Kang

[11] Patent Number: 6,072,711
[45] Date of Patent: Jun. 6, 2000

[54] FERROELECTRIC MEMORY DEVICE WITHOUT A SEPARATE CELL PLATE LINE AND METHOD OF MAKING THE SAME

[75] Inventor: Hee Bok Kang, Daejeon-si, Rep. of Korea

[73] Assignee: LG Semicon Co., Ltd., Cheongju, Rep. of Korea

[*] Notice: This patent is subject to a terminal disclaimer.

[21] Appl. No.: 09/175,316

[22] Filed: Oct. 20, 1998

Related U.S. Application Data

[63] Continuation-in-part of application No. 09/055,985, Apr. 7, 1998.

[30] Foreign Application Priority Data

Dec. 12, 1997 [KR] Rep. of Korea ........................ 97-68192
May 15, 1998 [KR] Rep. of Korea ........................ 98-17602

[51] Int. Cl.[7] ........................................................ G11C 5/06
[52] U.S. Cl. .............................. 365/65; 365/65; 365/145; 365/149
[58] Field of Search ............................... 365/65, 145, 149

[56] References Cited

U.S. PATENT DOCUMENTS

| | | | |
|---|---|---|---|
| 4,433,390 | 2/1984 | Carp et al. ............................. | 364/900 |
| 4,873,664 | 10/1989 | Eaton, Jr. ............................... | 365/145 |
| 4,888,630 | 12/1989 | Paterson .................................. | 357/23.5 |
| 4,928,095 | 5/1990 | Kawahara ............................... | 340/784 |
| 5,371,699 | 12/1994 | Larson ..................................... | 365/145 |
| 5,373,463 | 12/1994 | Jones, Jr. ................................. | 365/145 |
| 5,608,667 | 3/1997 | Osawa ..................................... | 365/145 |
| 5,638,318 | 6/1997 | Seyyedy ................................... | 365/145 |
| 5,680,344 | 10/1997 | Seyyedy ................................... | 365/145 |
| 5,815,430 | 9/1998 | Verhaeghe et al. ..................... | 365/145 |
| 5,903,492 | 5/1999 | Takashima ............................... | 365/145 |
| 5,917,746 | 6/1999 | Seyyedy ................................... | 365/145 |

*Primary Examiner*—David Nelms
*Assistant Examiner*—Tuan T. Nguyen
*Attorney, Agent, or Firm*—Fleshner & Kim, LLP

[57] ABSTRACT

A ferroelectric memory device, e.g., nonvolatile, has an effective layout by eliminating a separate cell plate line. The ferroelectric memory device includes first and second split word lines formed over first and second active regions of a semiconductor substrate, and the first and second active regions are isolated from each other. Source and drain regions are formed in the first active region on both sides of the first split word line and the second active region on both sides of the second split word line. A conductive barrier layer, a first capacitor electrode and a ferroelectric layer are sequentially formed on the first and second split word lines. Two second capacitor electrodes with one connected to one of the source and drain regions of the second active region is formed over the first split word line. The other one is connected to one of the source and drain regions of the first active region and is formed over the second split word line. First and second bit lines are respectively connected to the other one of the source and drain regions of the first active region, and the other one of the source and drain regions of the second active region.

22 Claims, 77 Drawing Sheets

E : Electric Field
P : Polarization

FIG.9a
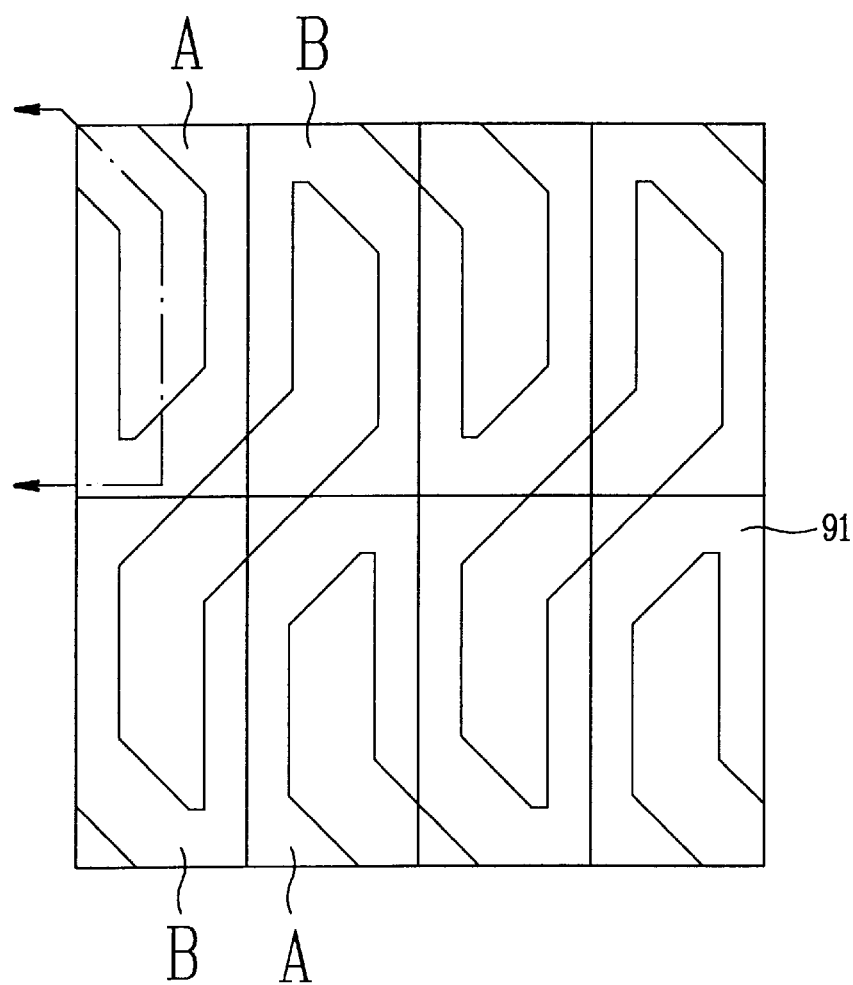
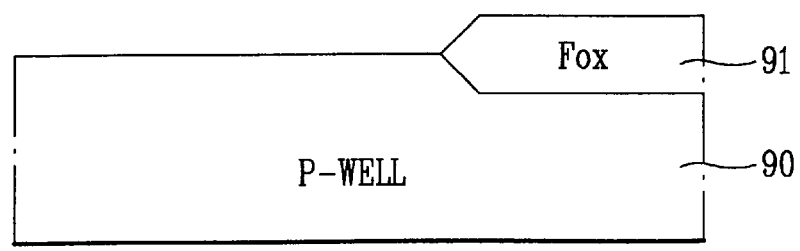

FIG.9b
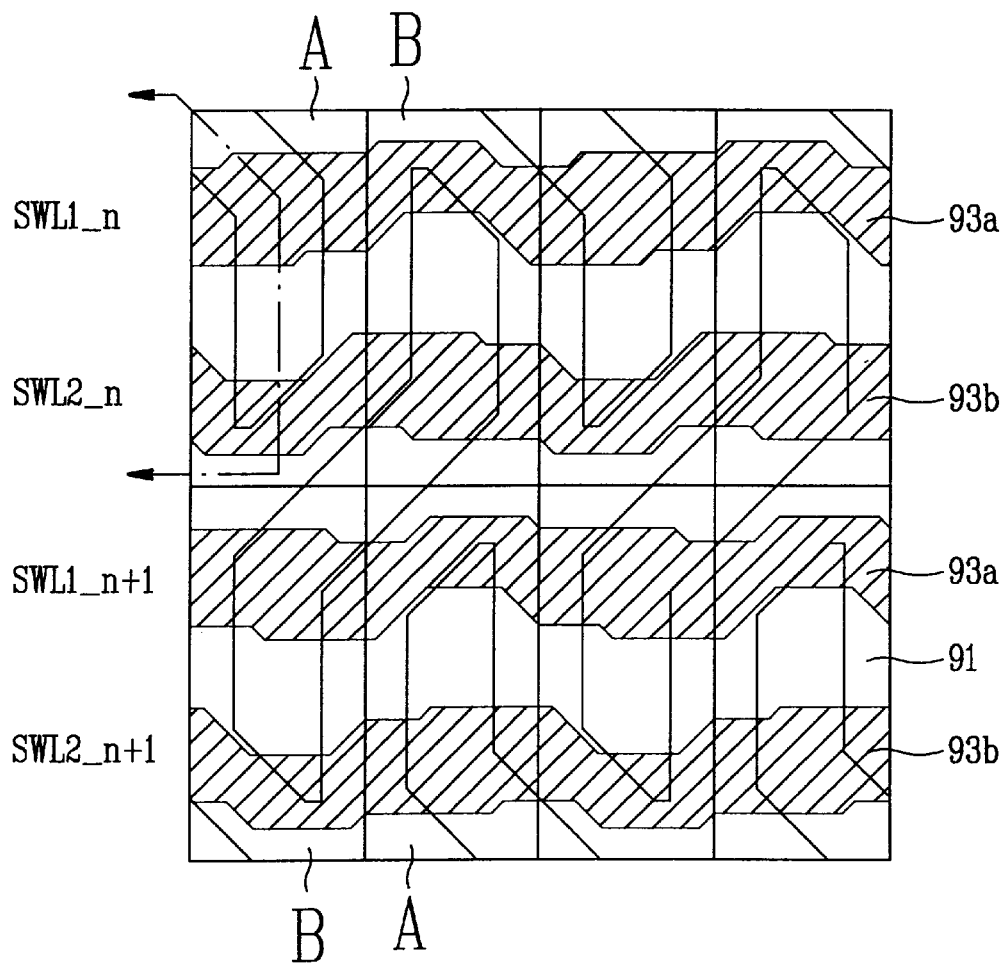
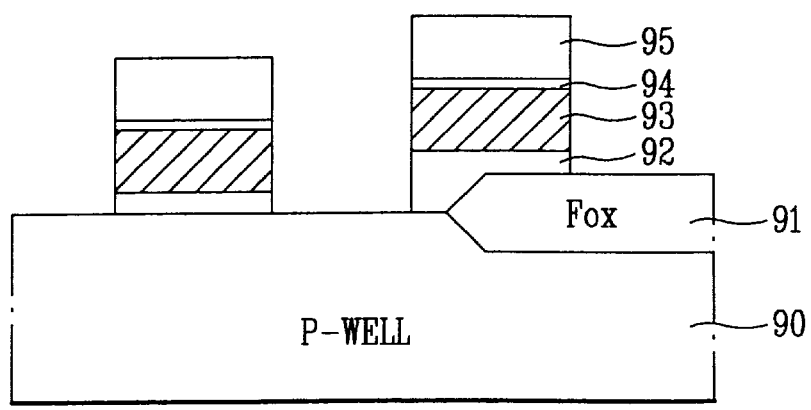

FIG.9c
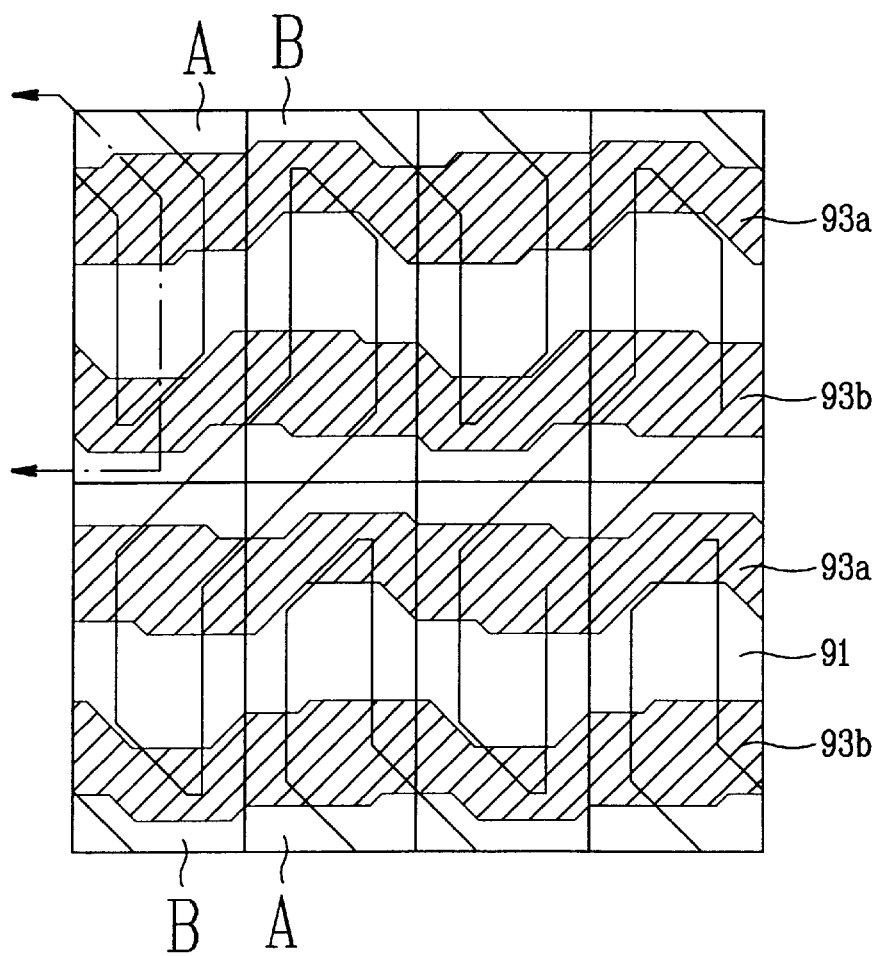
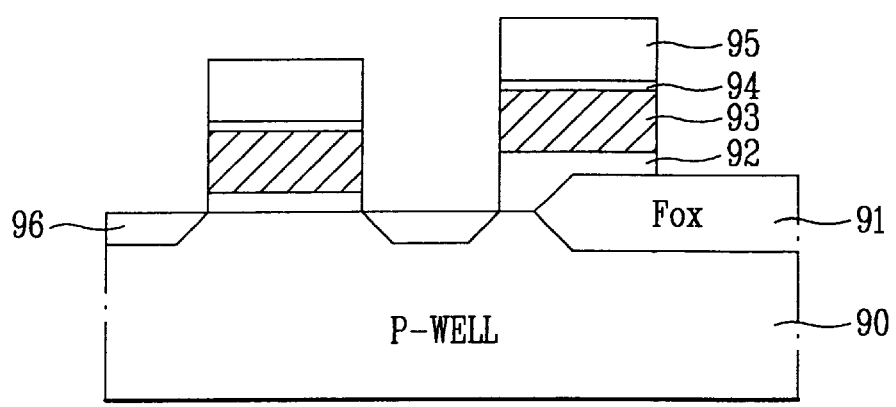

FIG.9d
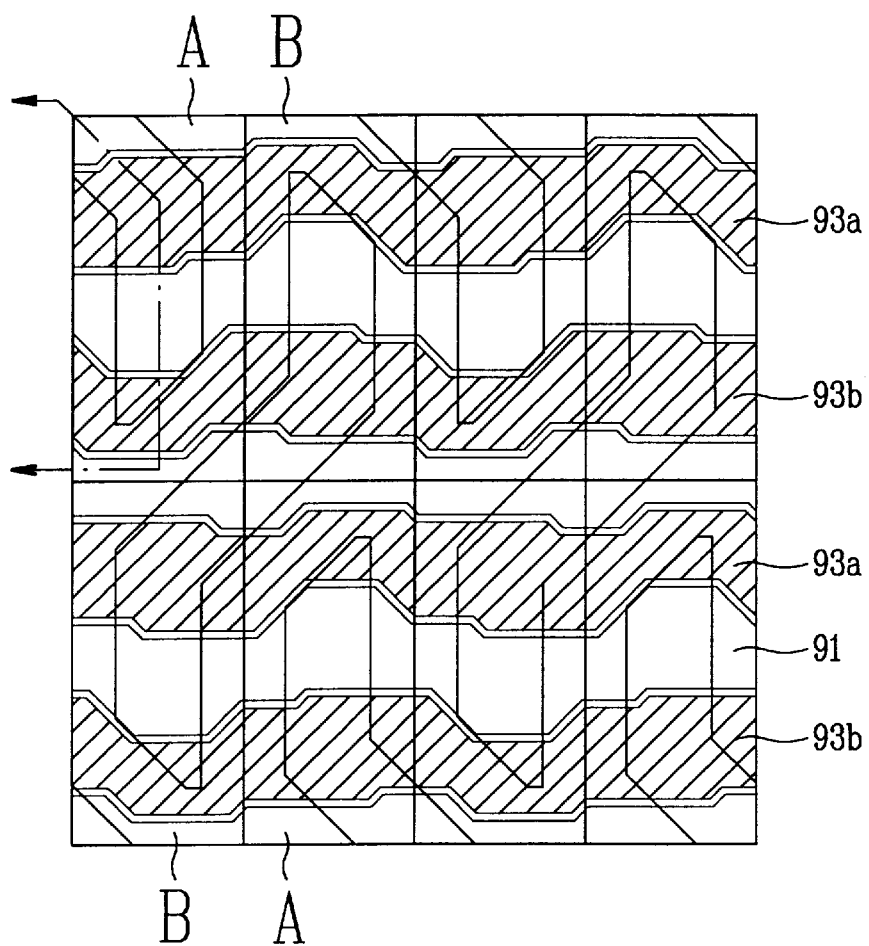
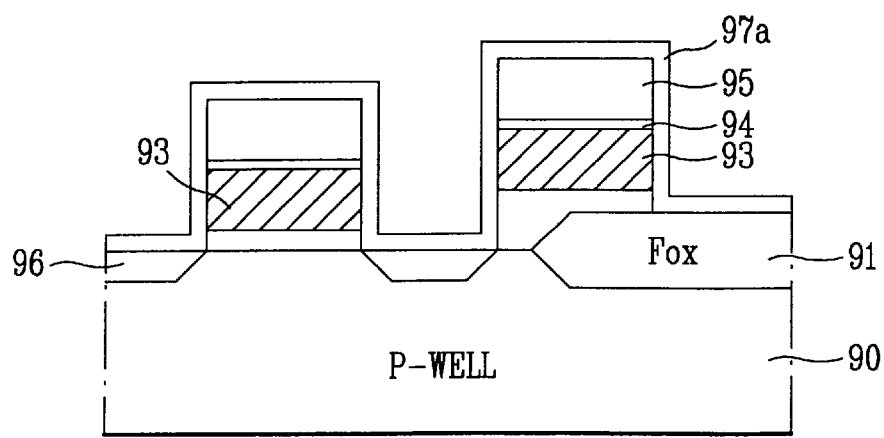

FIG.9e
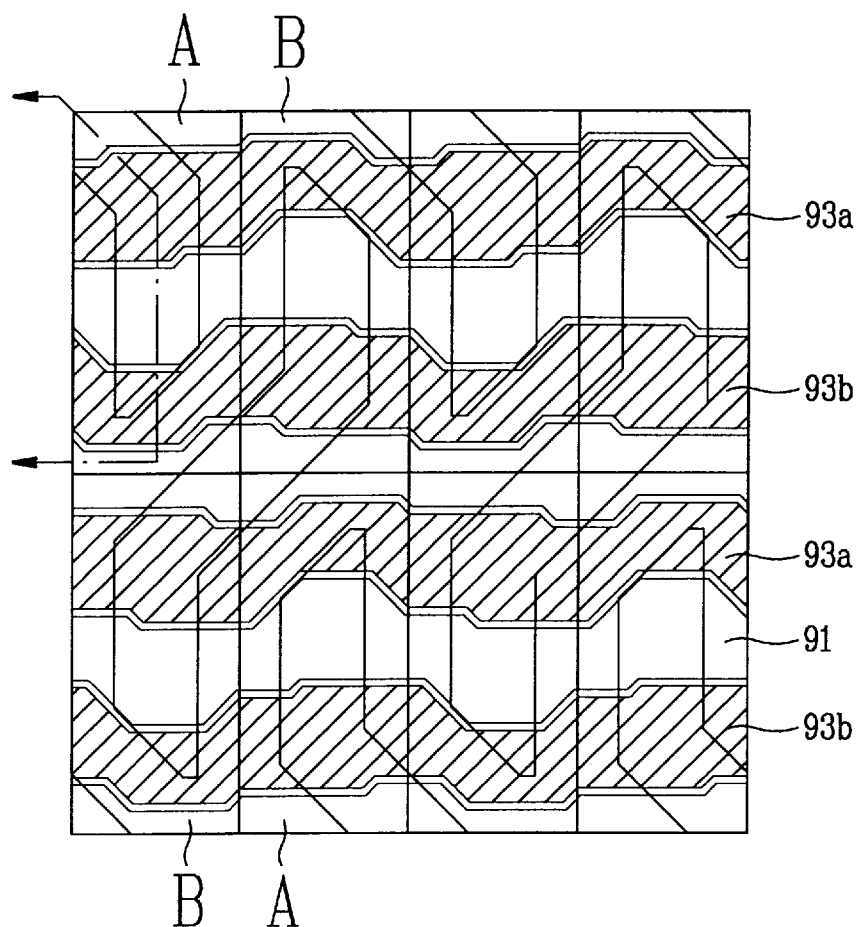
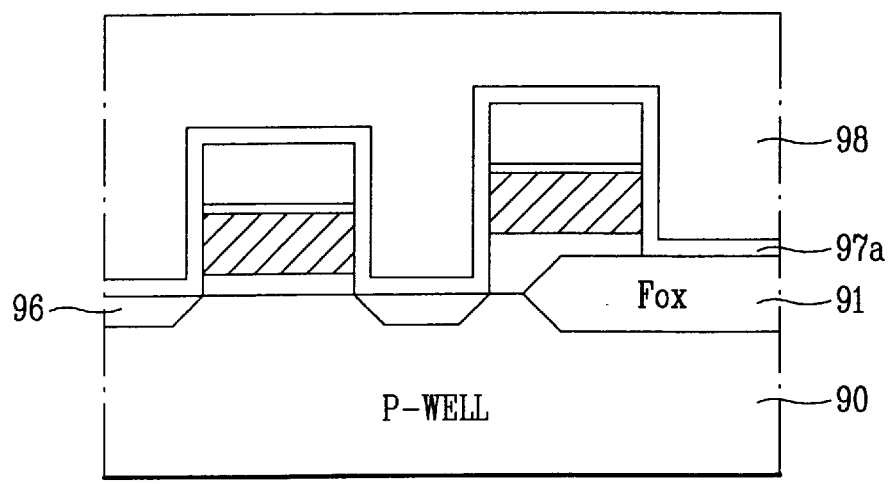

FIG.9f
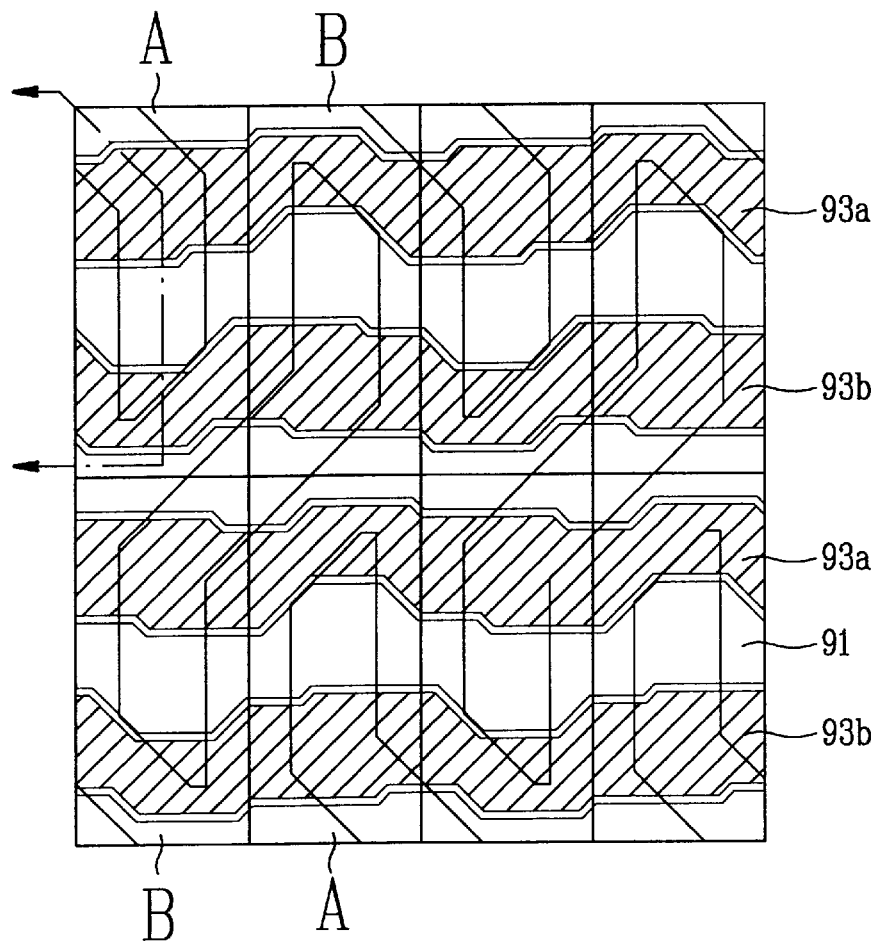
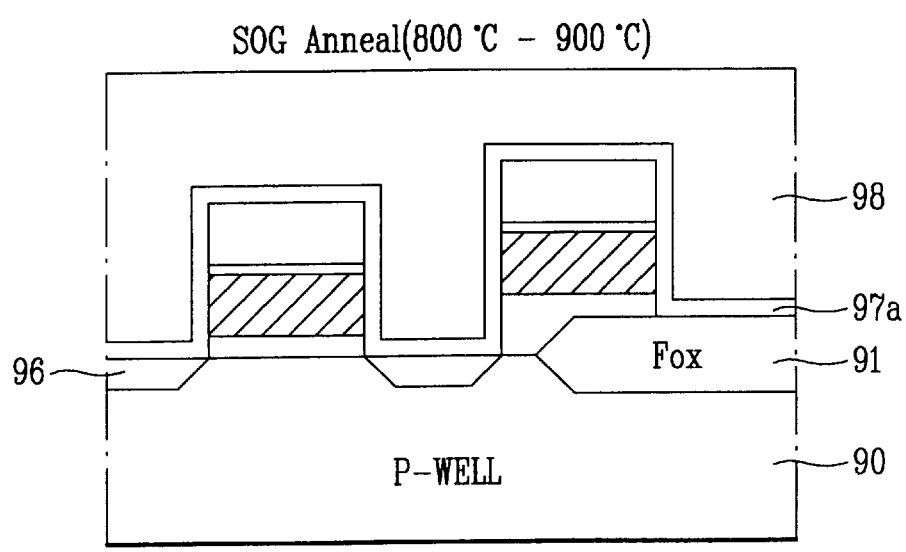

FIG.9g
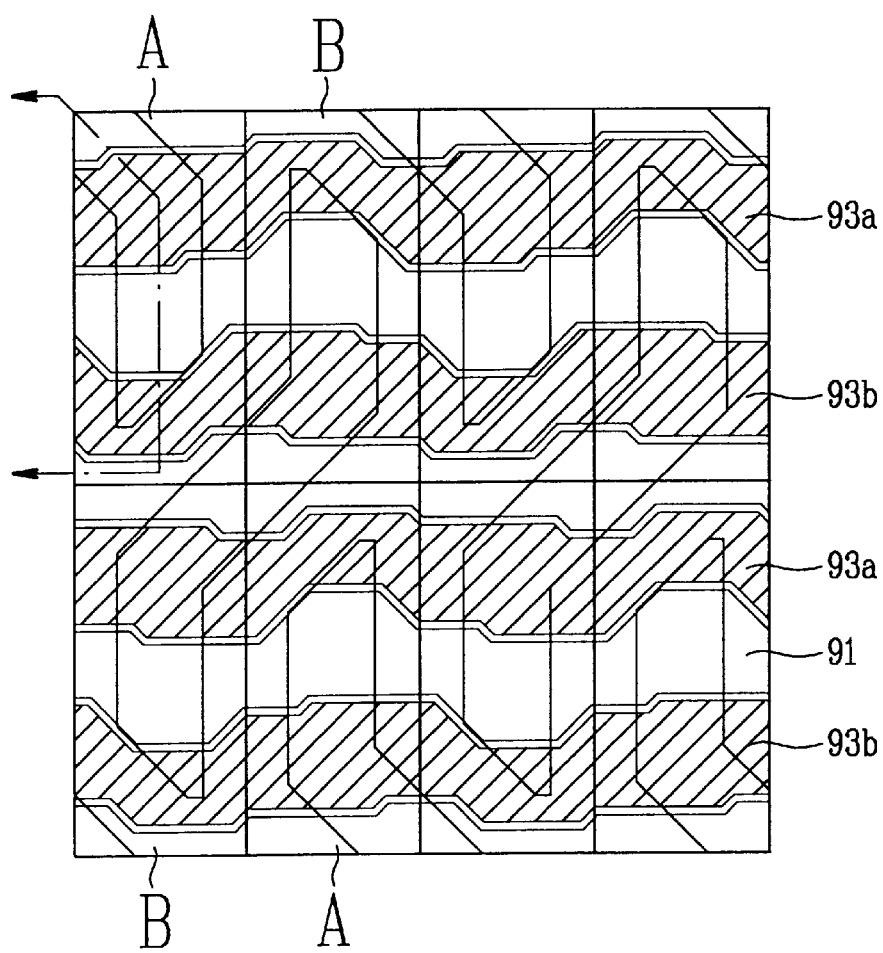
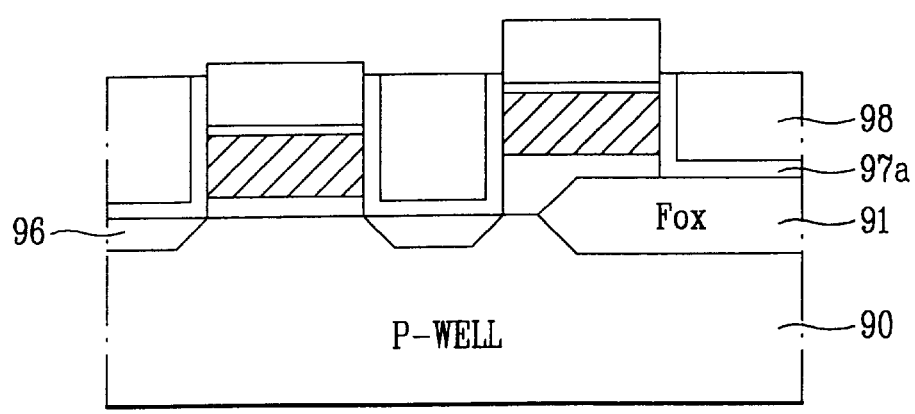

FIG.9h
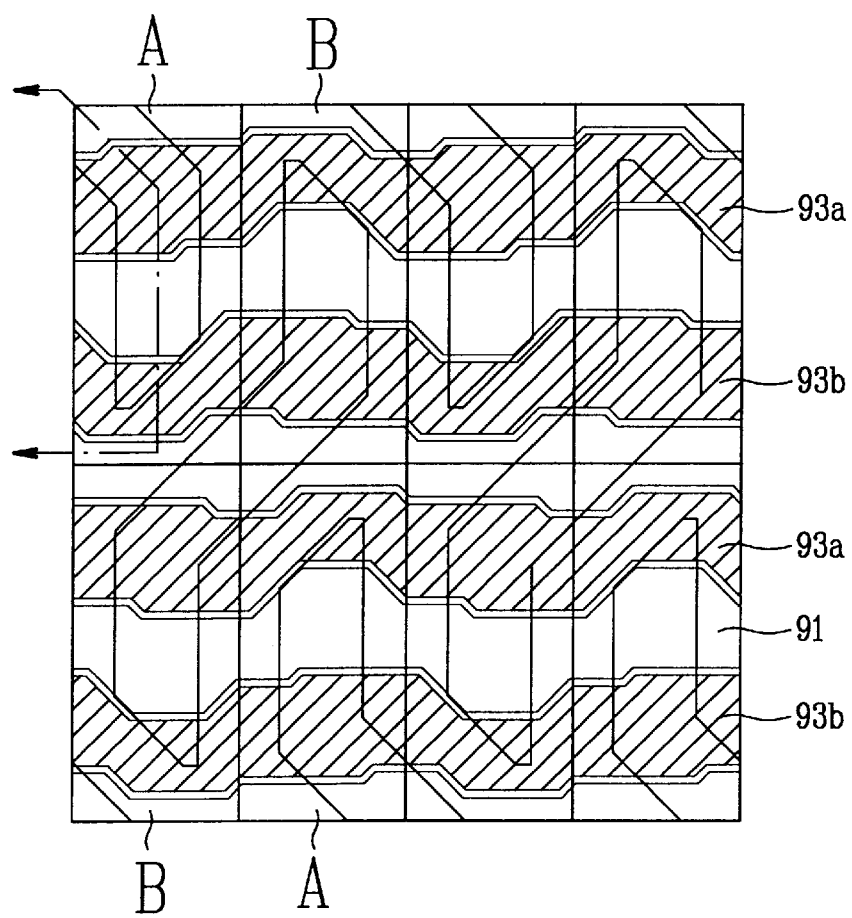
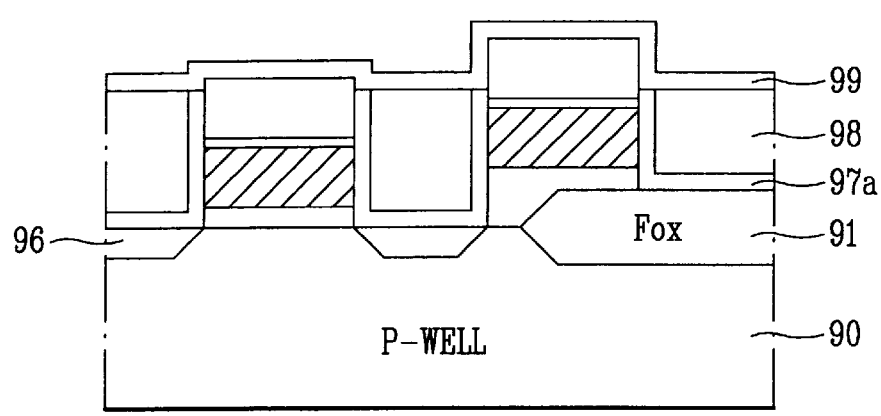

FIG.9i
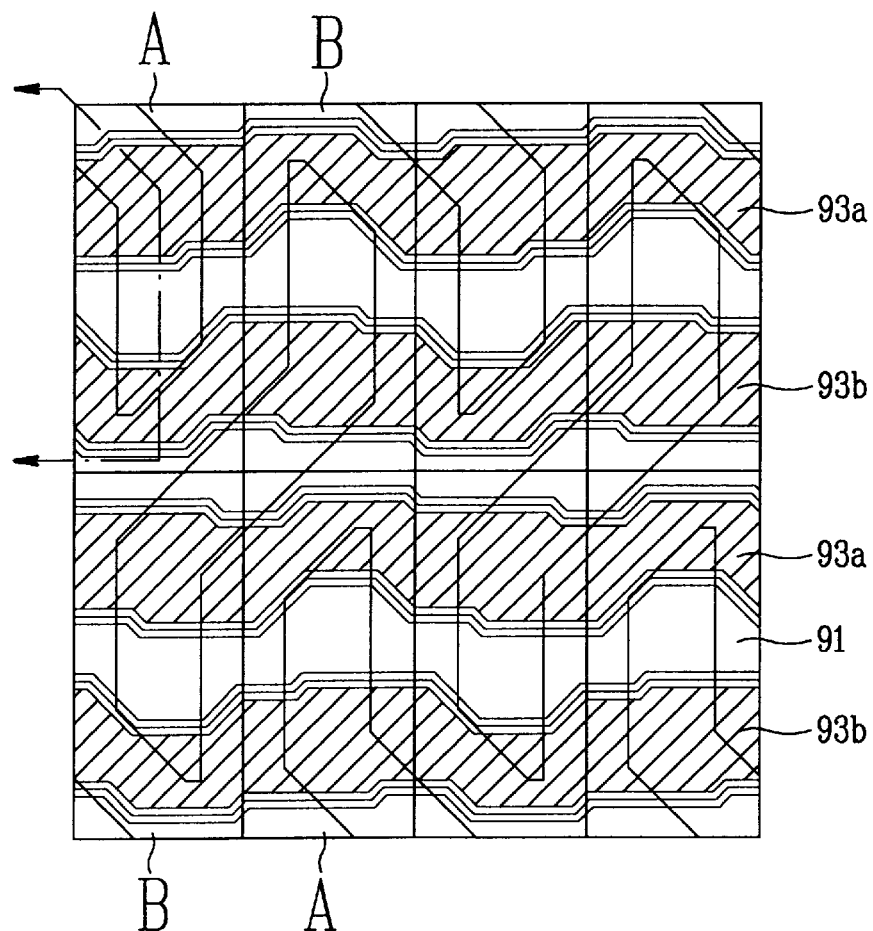
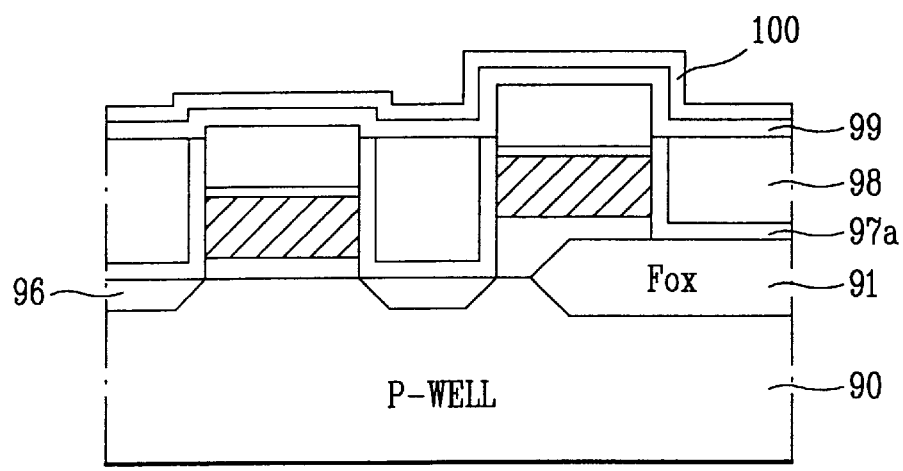

FIG.9j
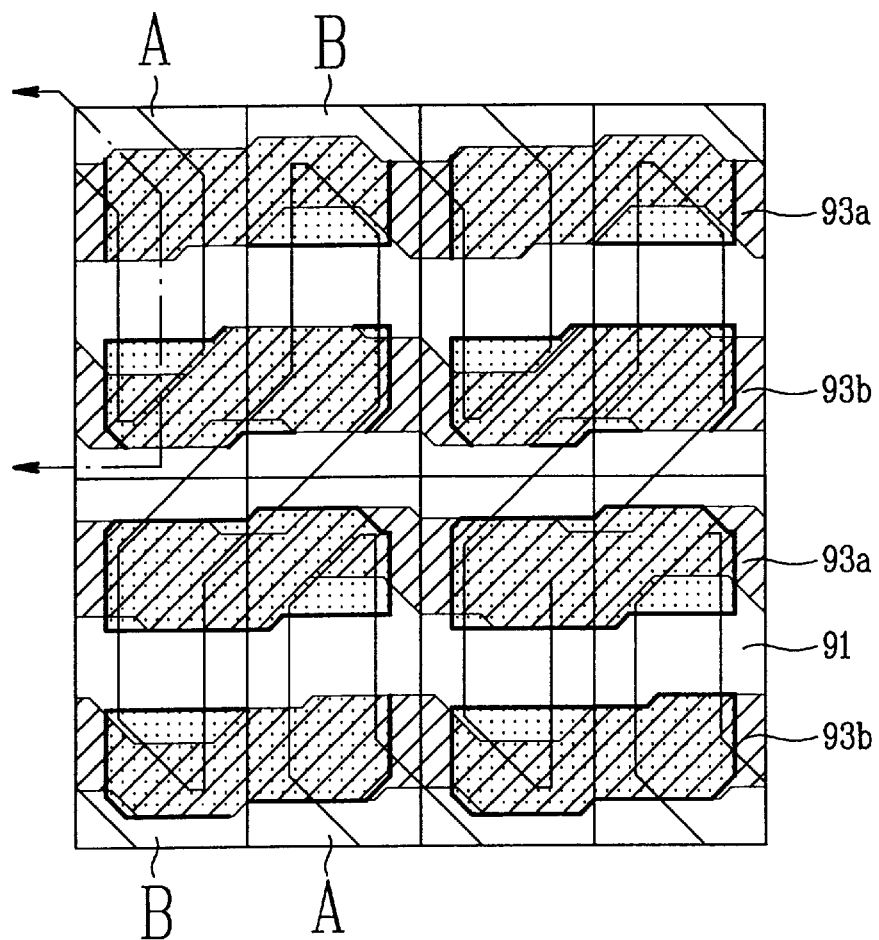
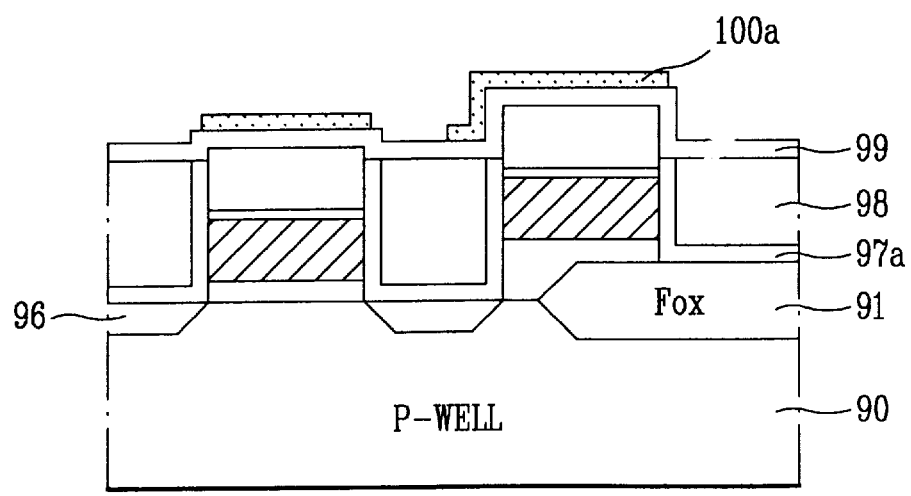

FIG.9k
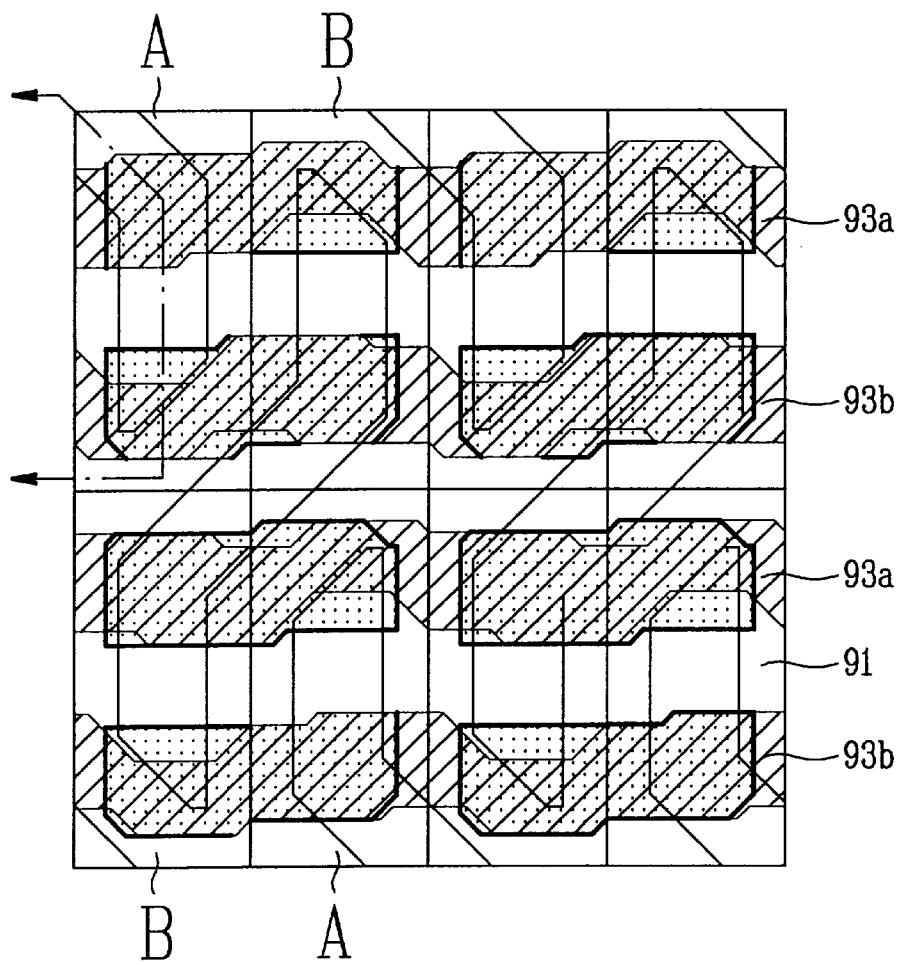
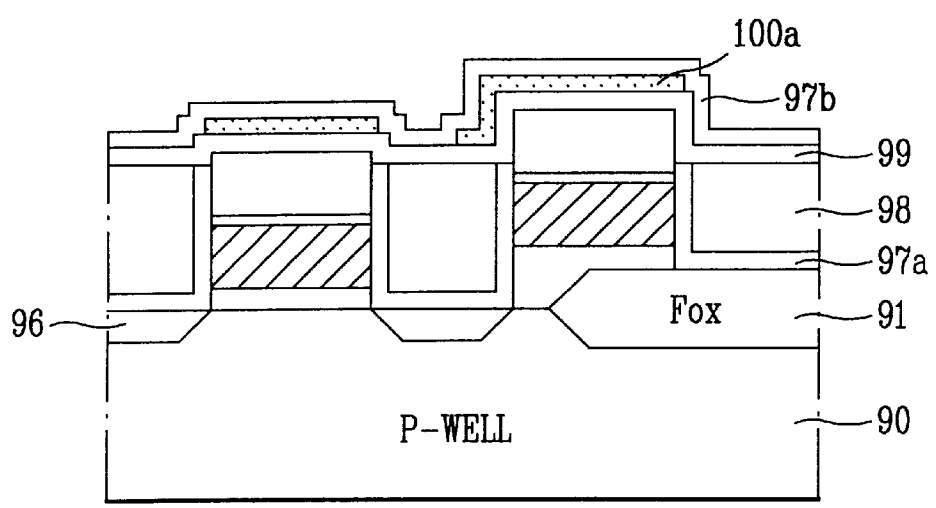

FIG. 91
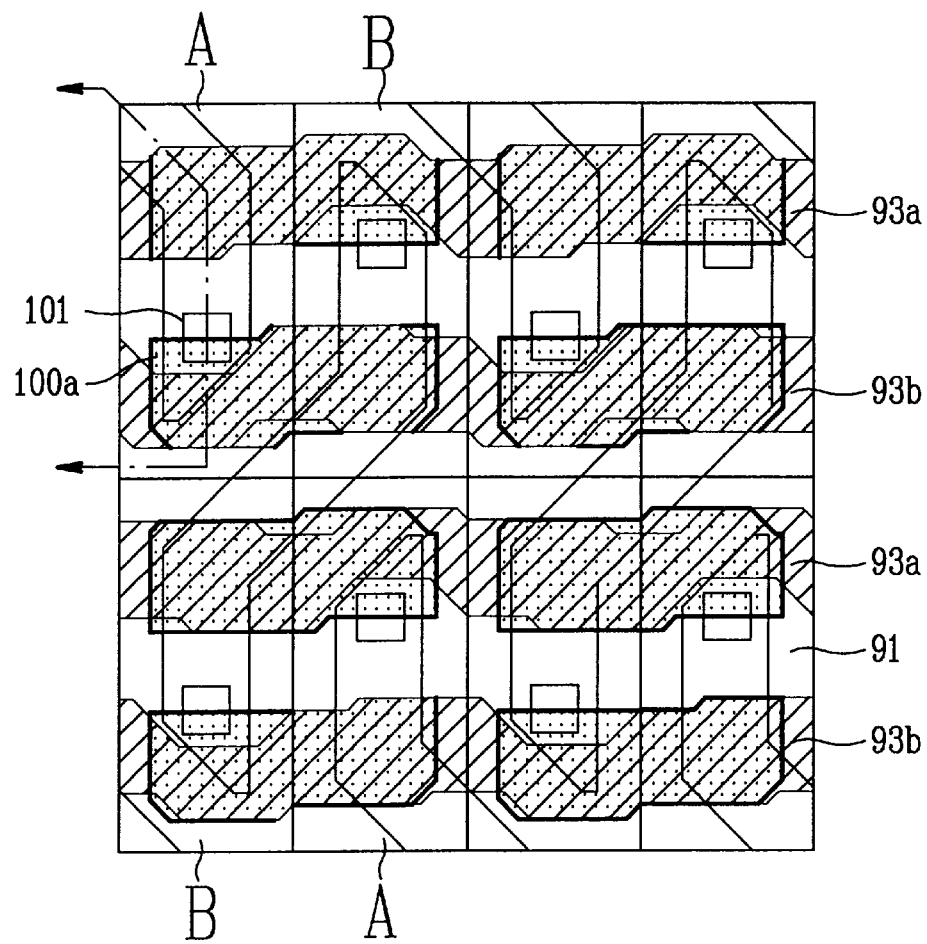
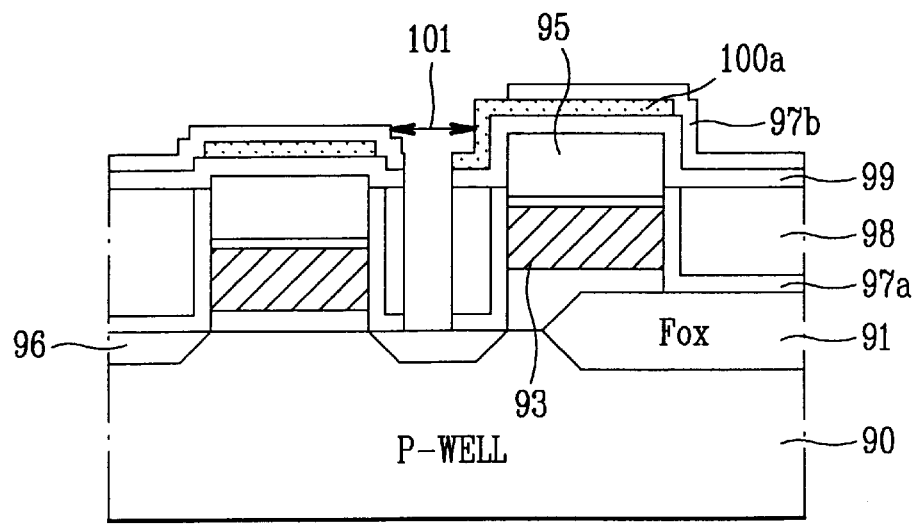

FIG.9m
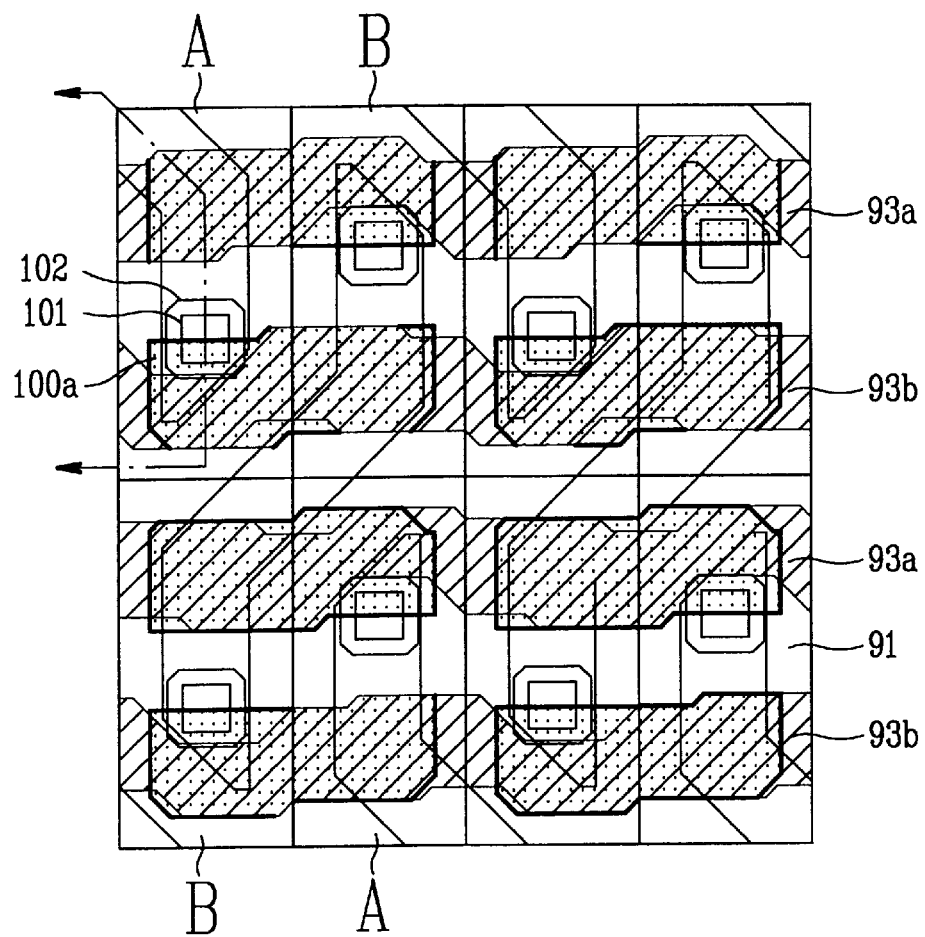
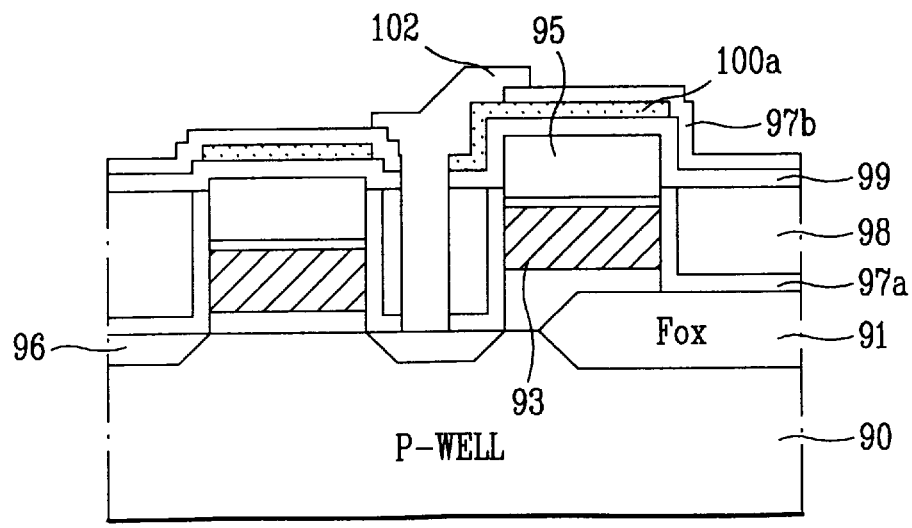

FIG.9n
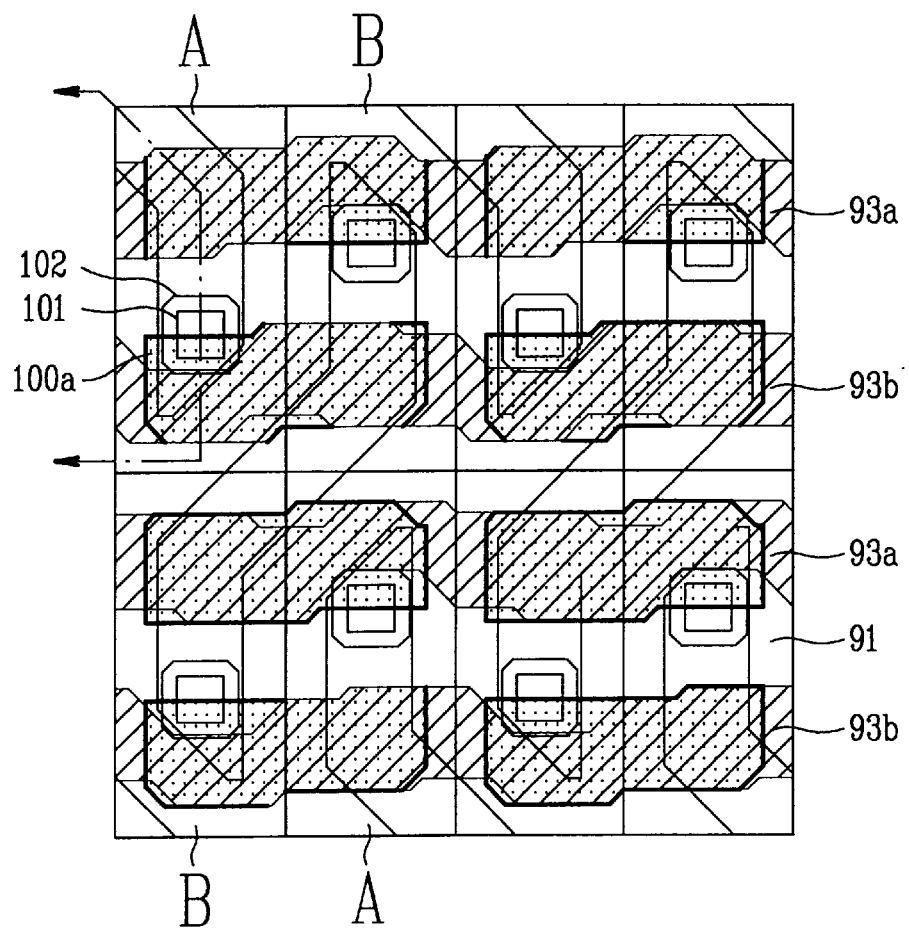
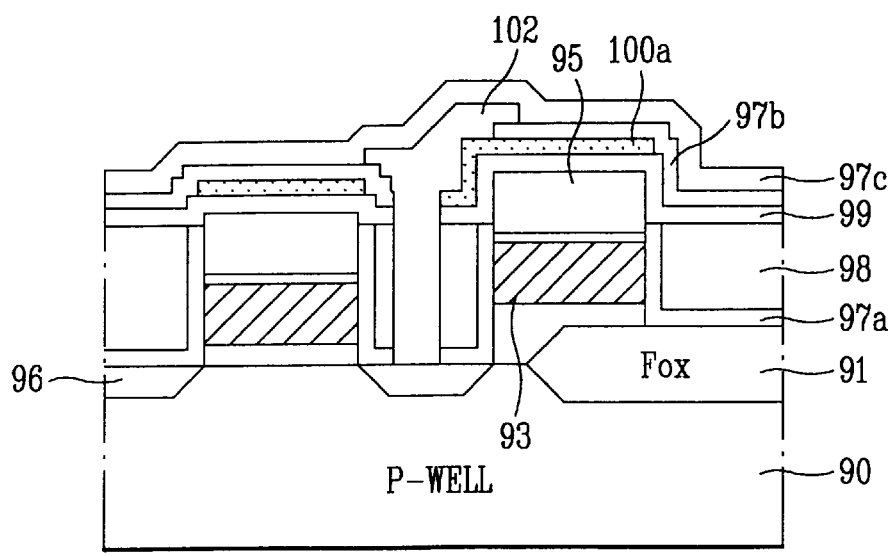

FIG.9o
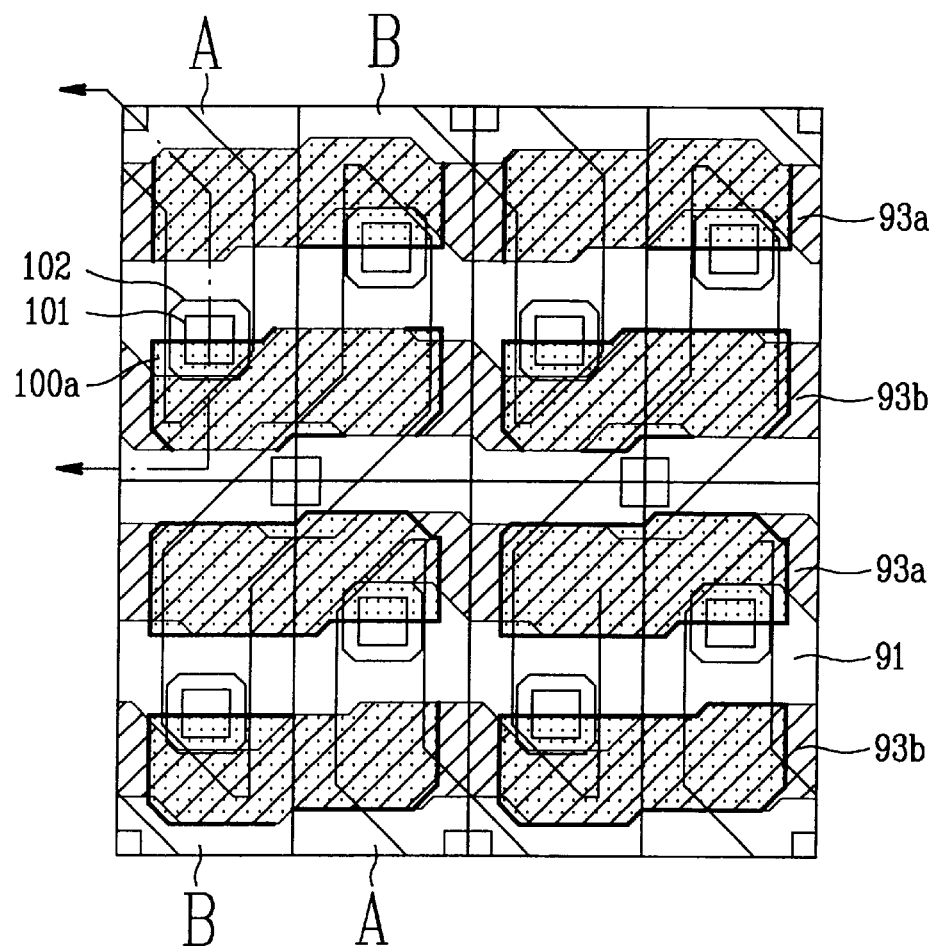
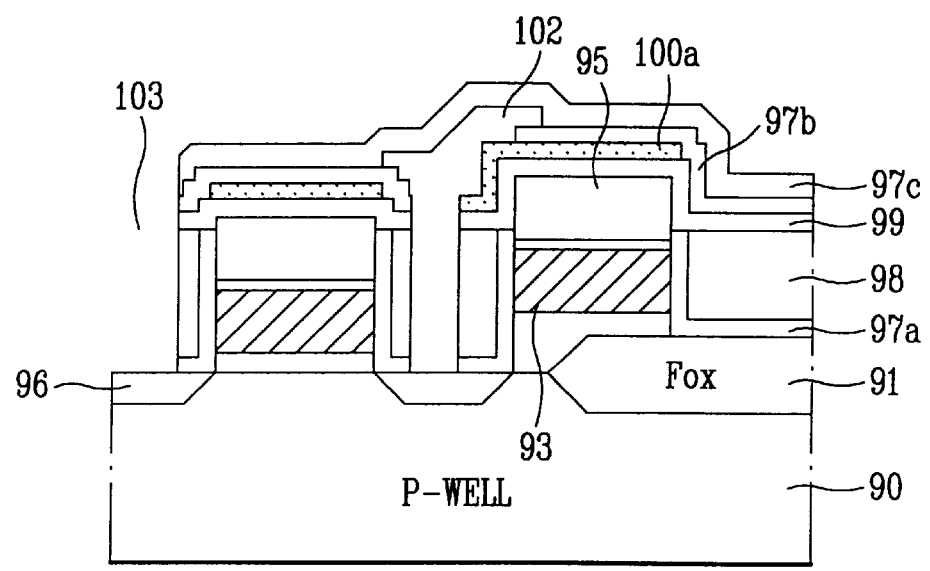

FIG.9p
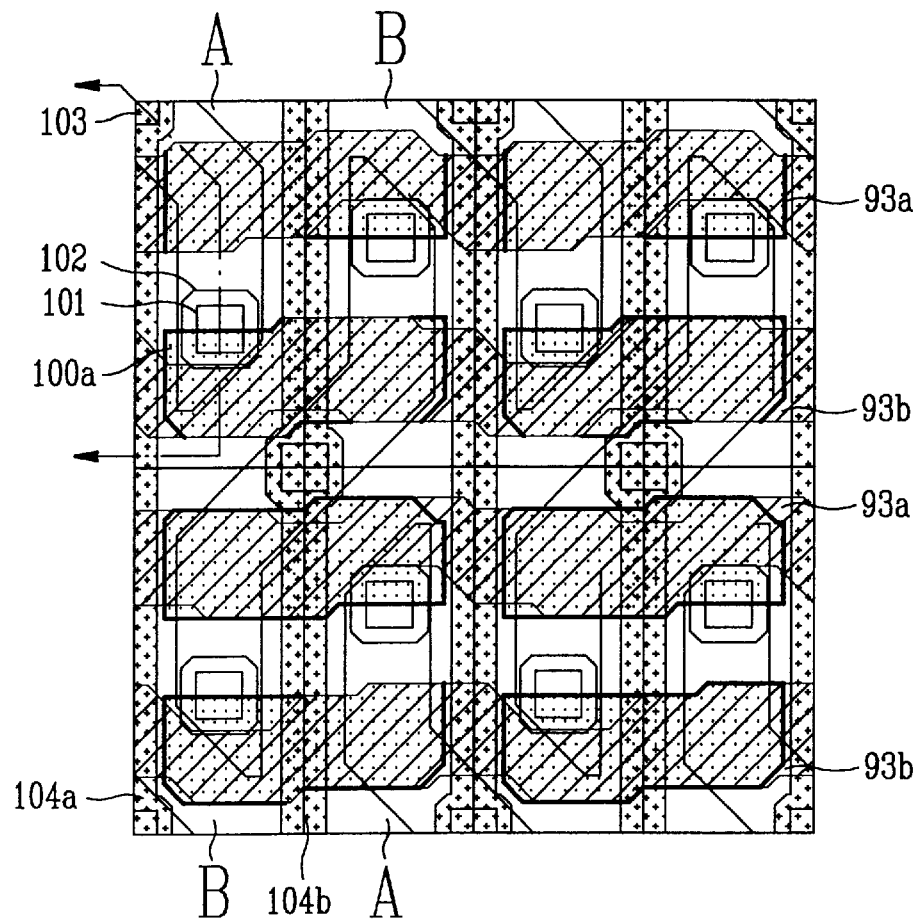
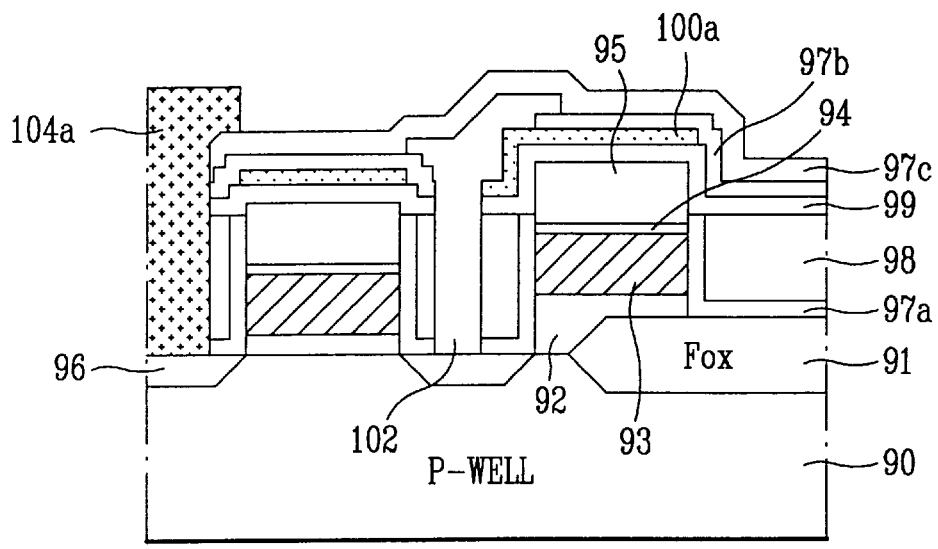

FIG.10a
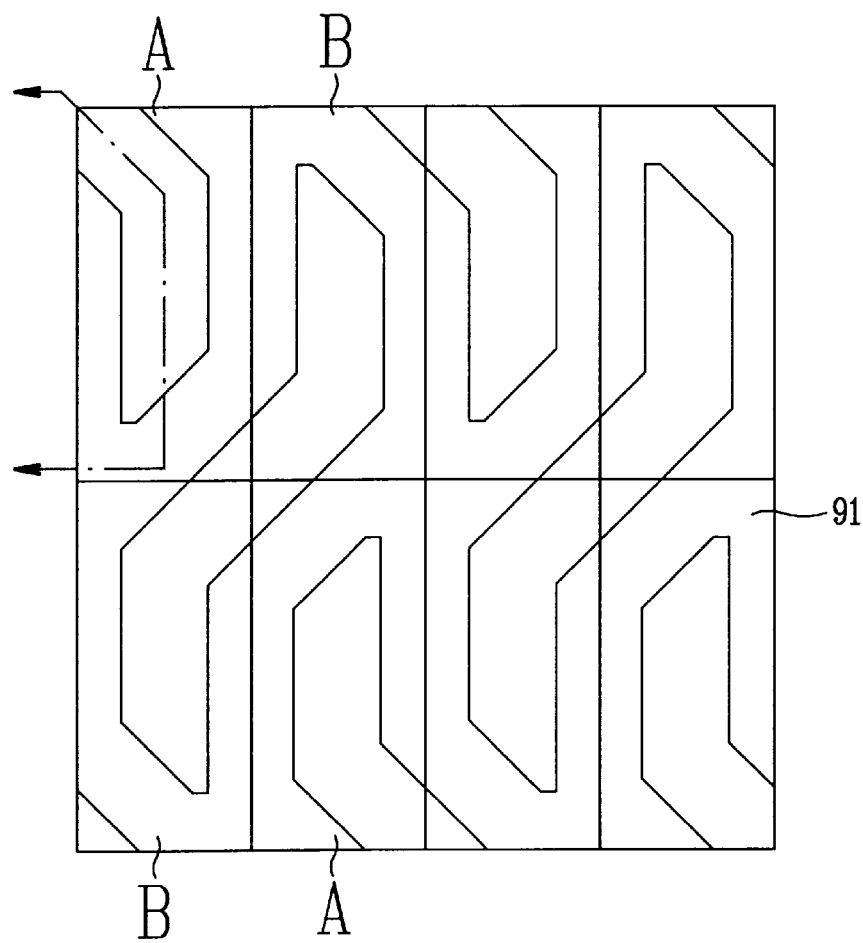
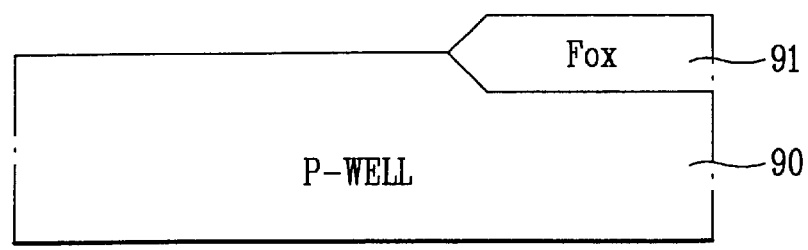

FIG.10b
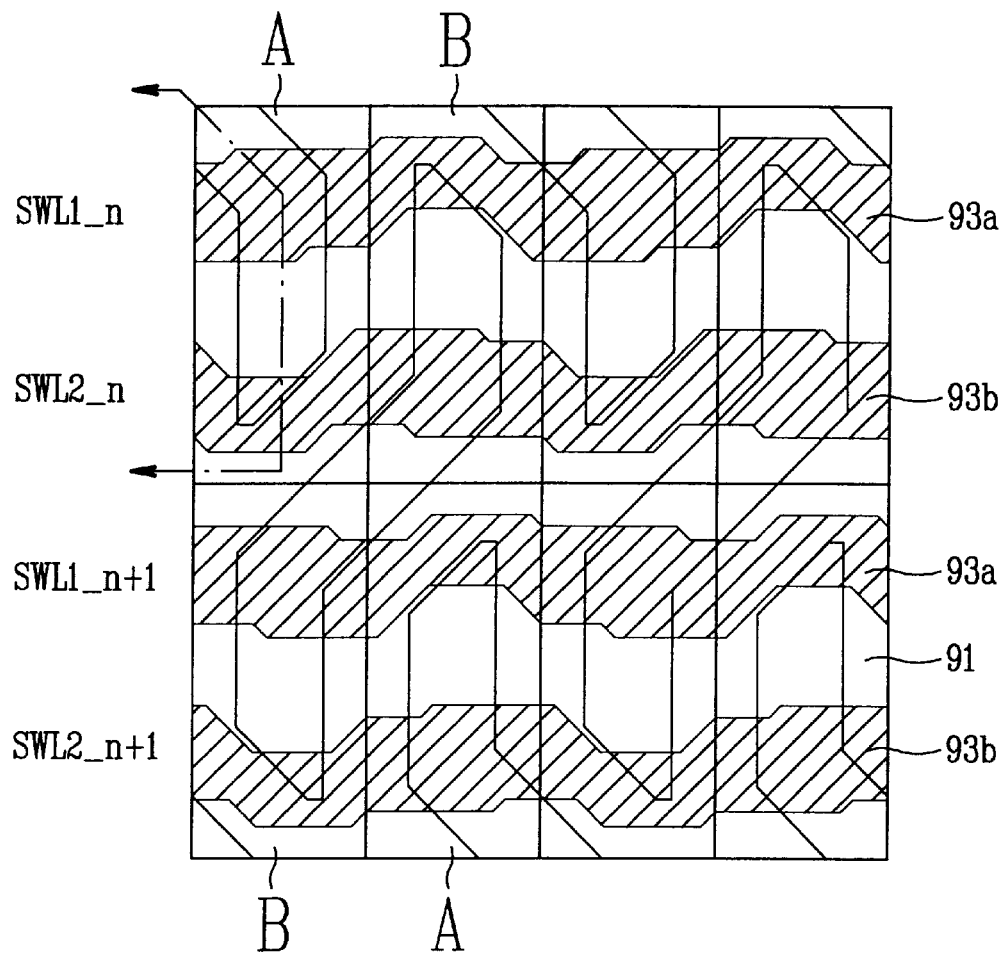
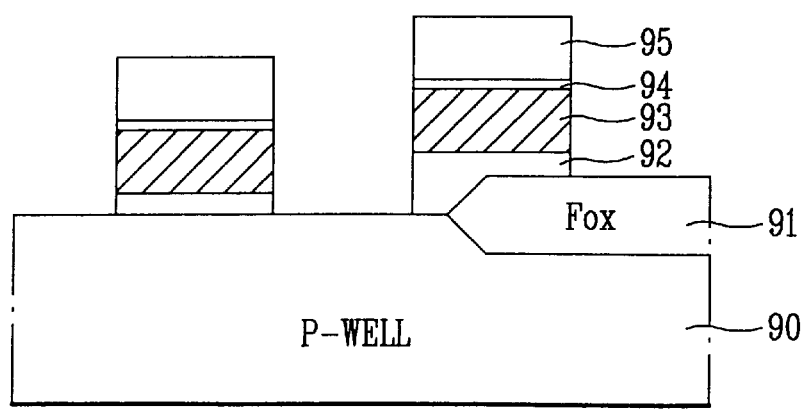

FIG.10c
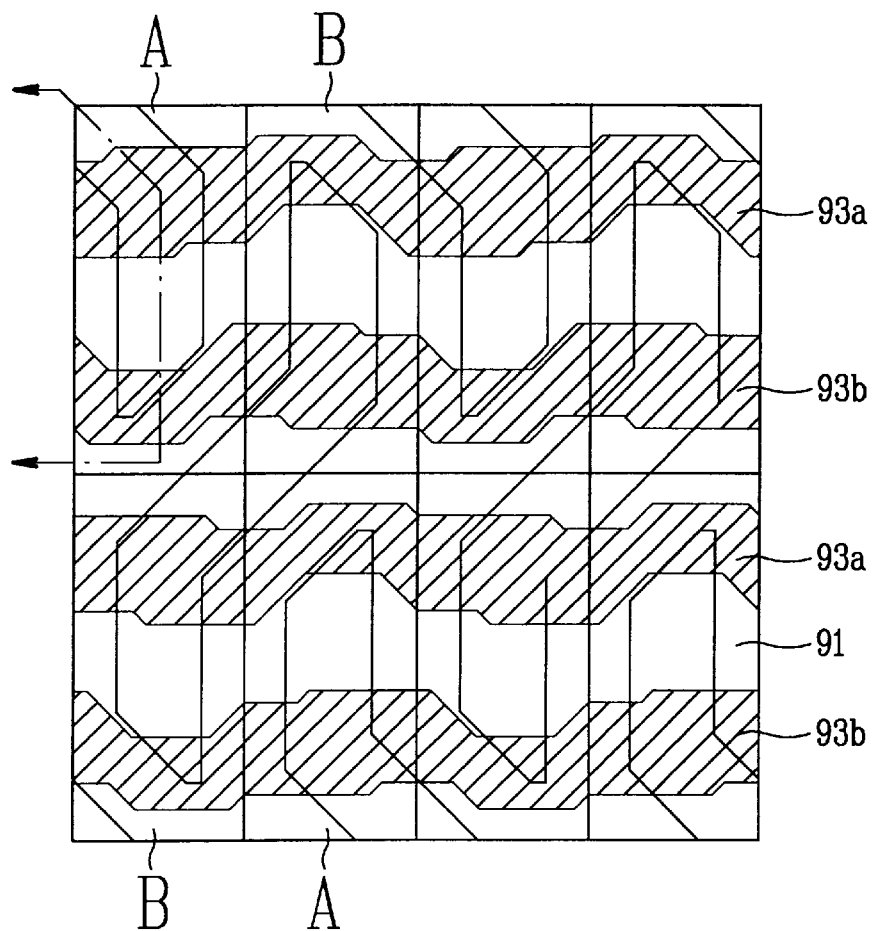
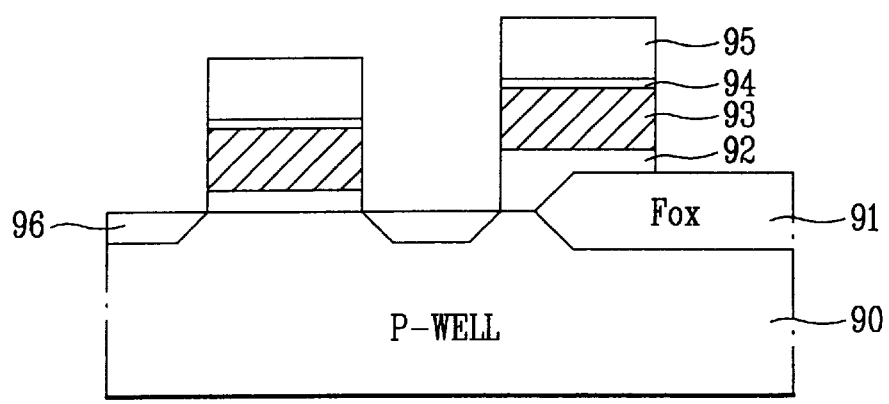

FIG.10d
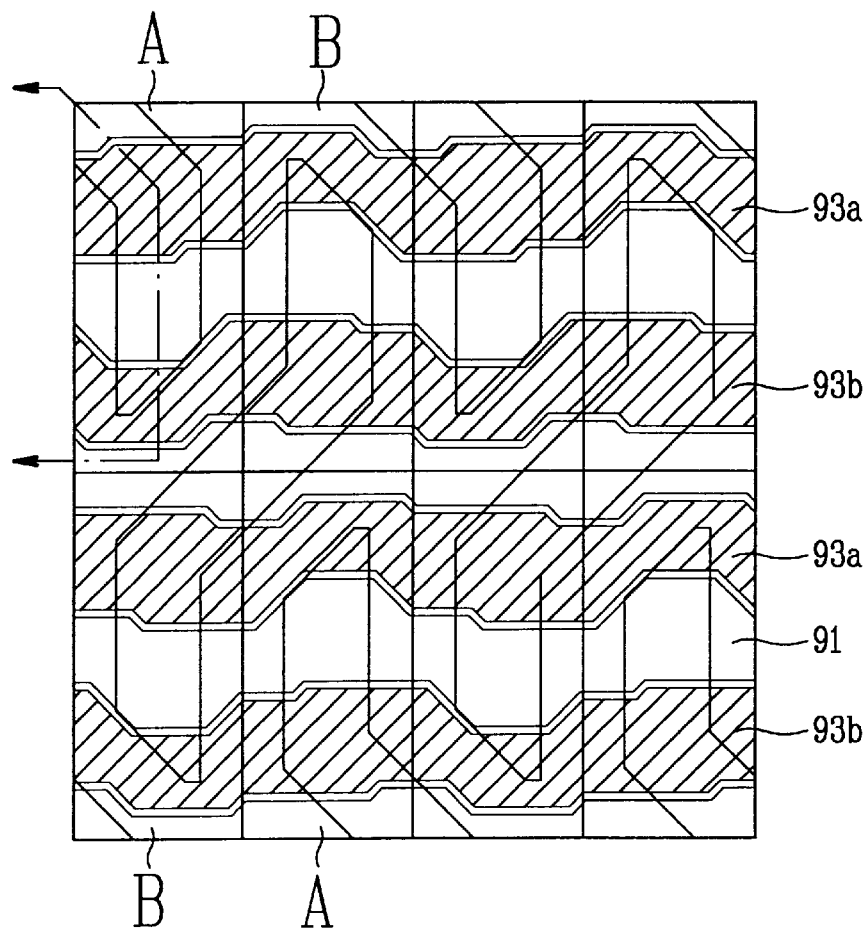
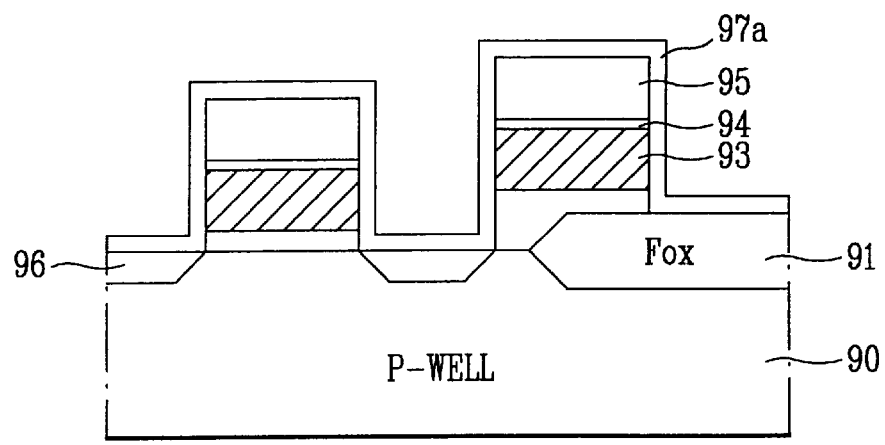

FIG.10e
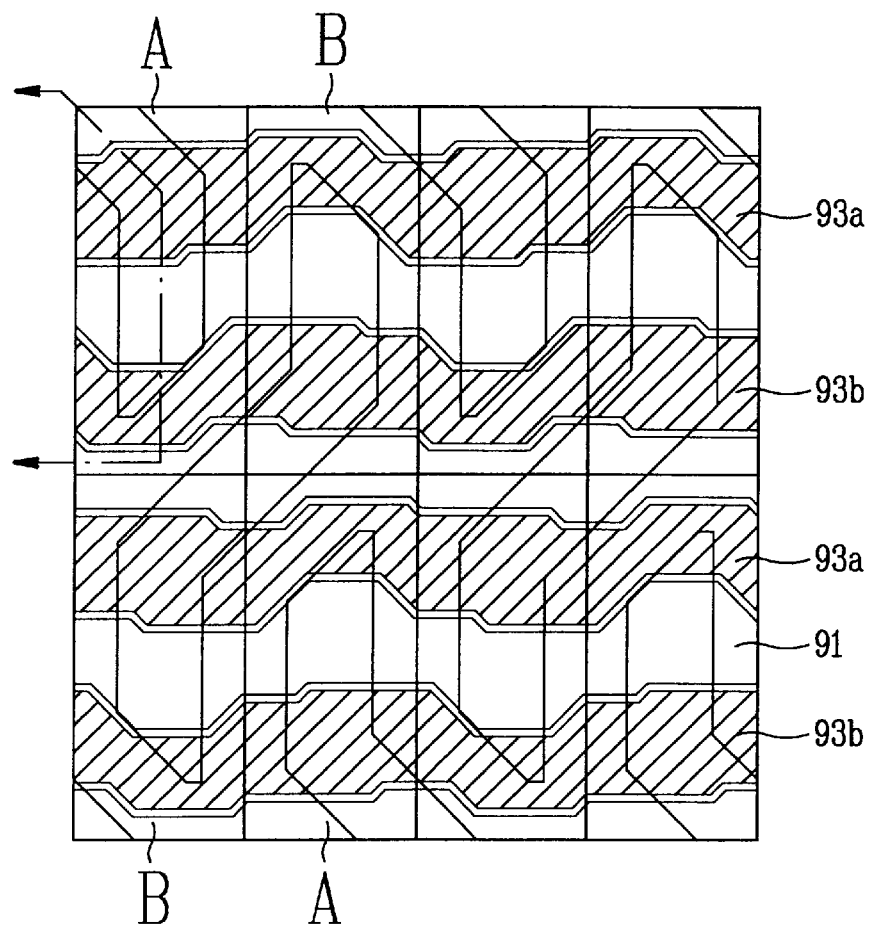
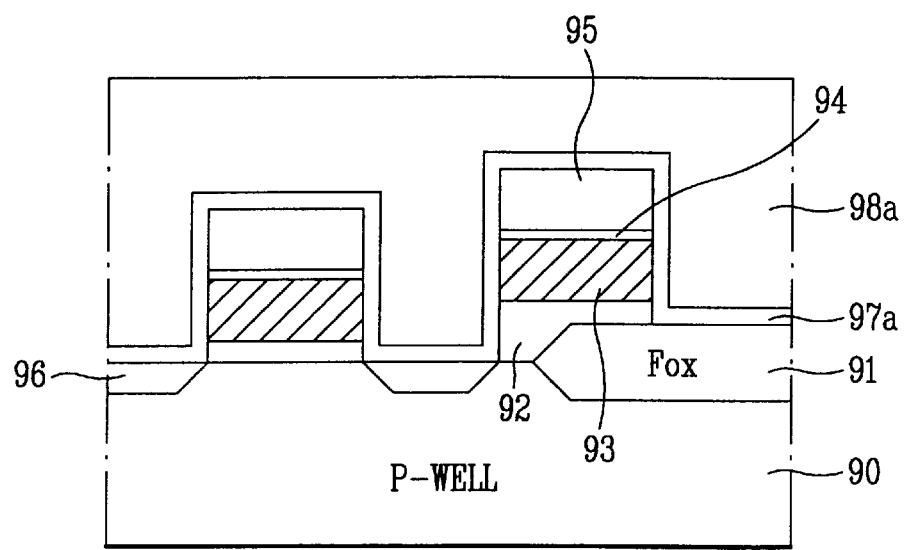

FIG.10f
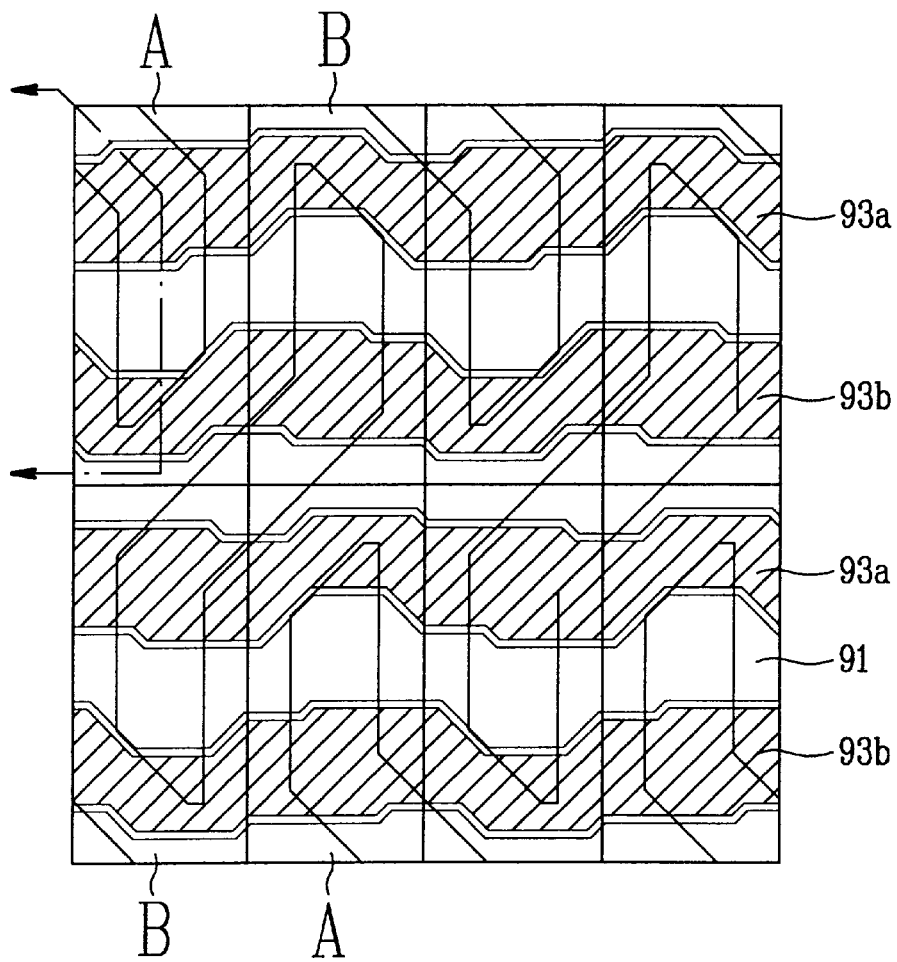
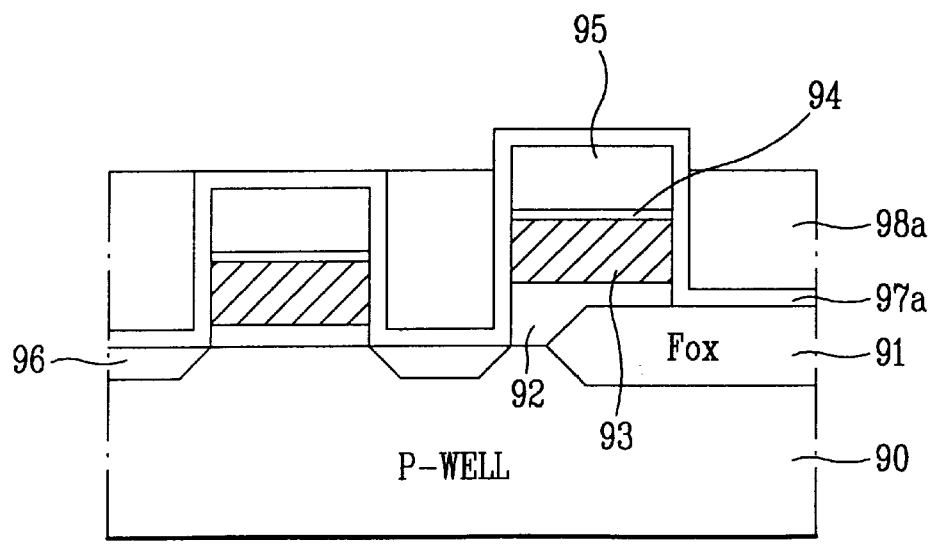

FIG.10g
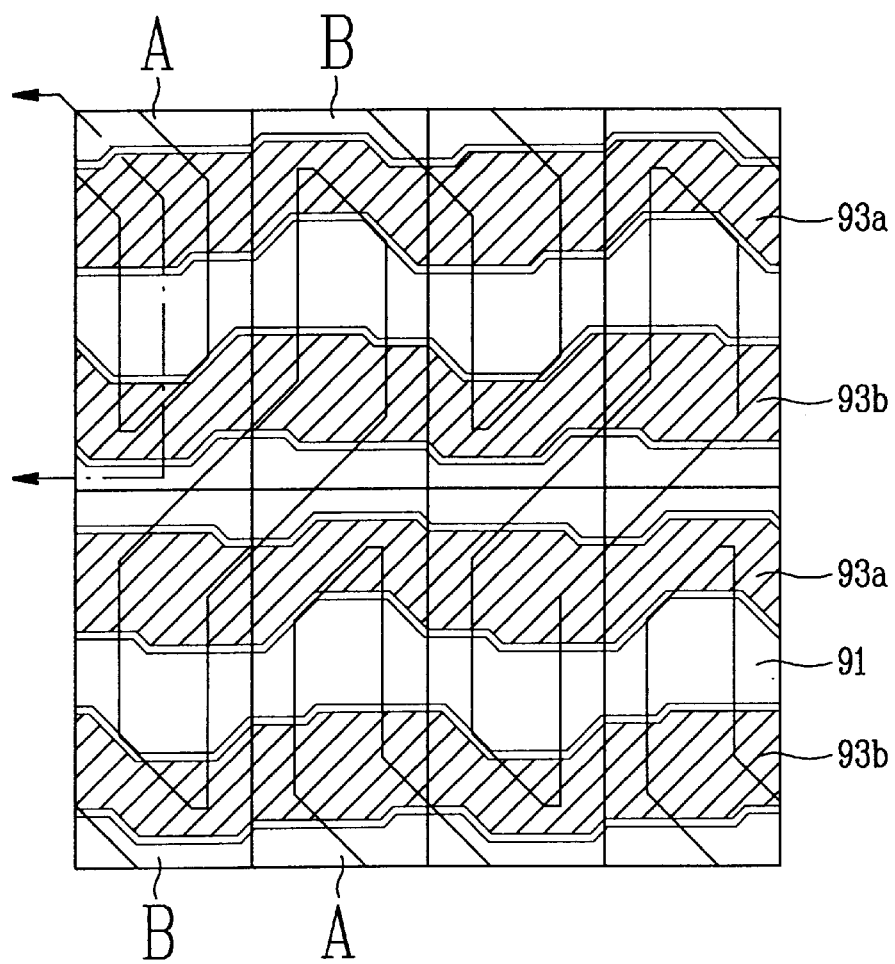
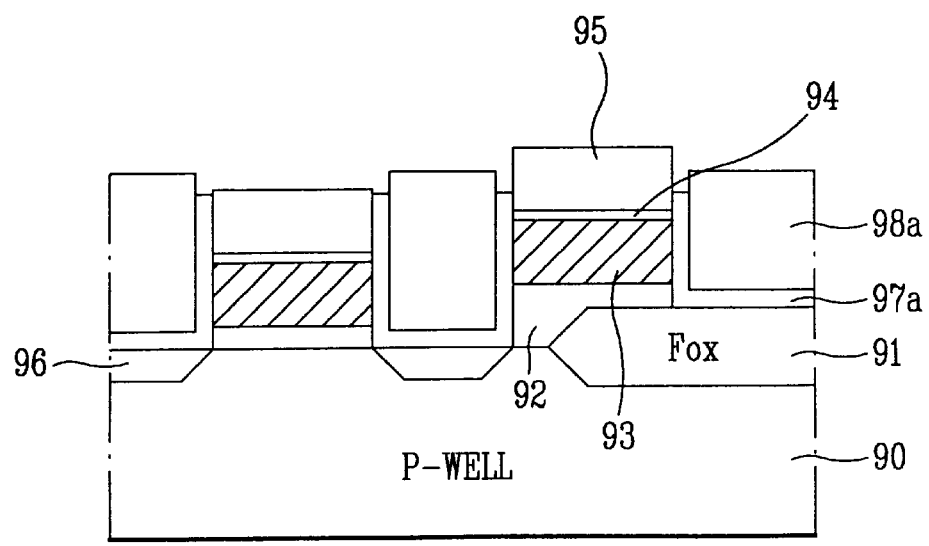

FIG.10h
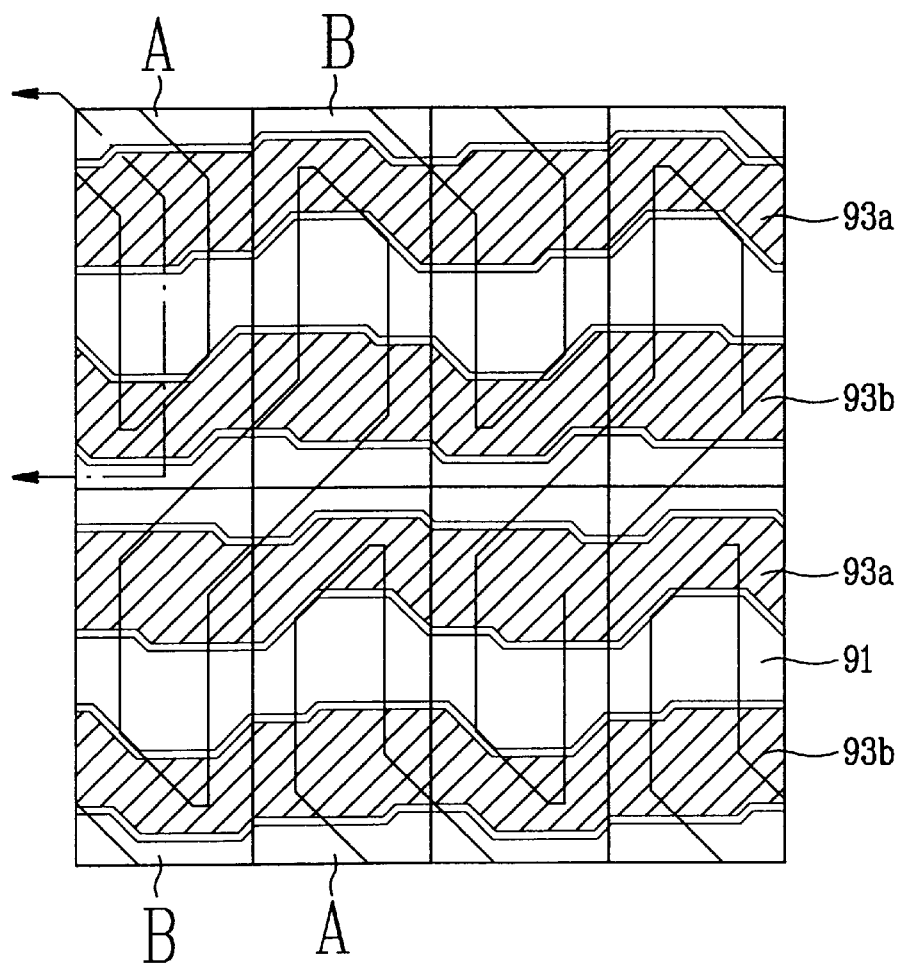
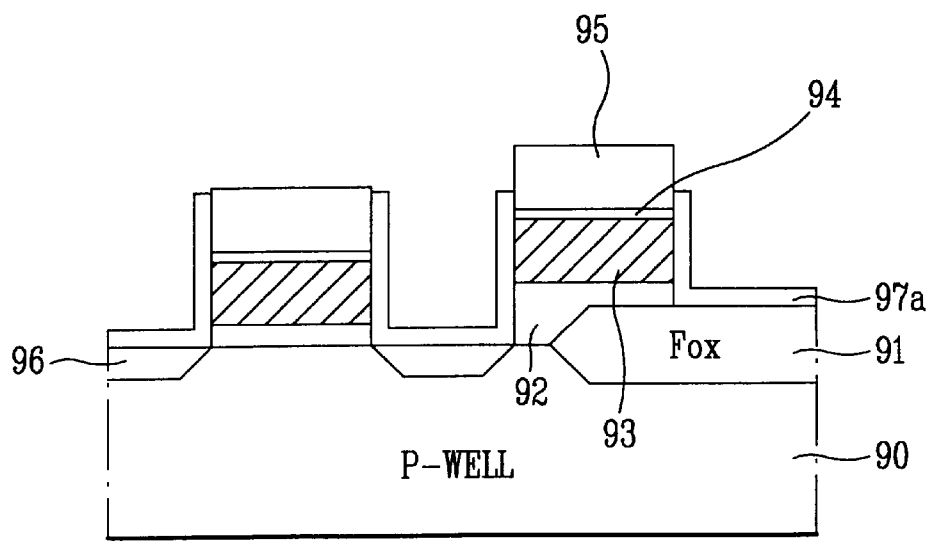

FIG.10i
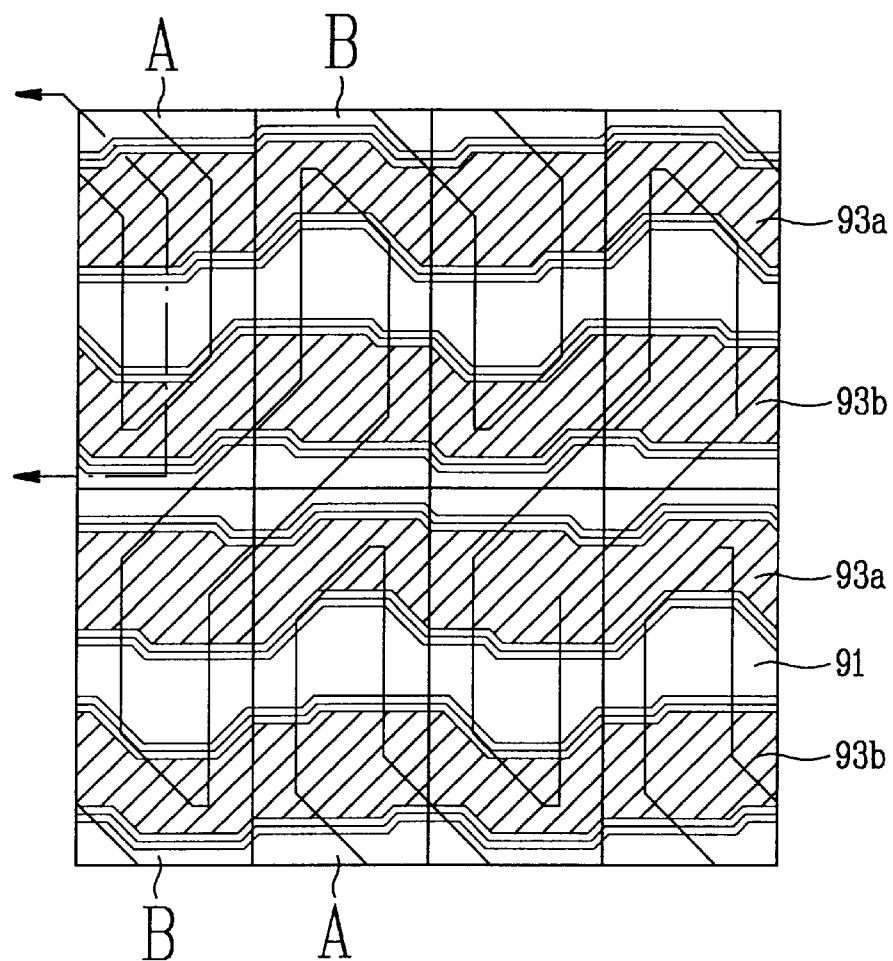
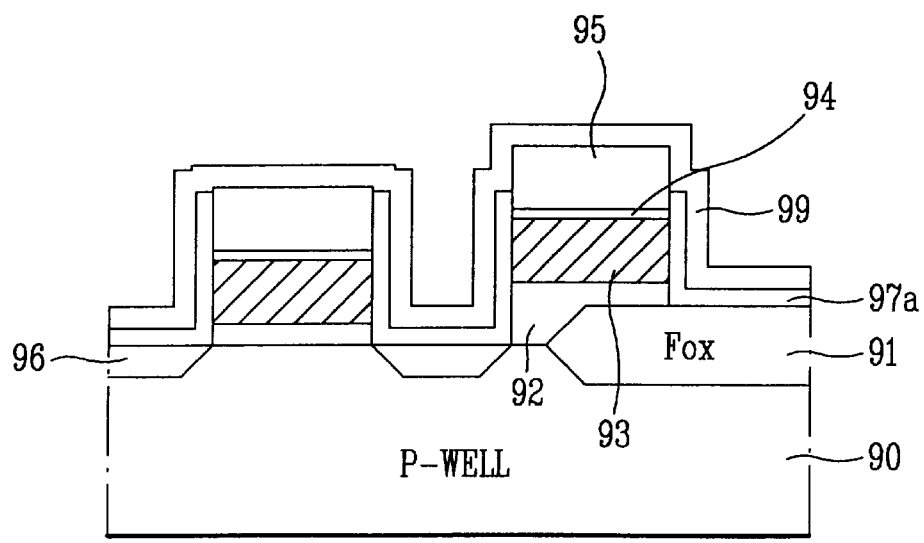

FIG.10j
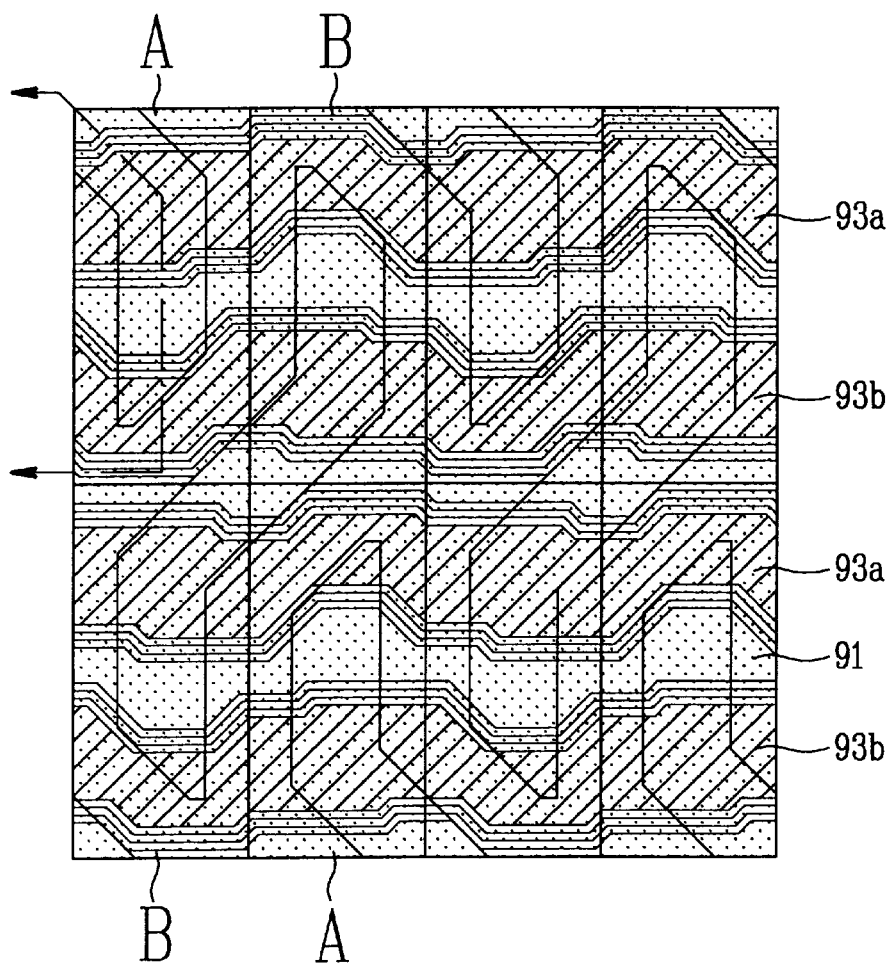
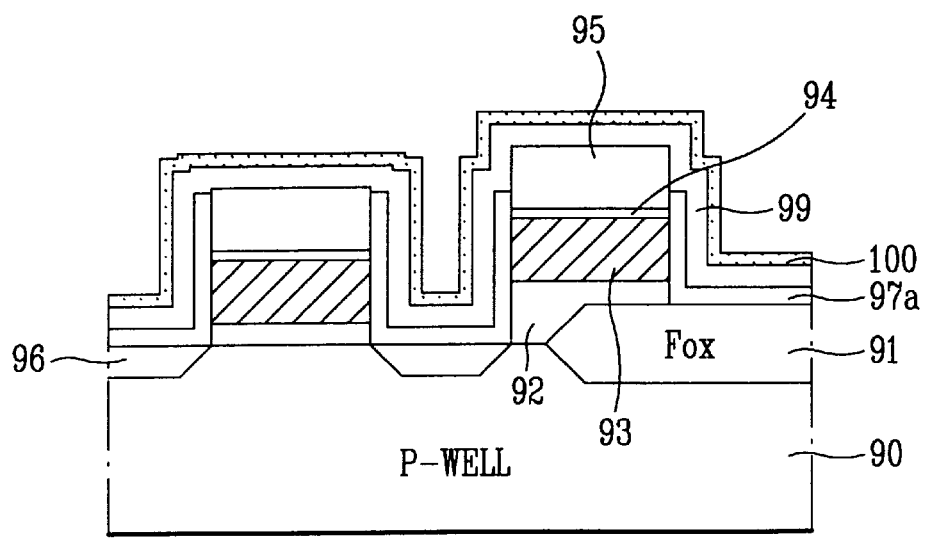

FIG.10k
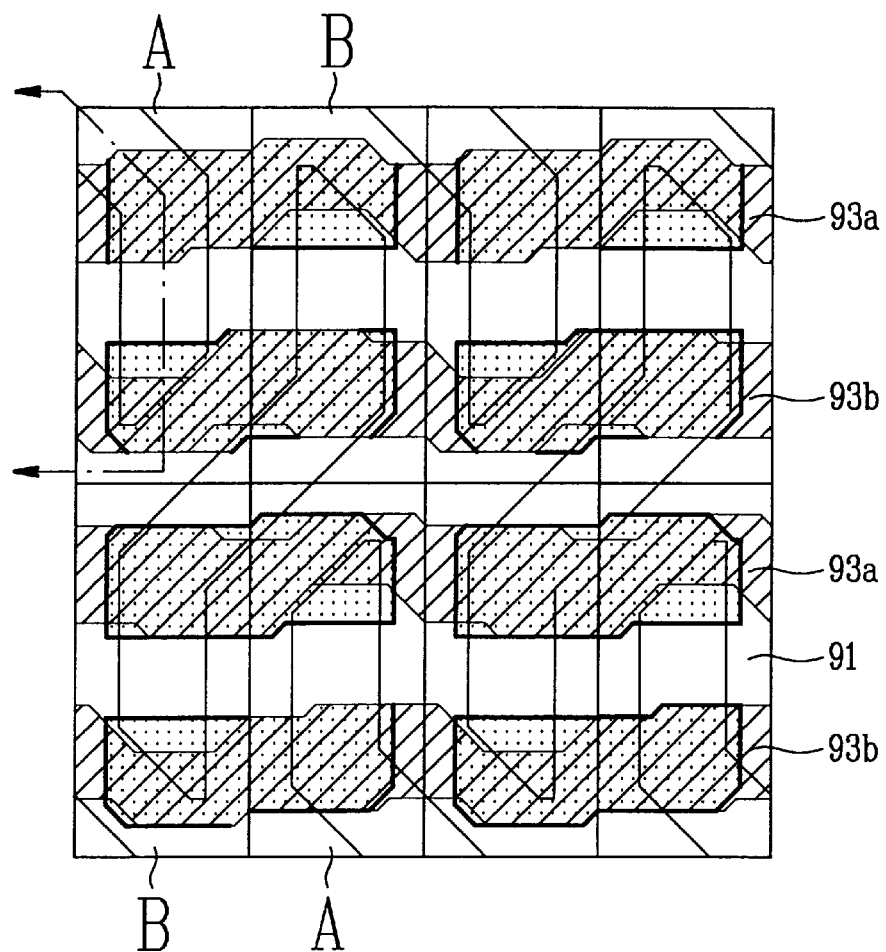
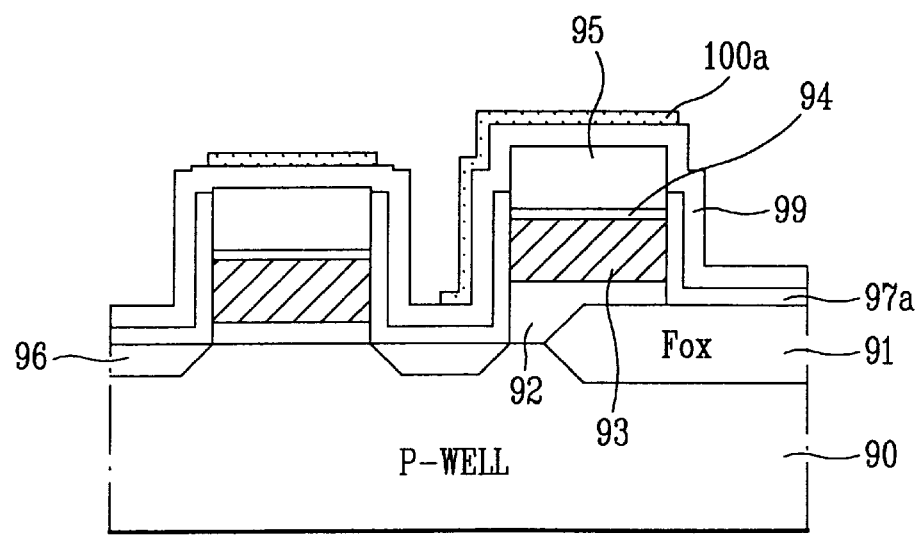

FIG. 10I
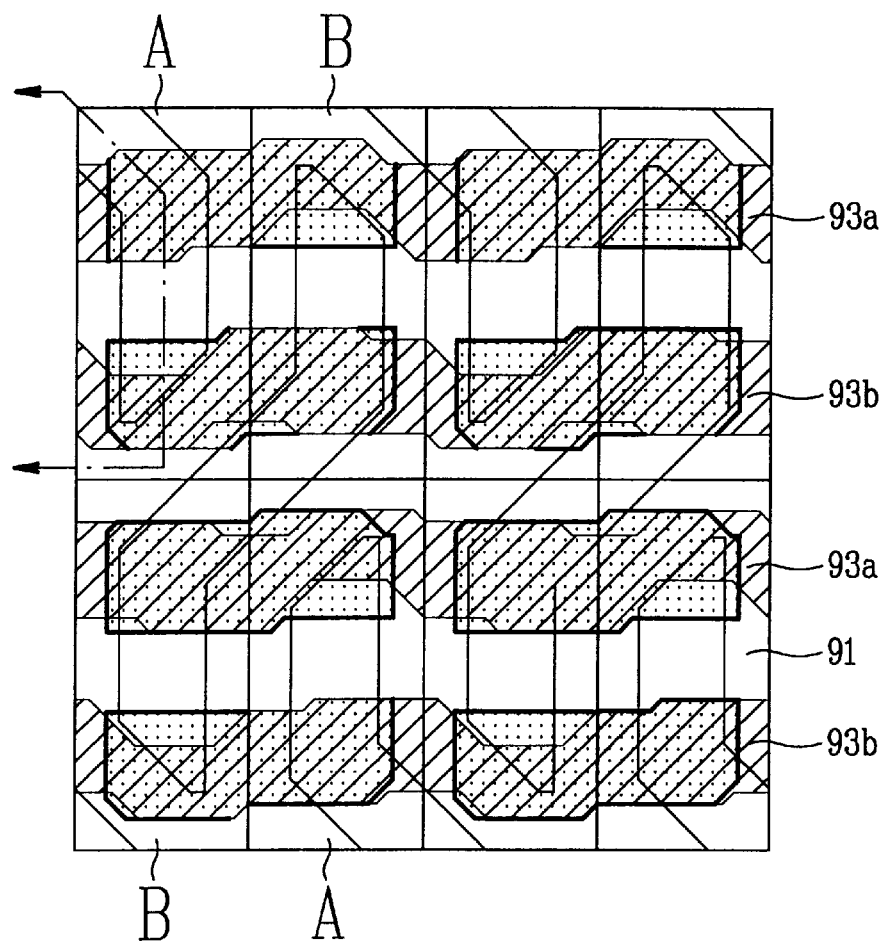
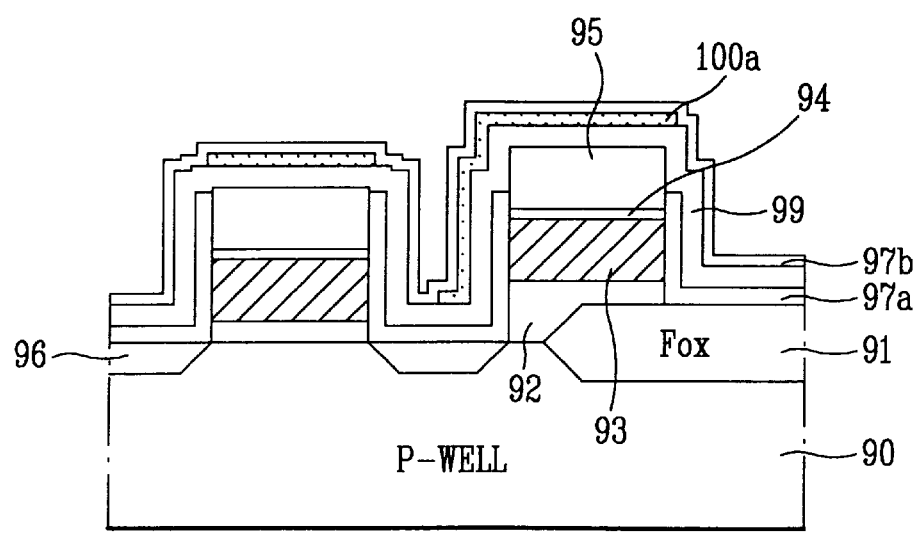

FIG.10m
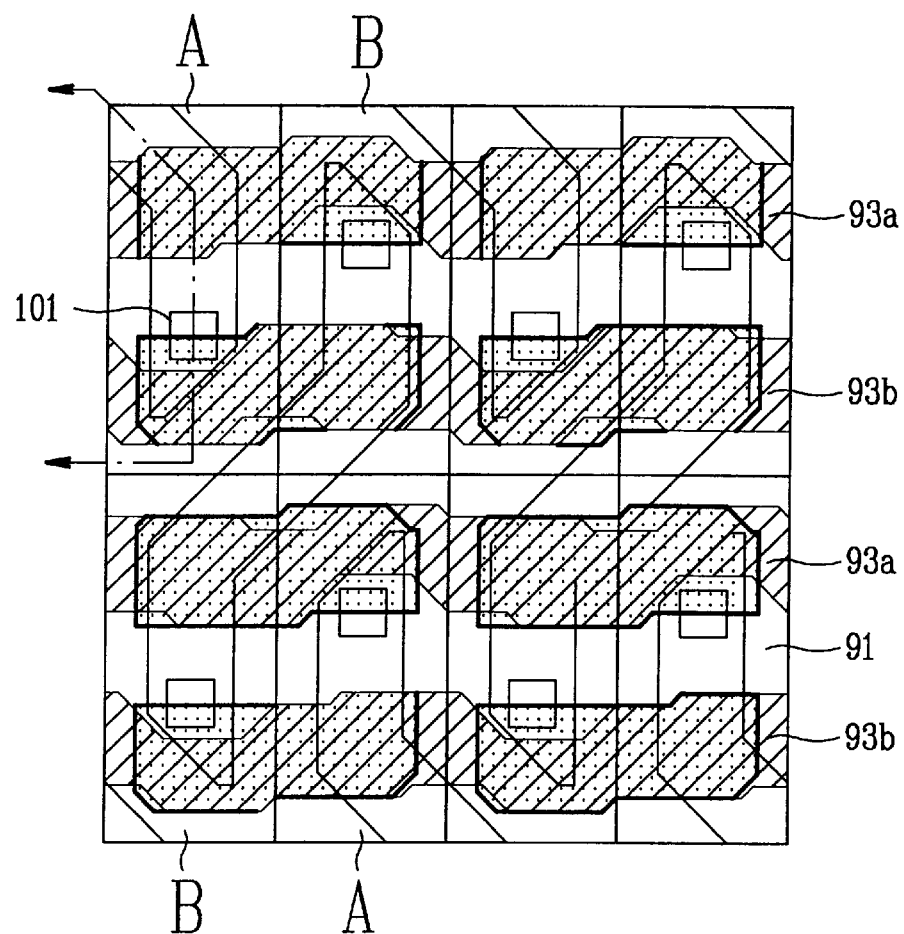
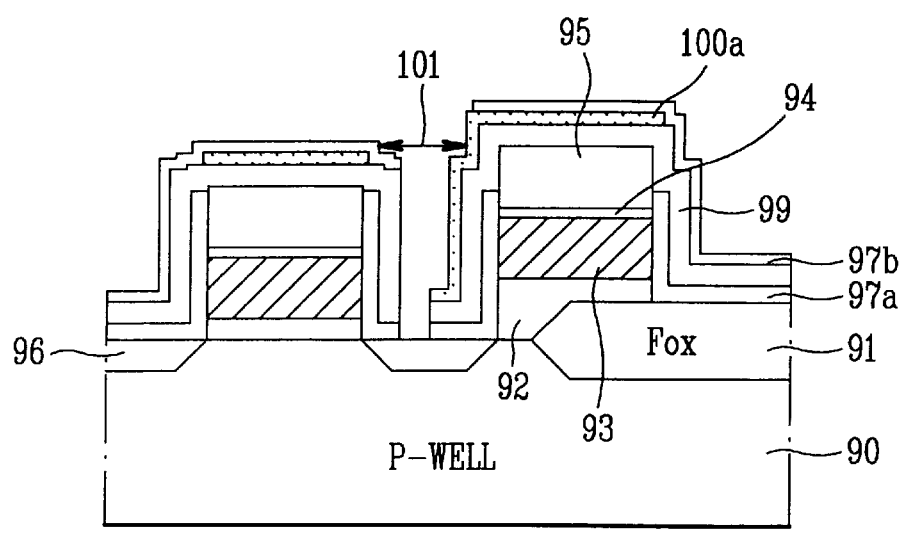

FIG.10n
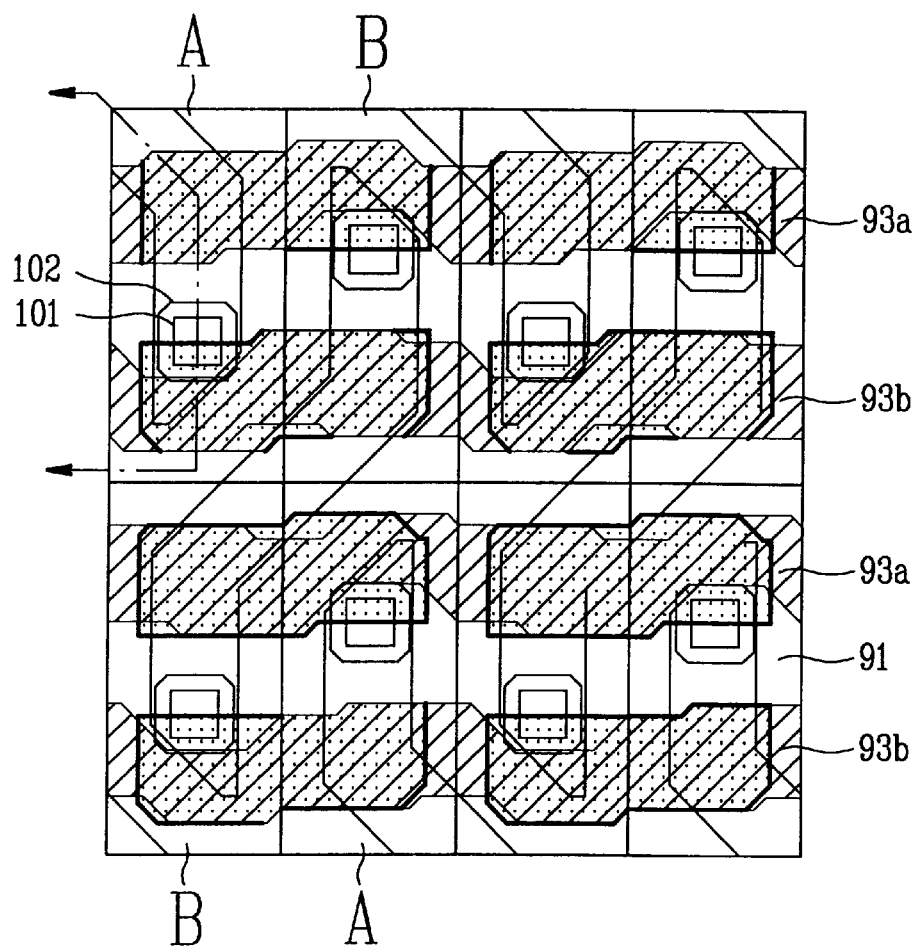
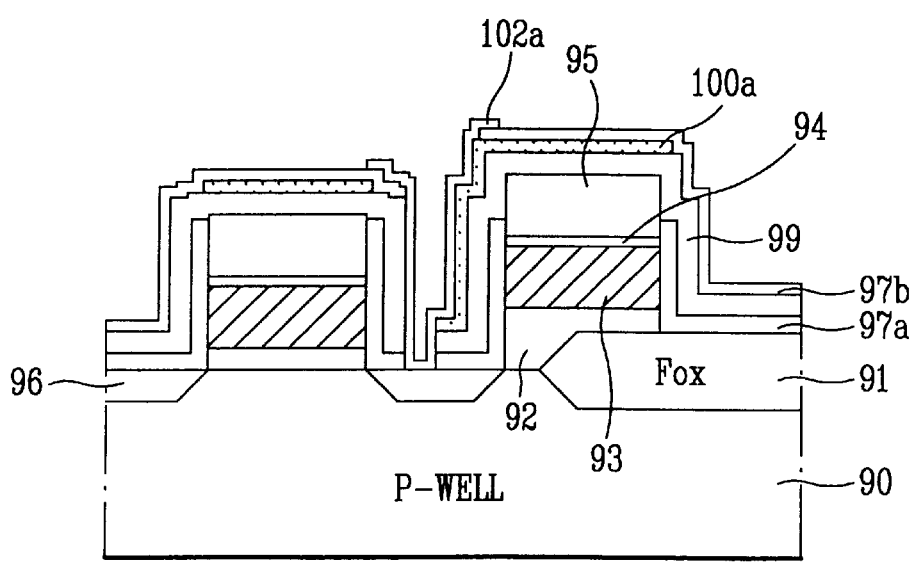

FIG.10p
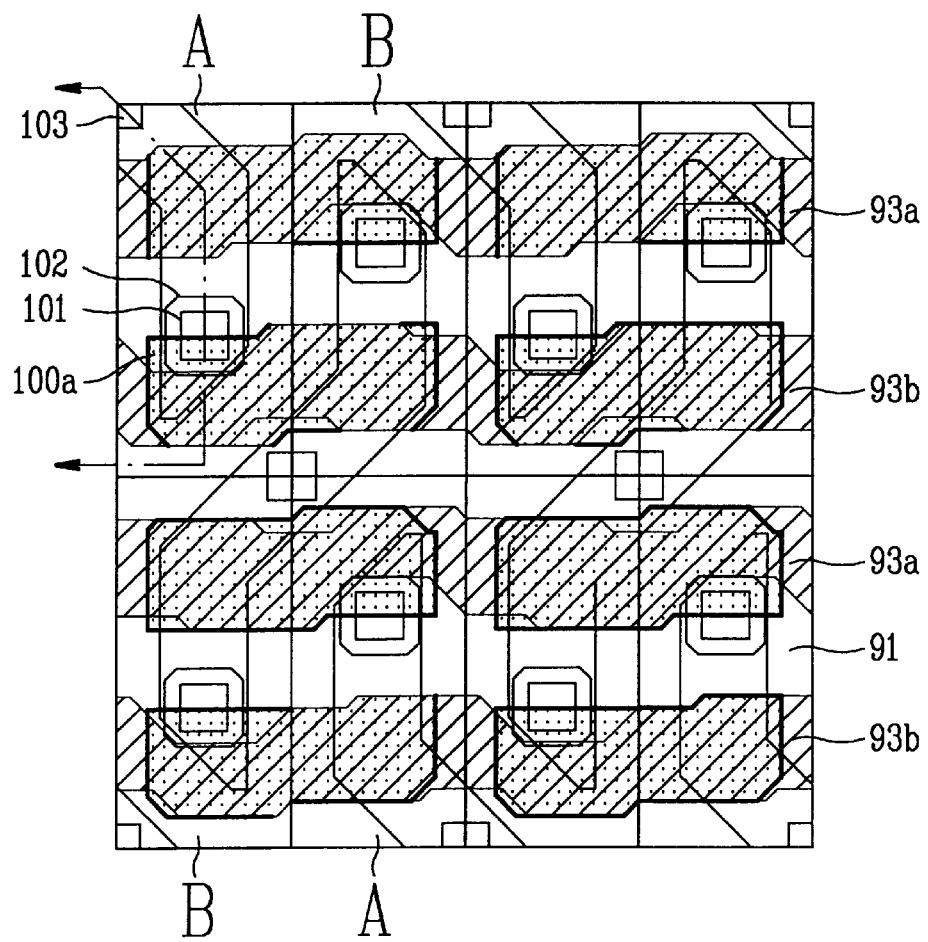
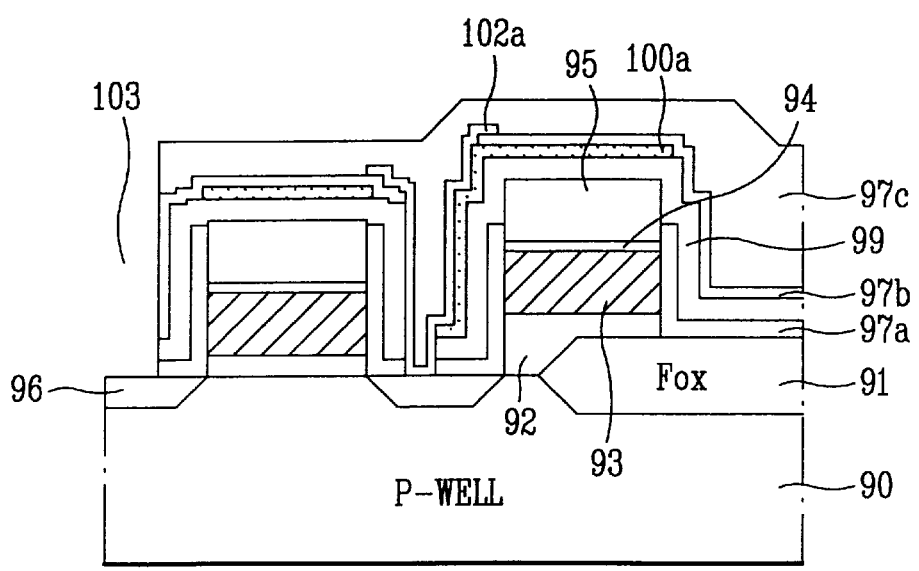

FIG.10q
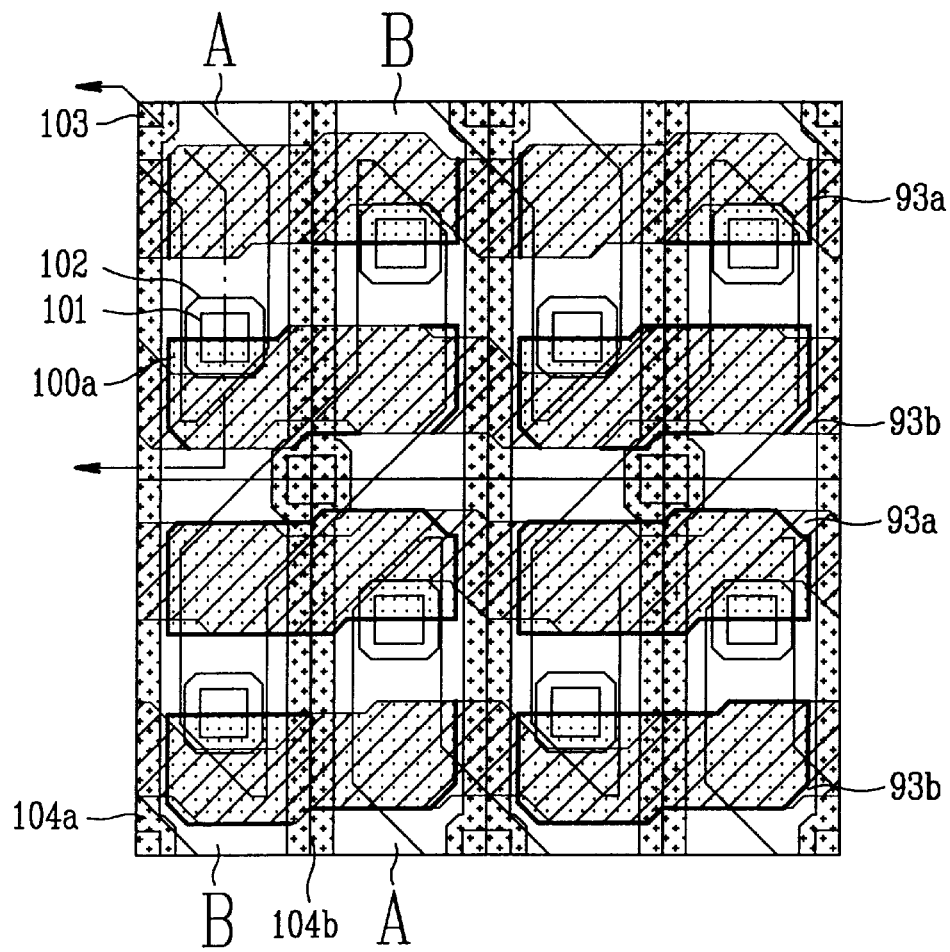
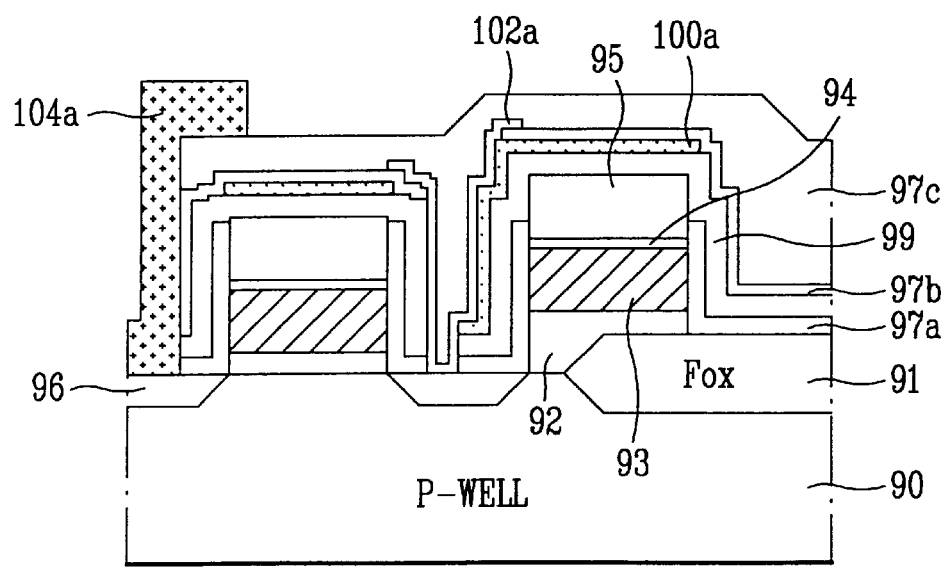

FIG.12a
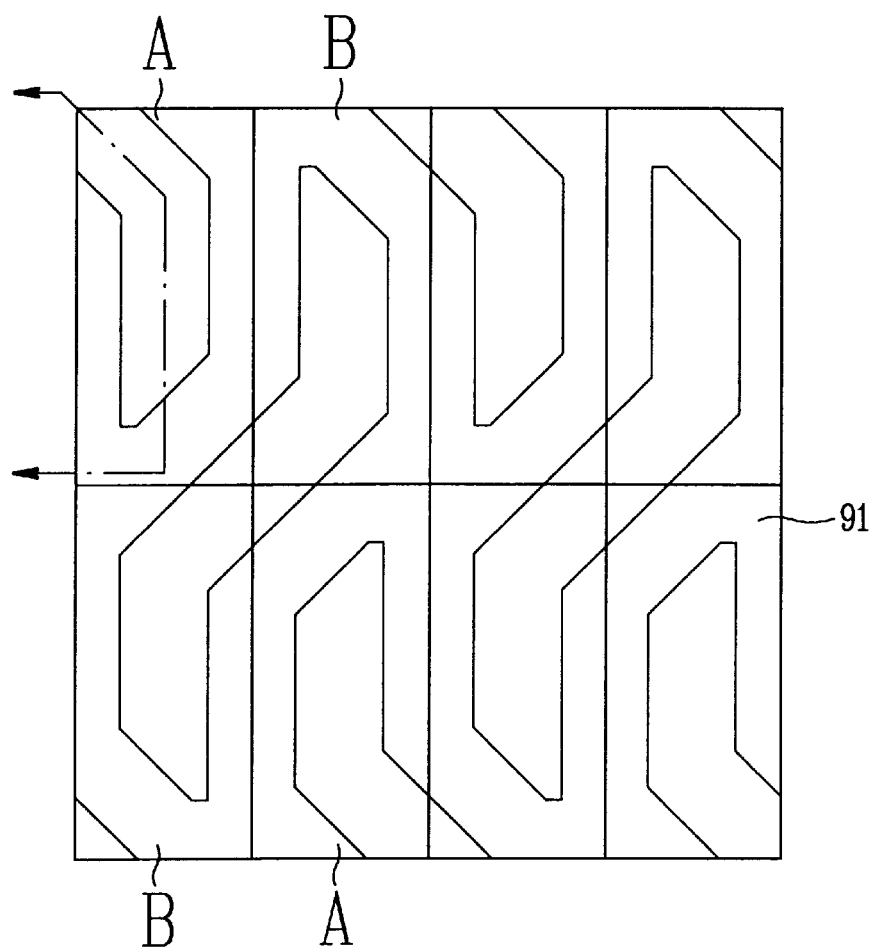
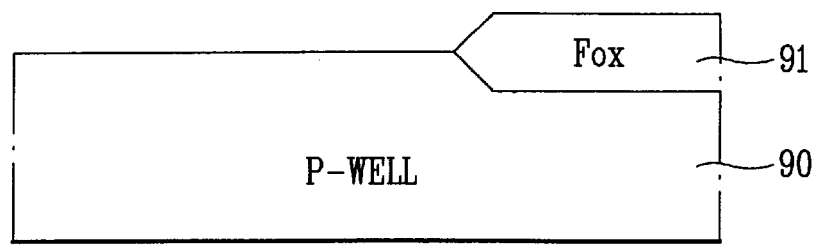

FIG.12b
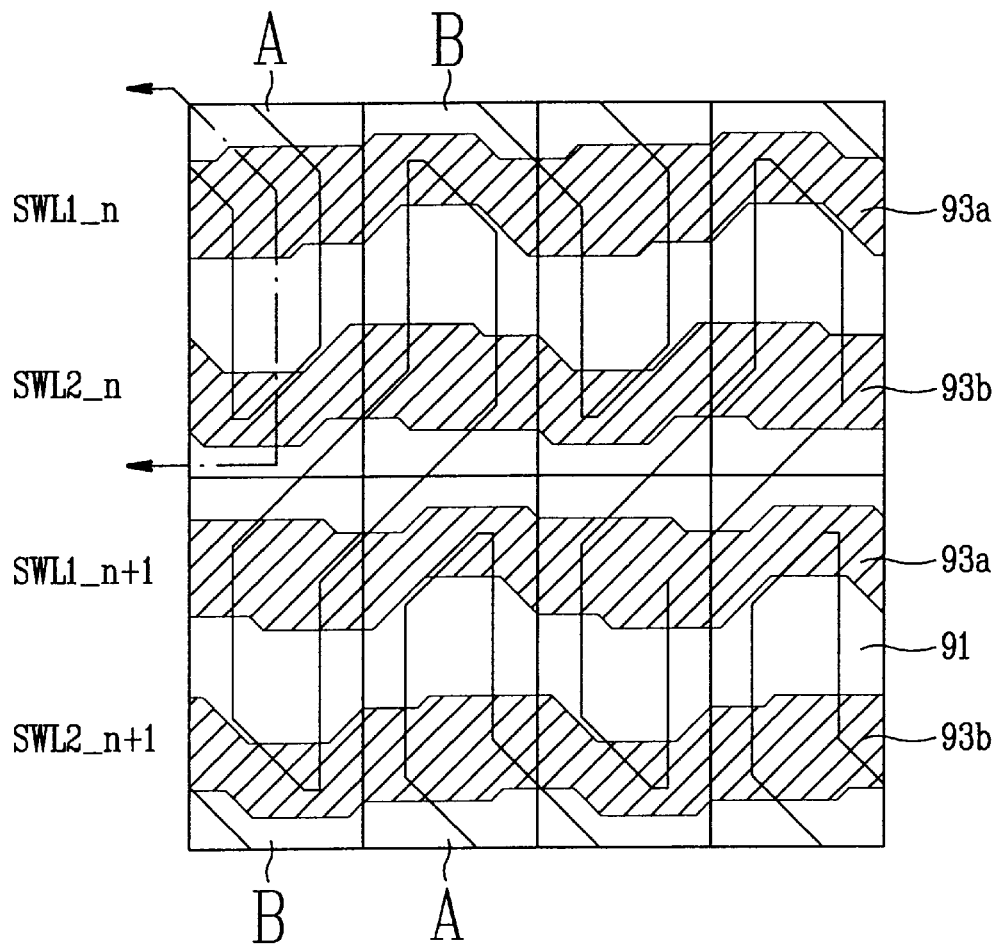
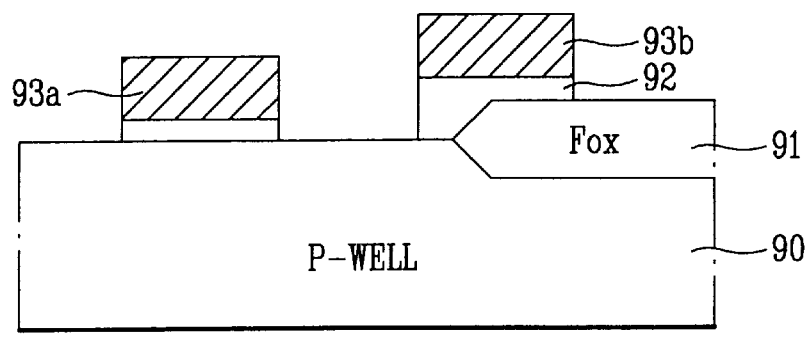

FIG.12c
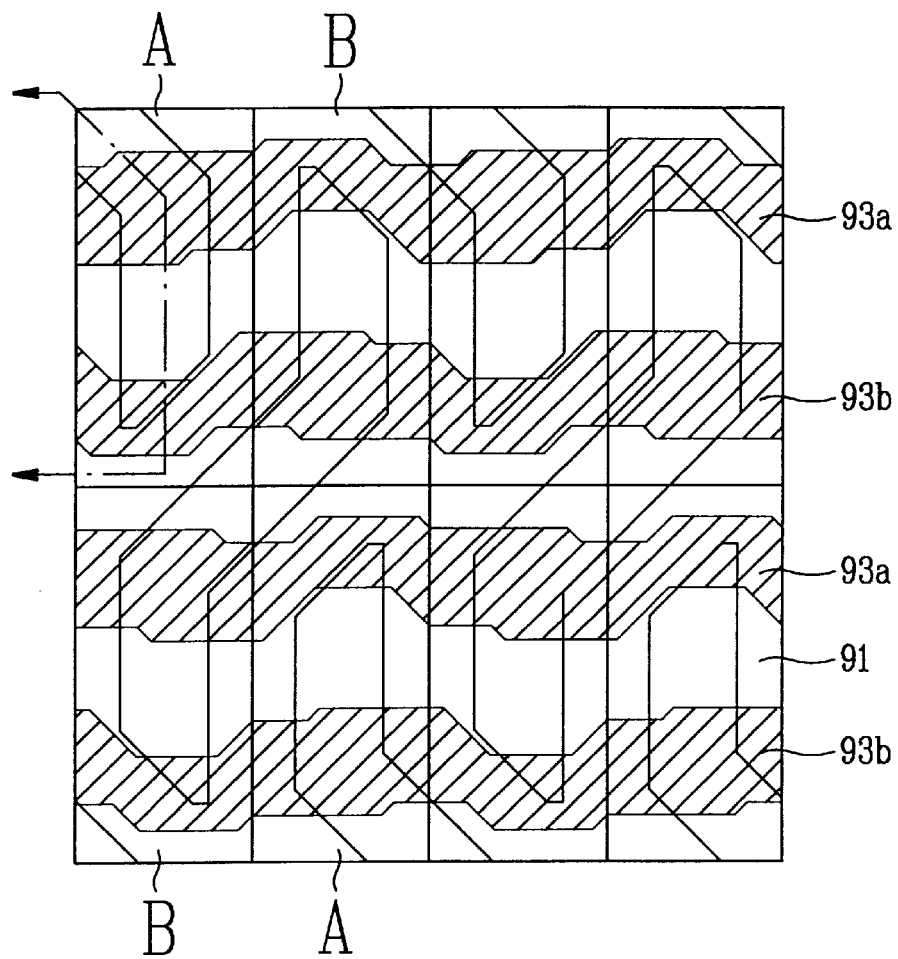
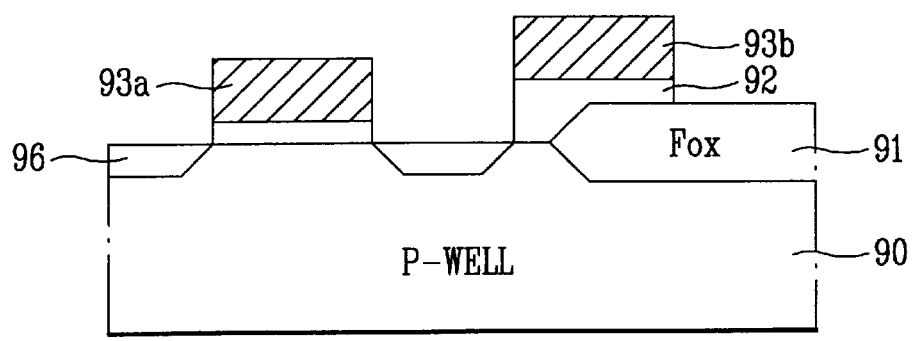

FIG.12d
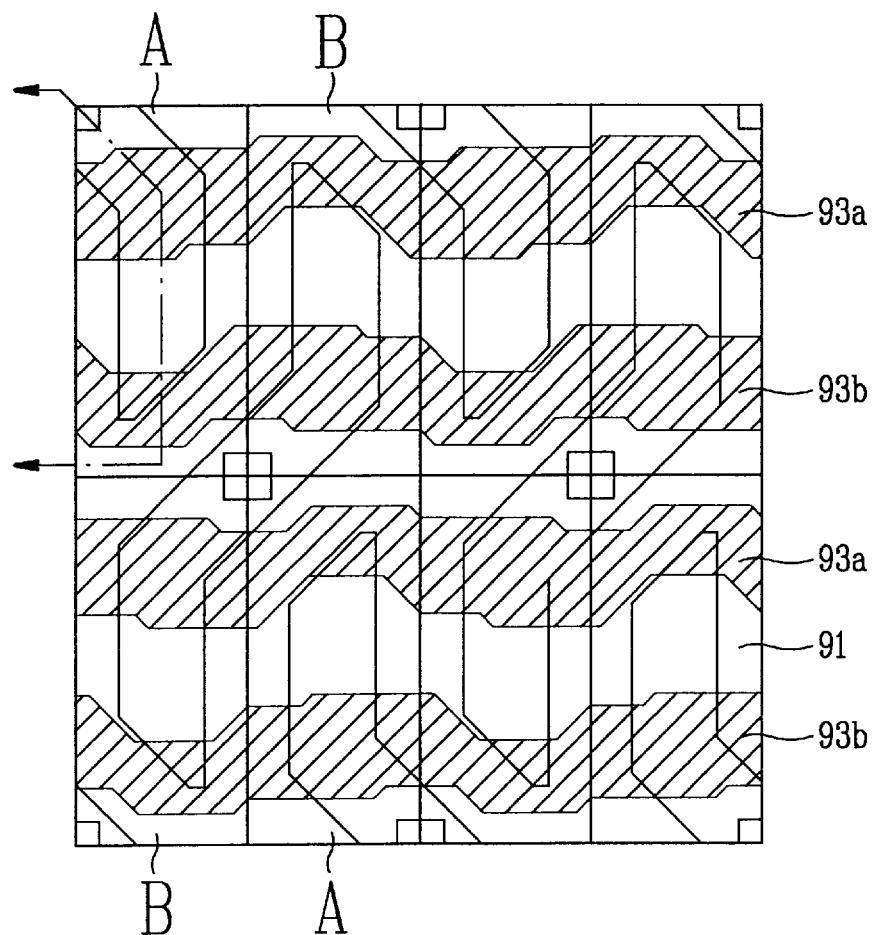
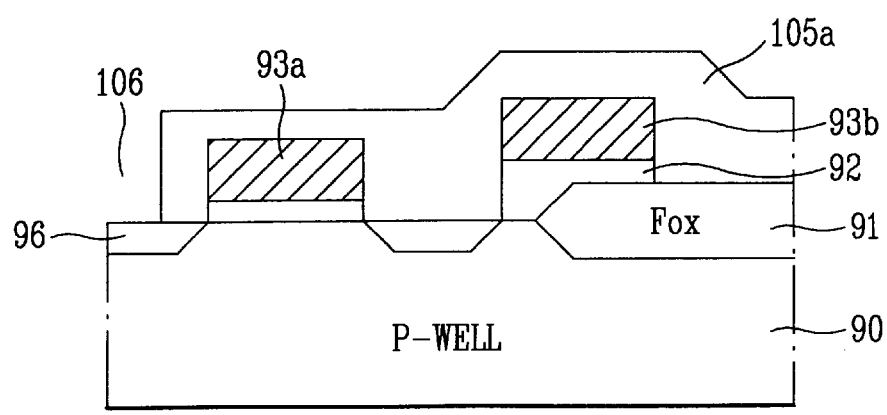

FIG.12e
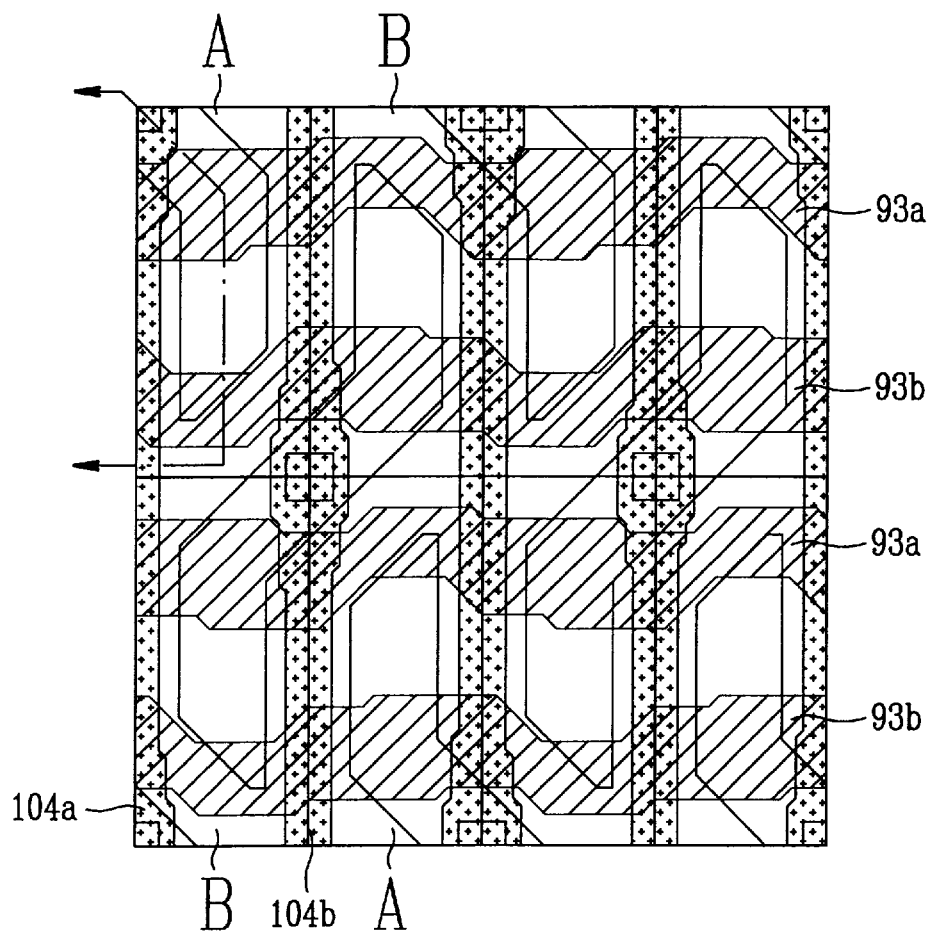
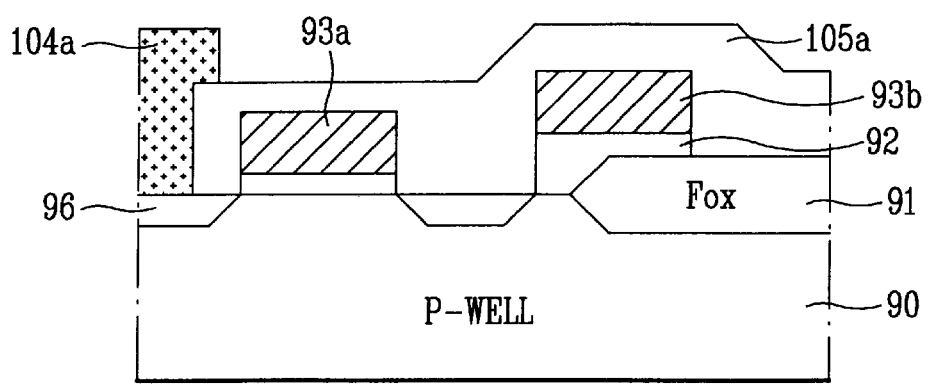

FIG.12f
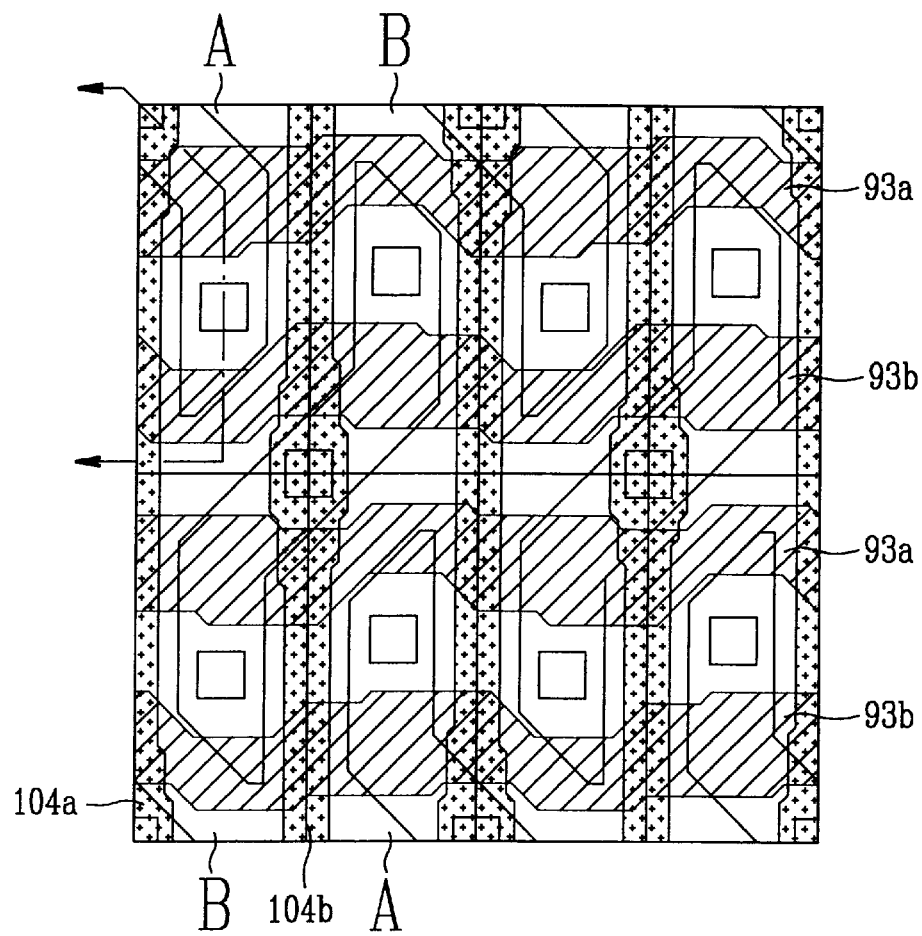
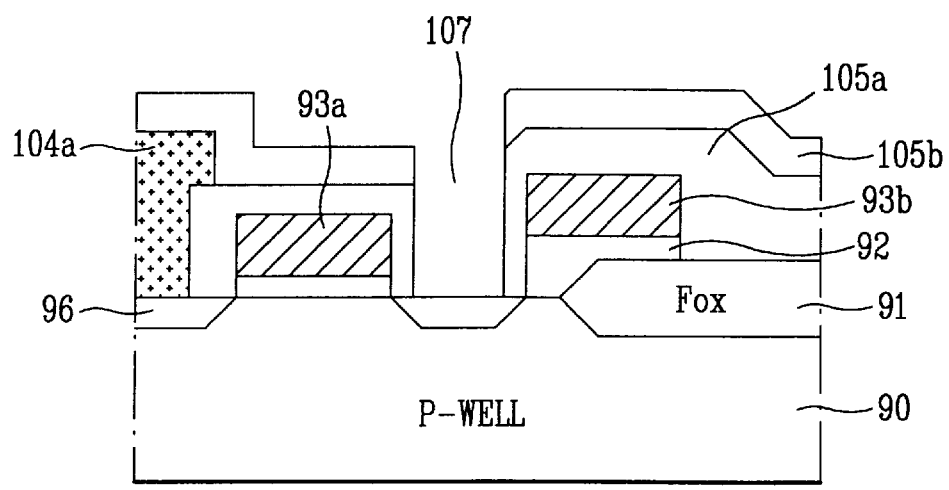

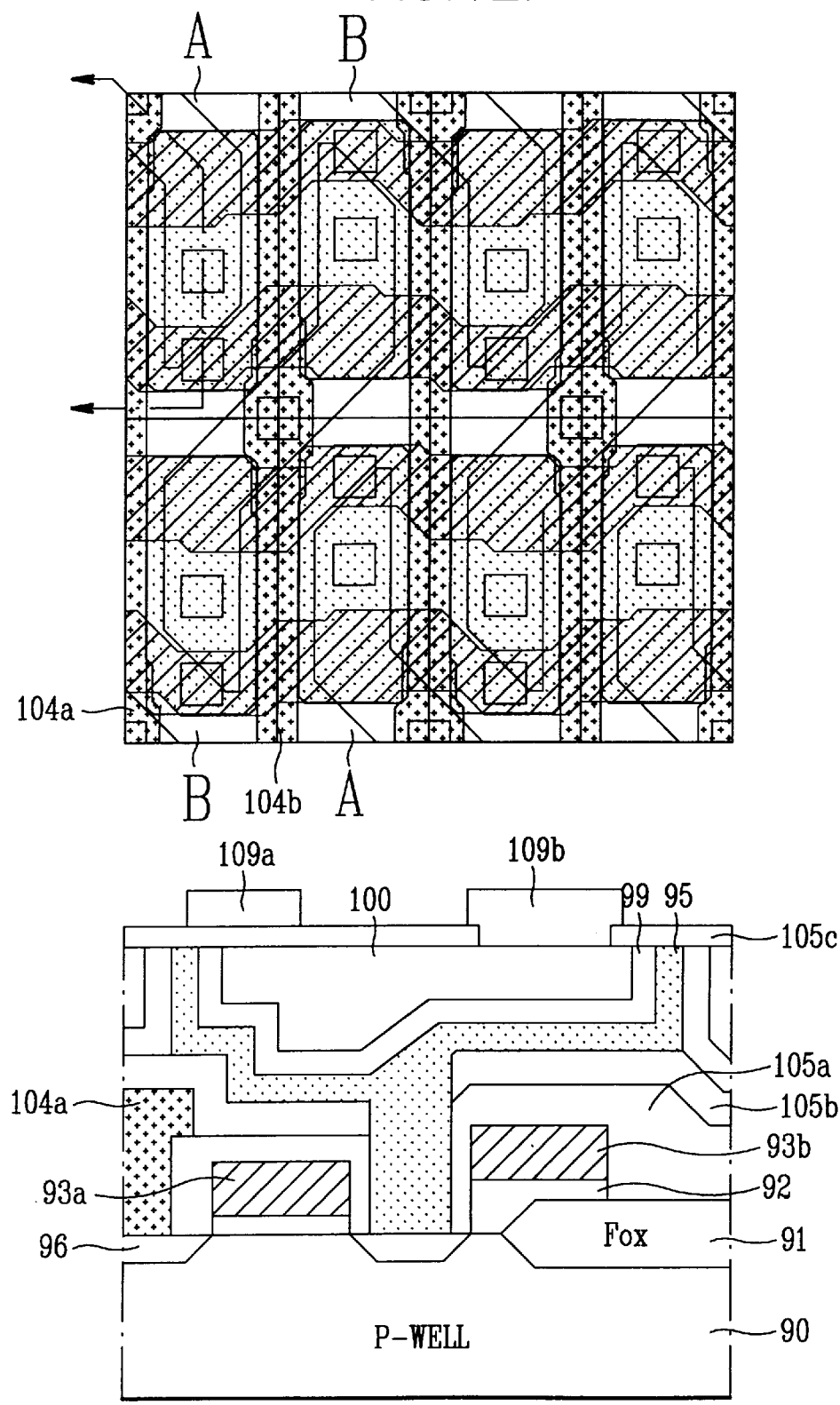

FIG.13a
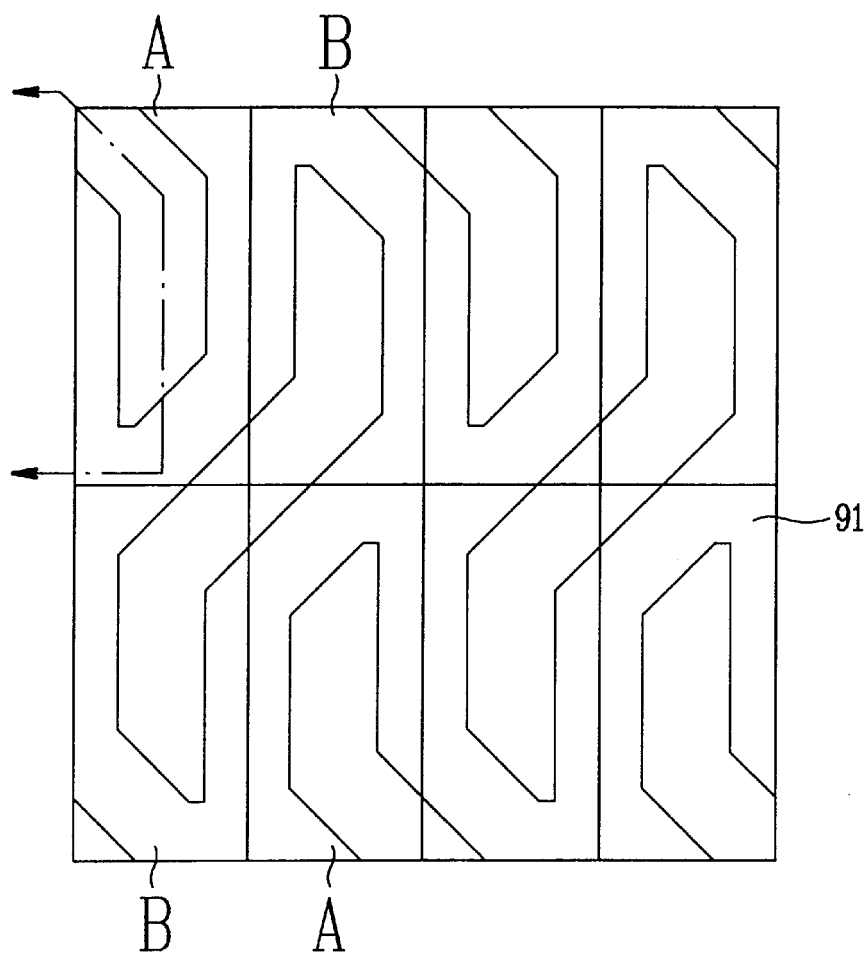
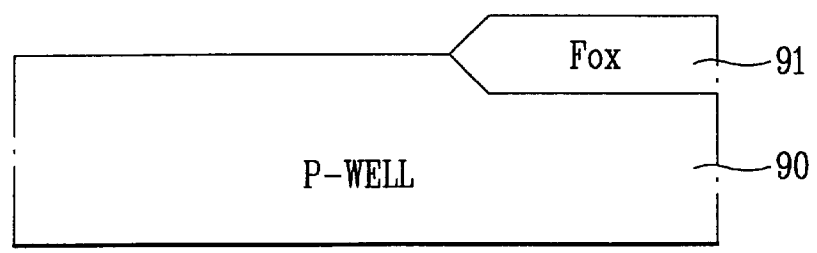

FIG. 13b
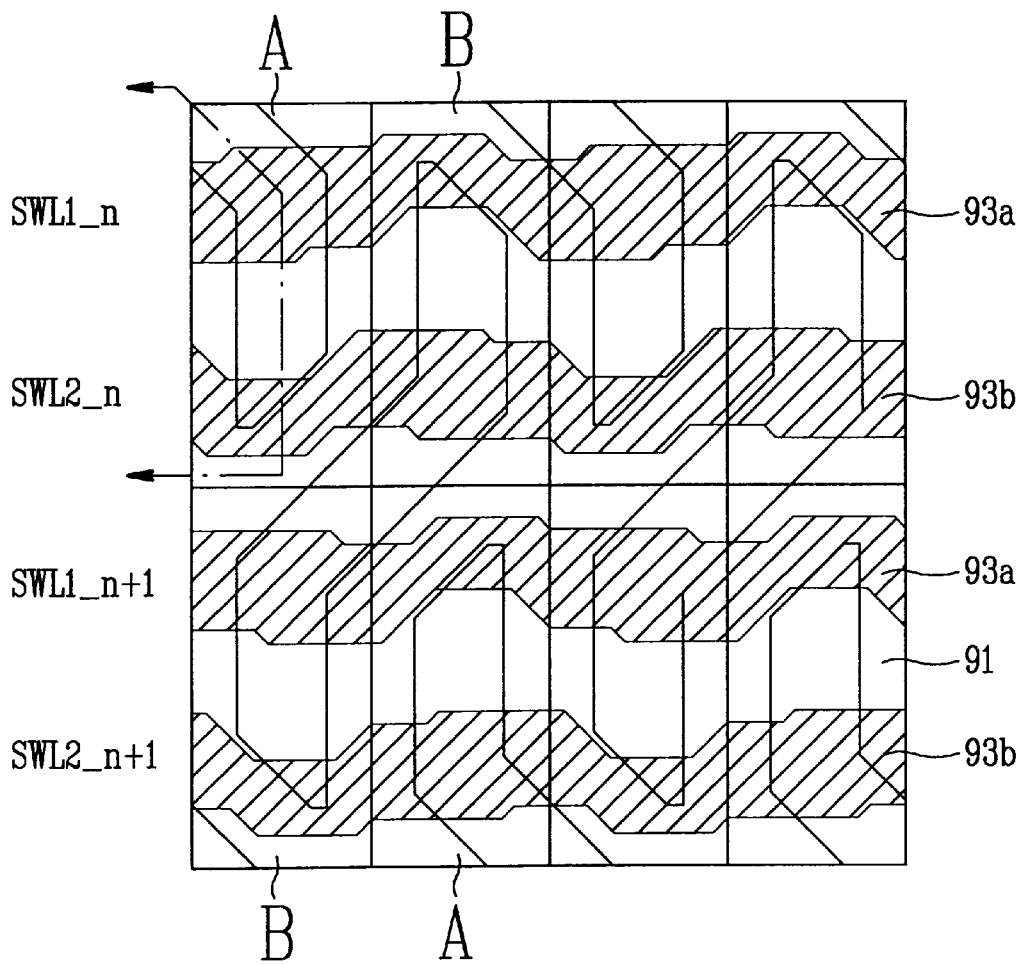
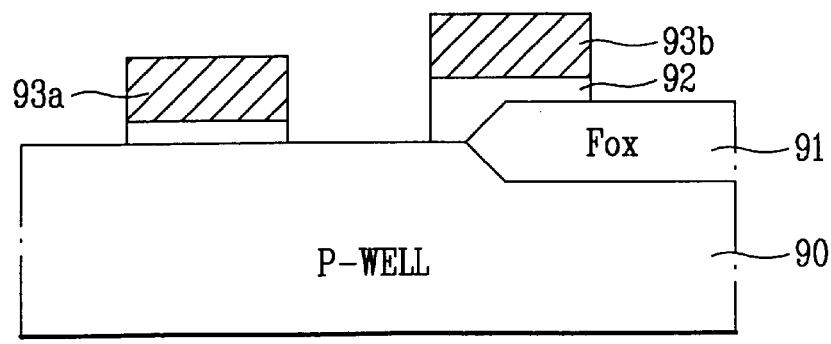

FIG.13c
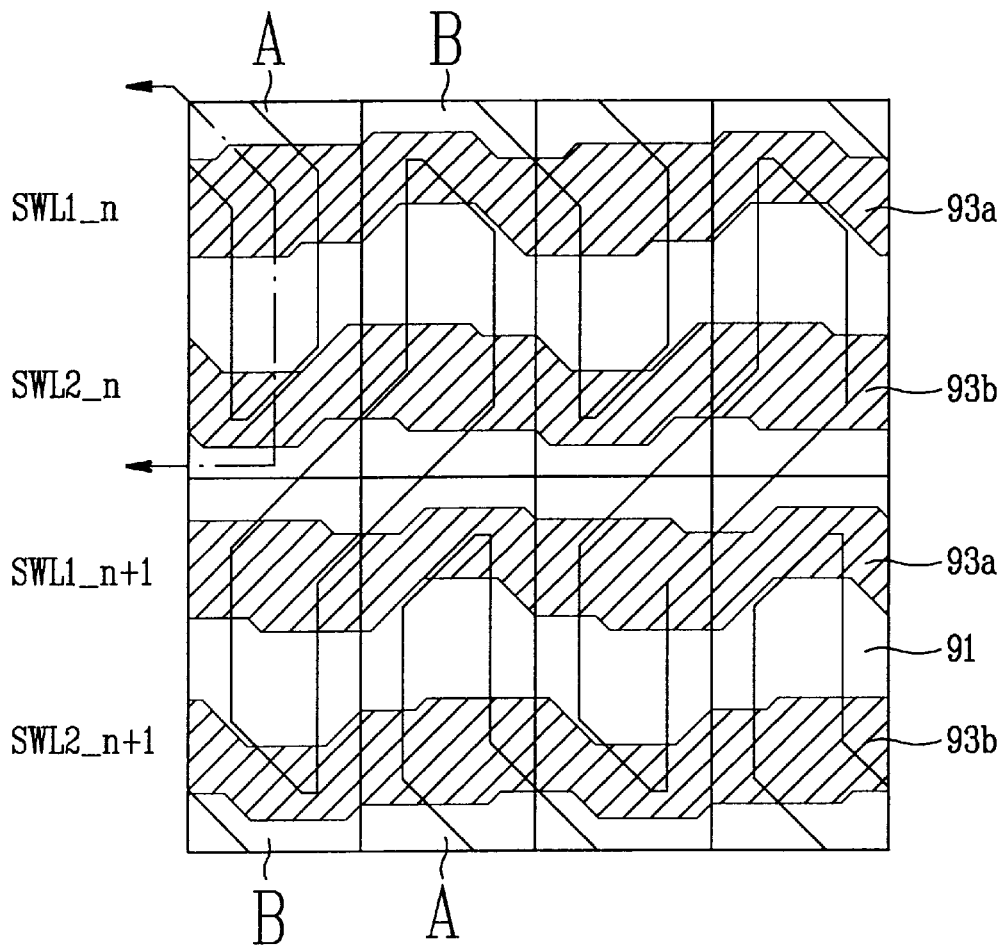
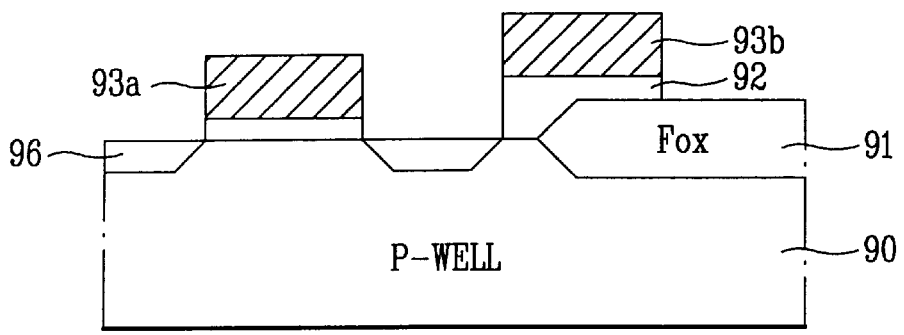

FIG.13d
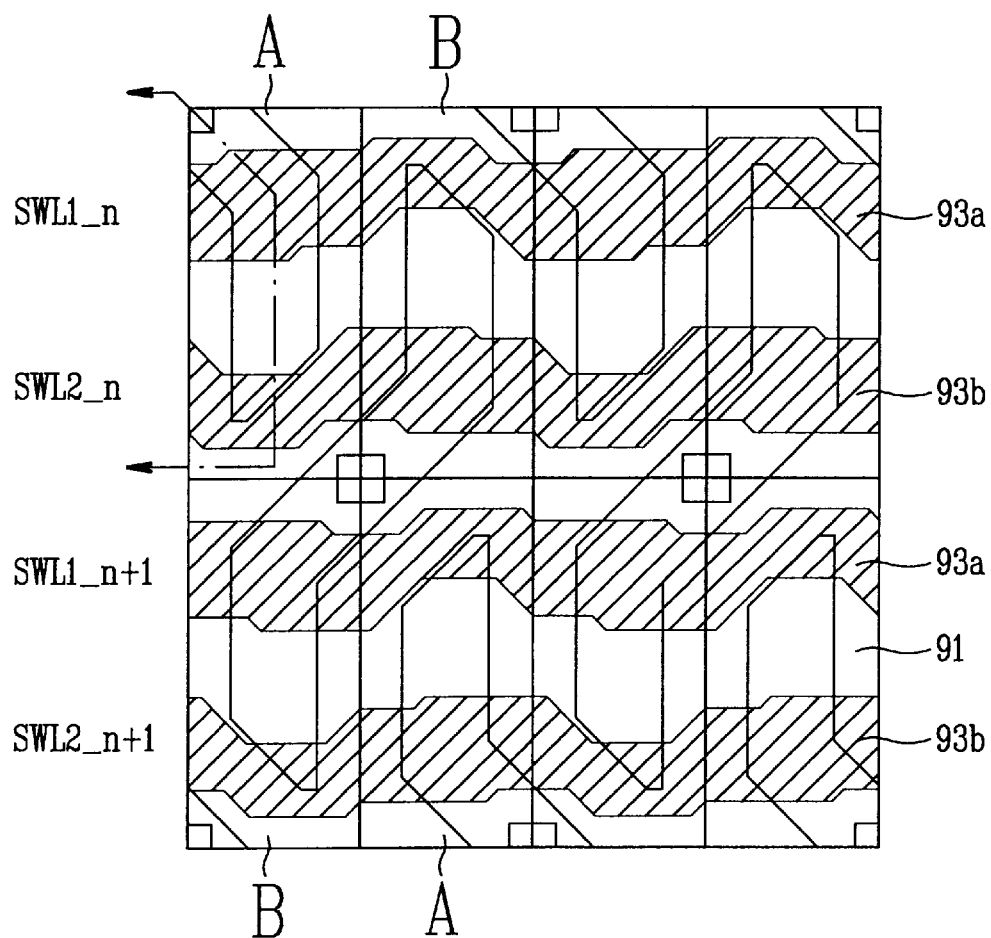
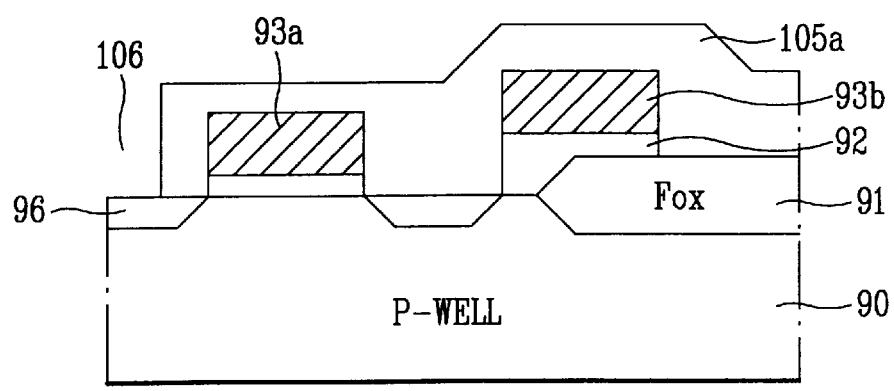

FIG.13e
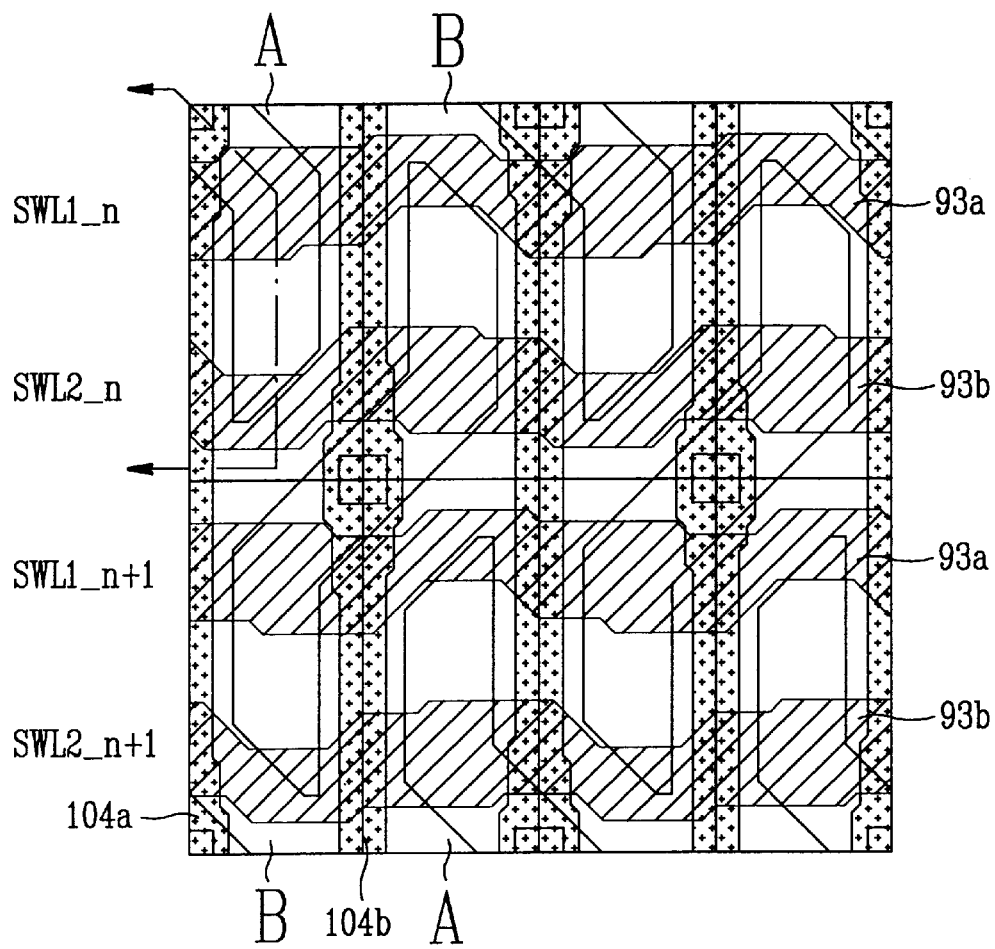
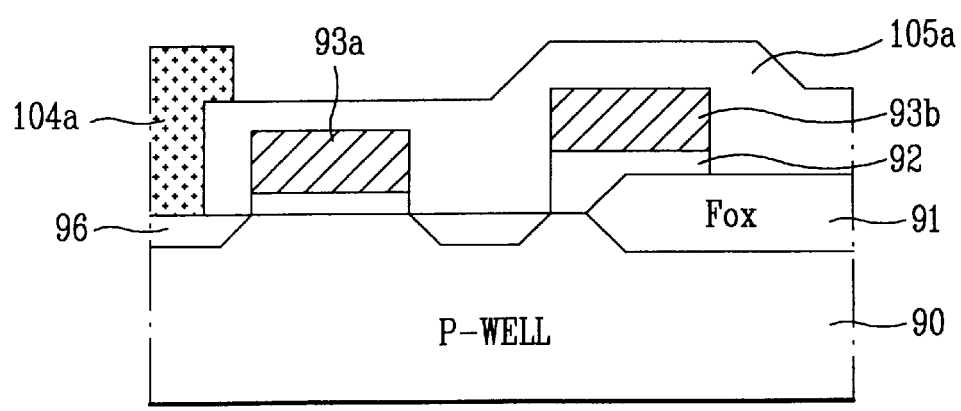

FIG.13f
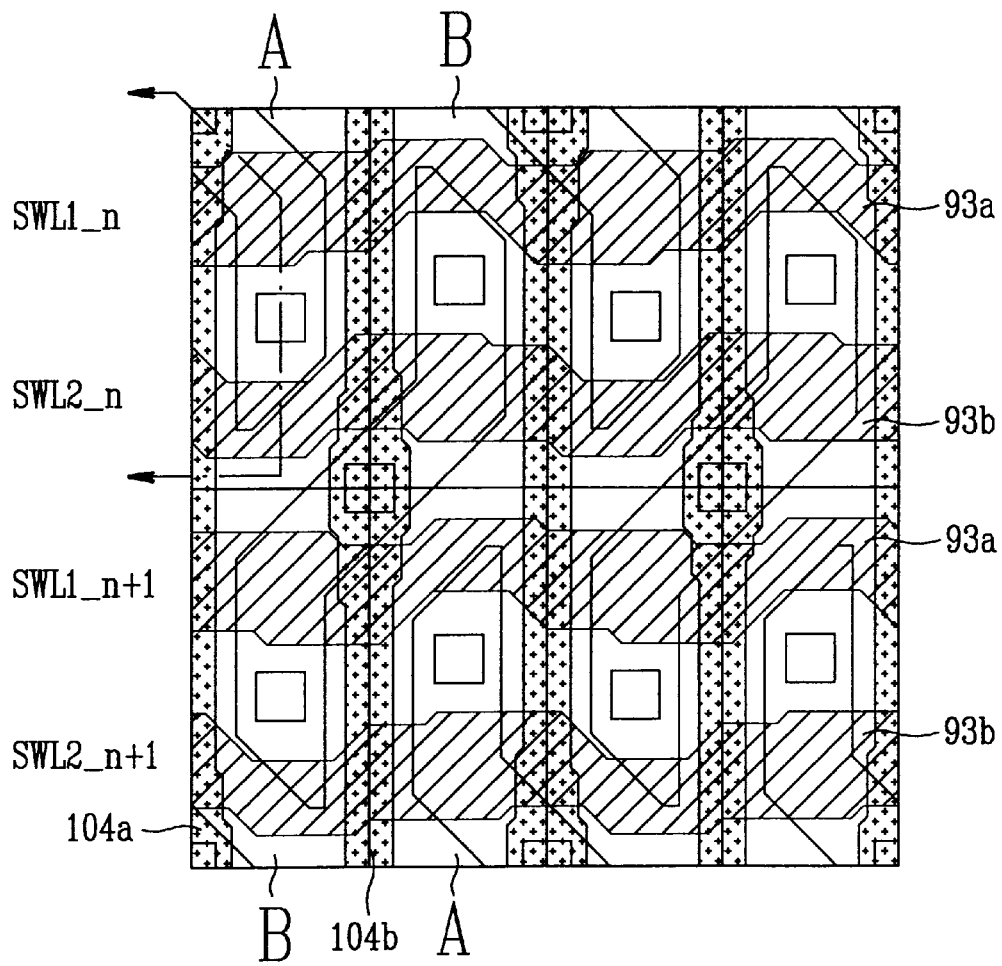
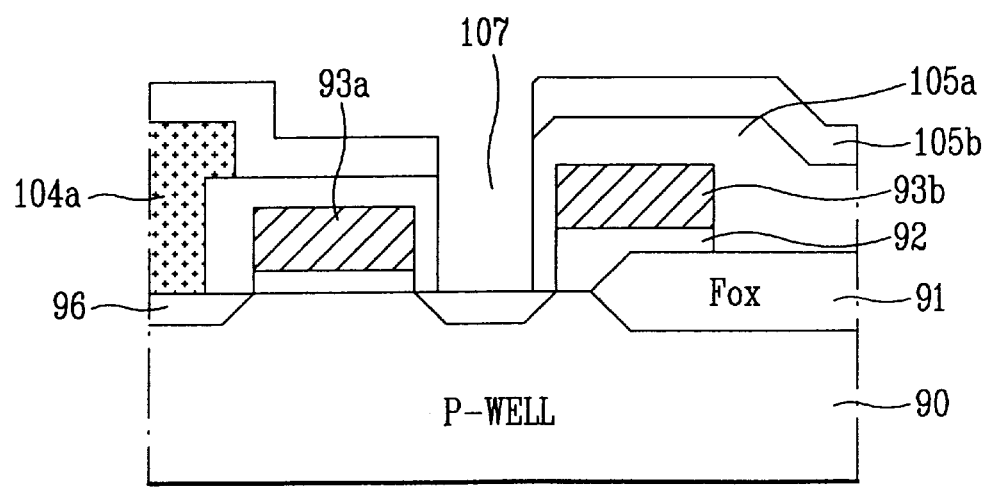

FIG.13g
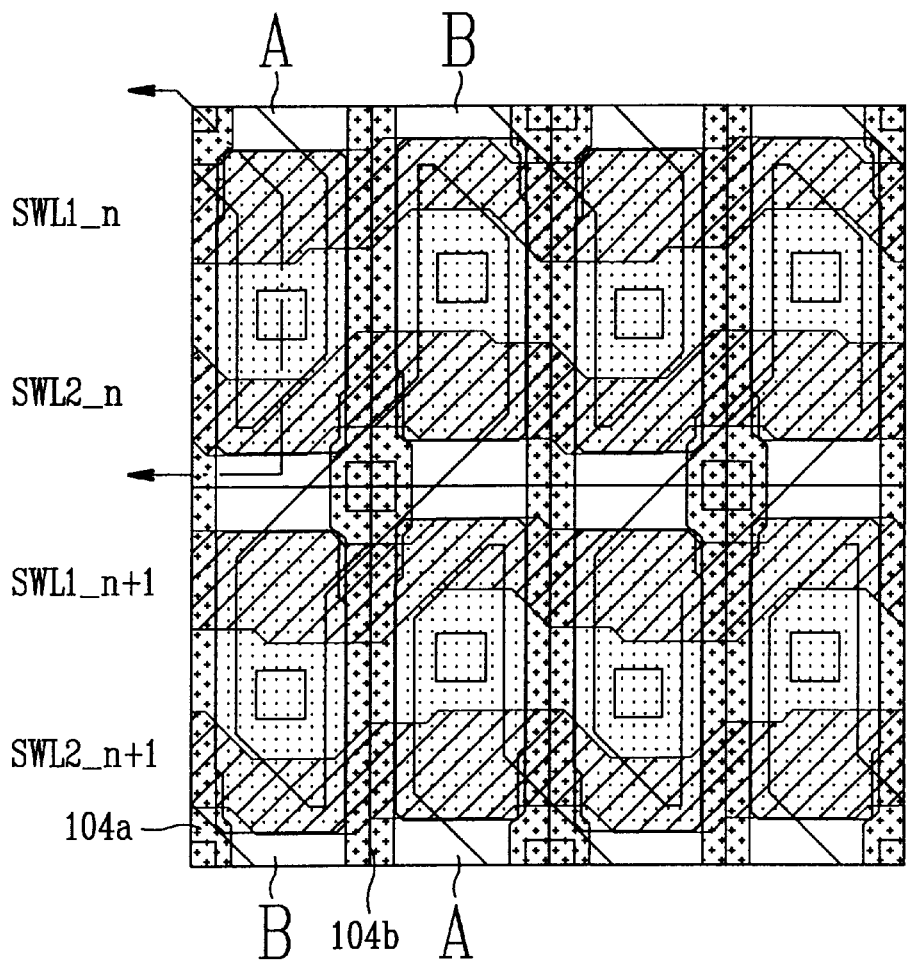
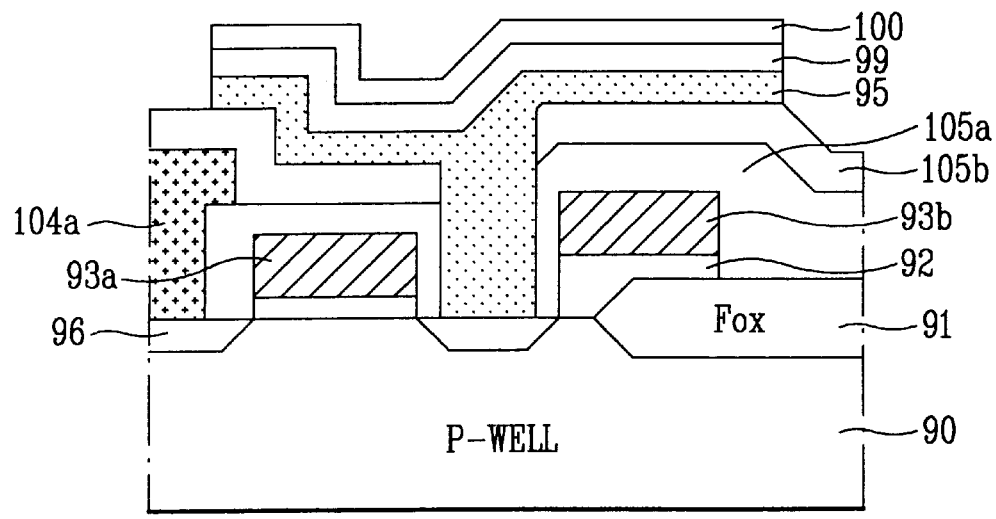

FIG.15a
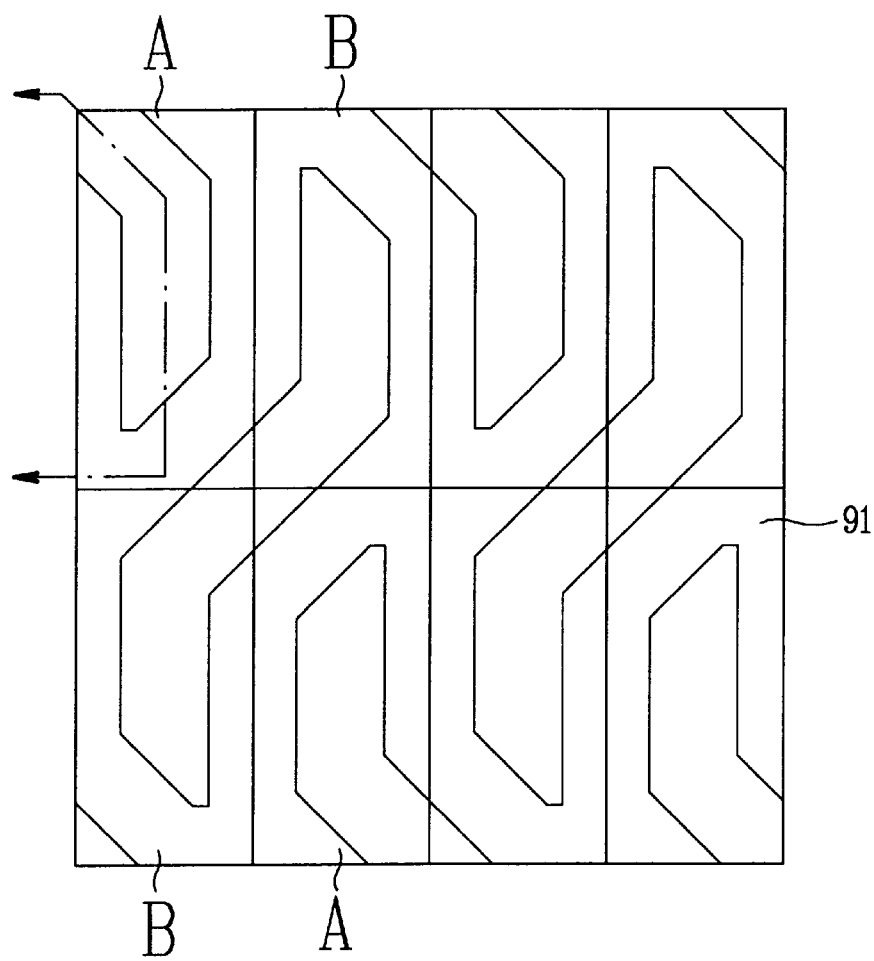
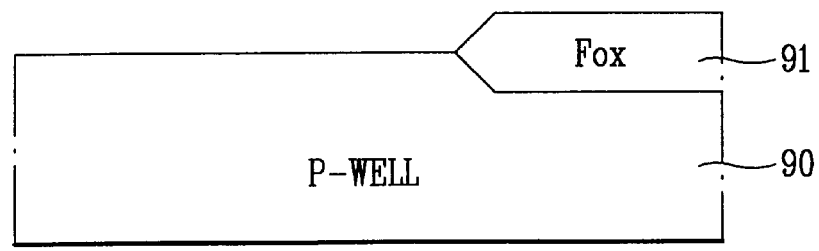

FIG.15b
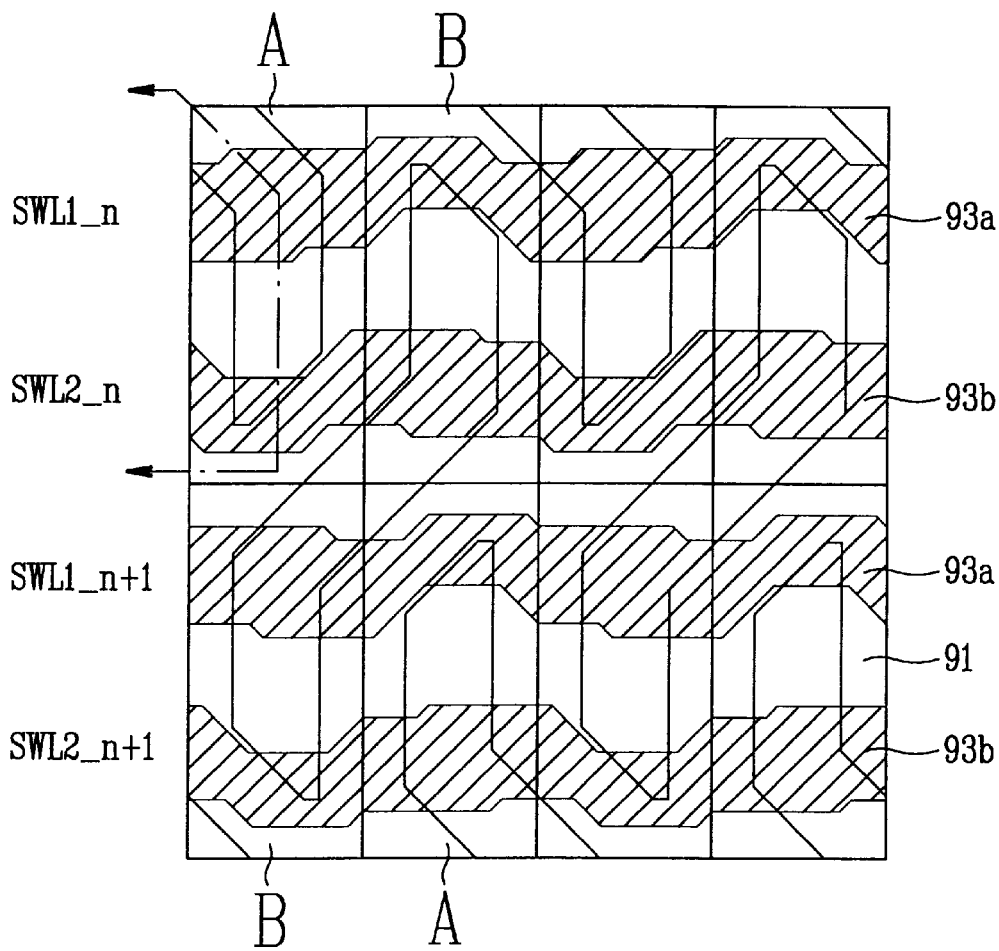
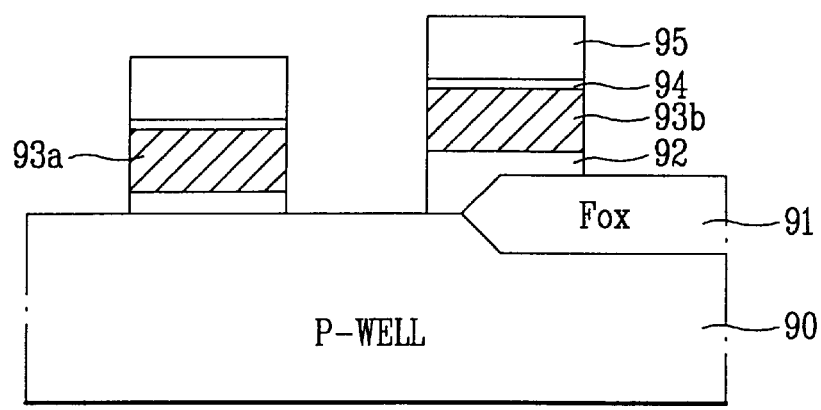

FIG.15c
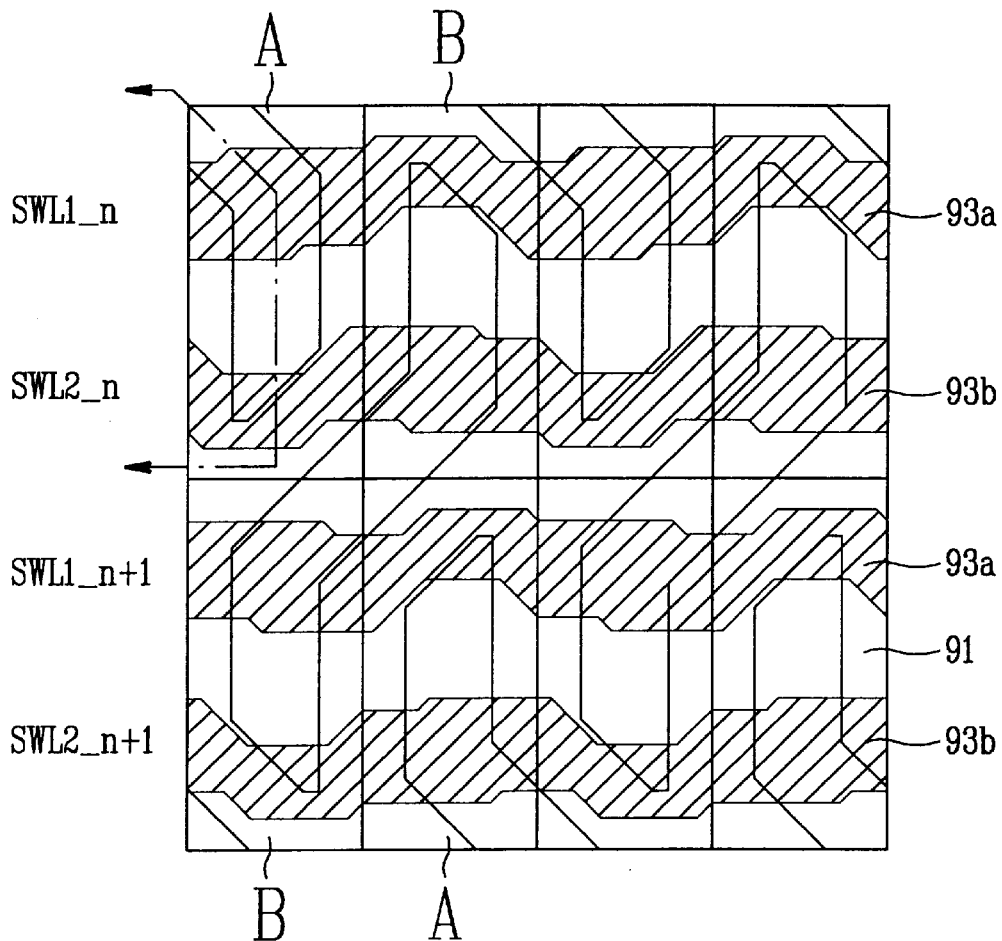
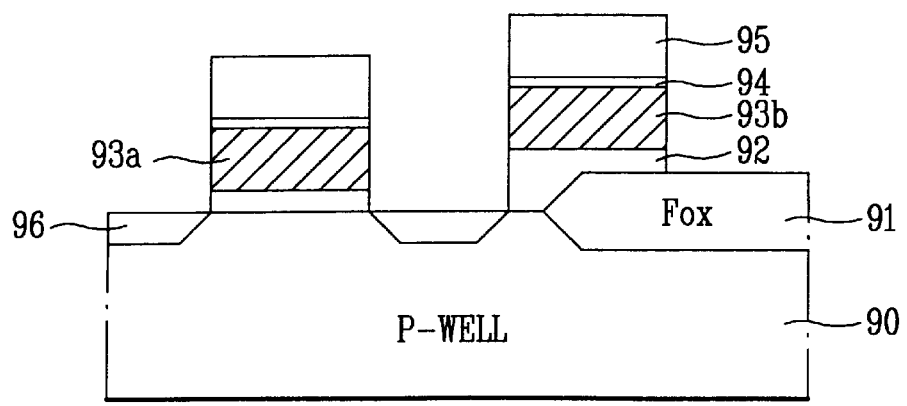

FIG.15d
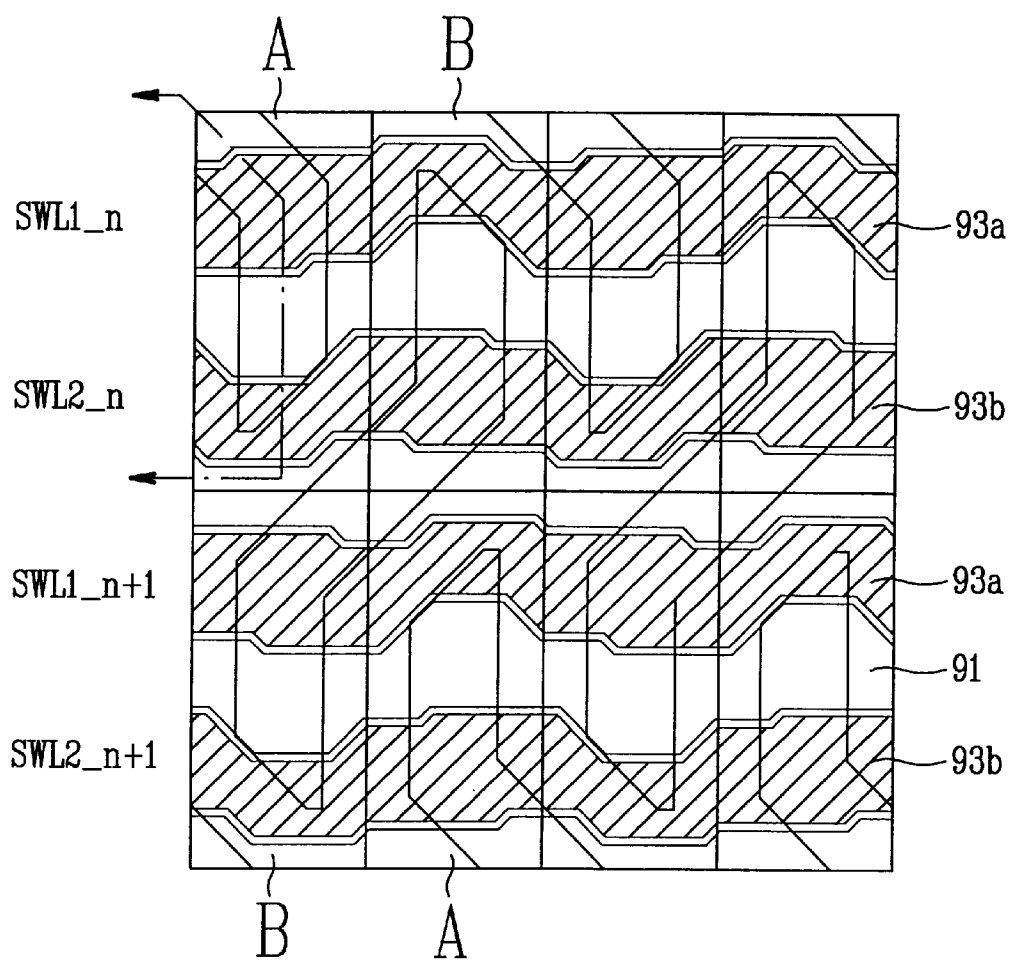
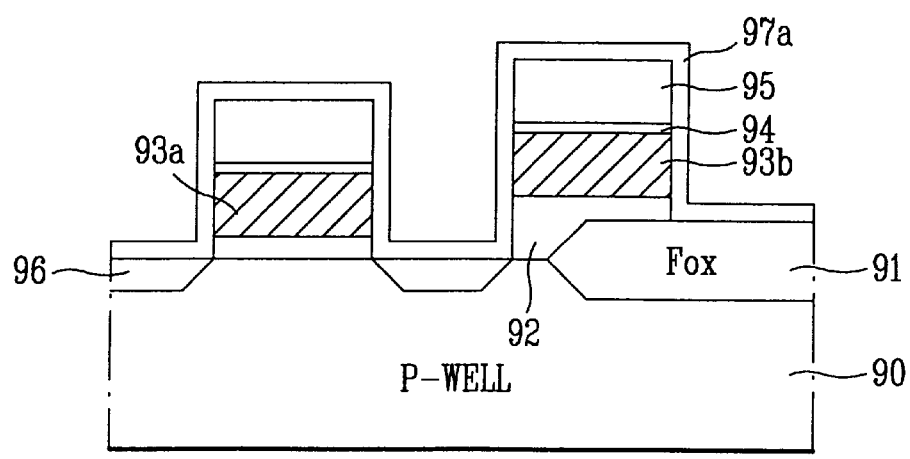

FIG.15e
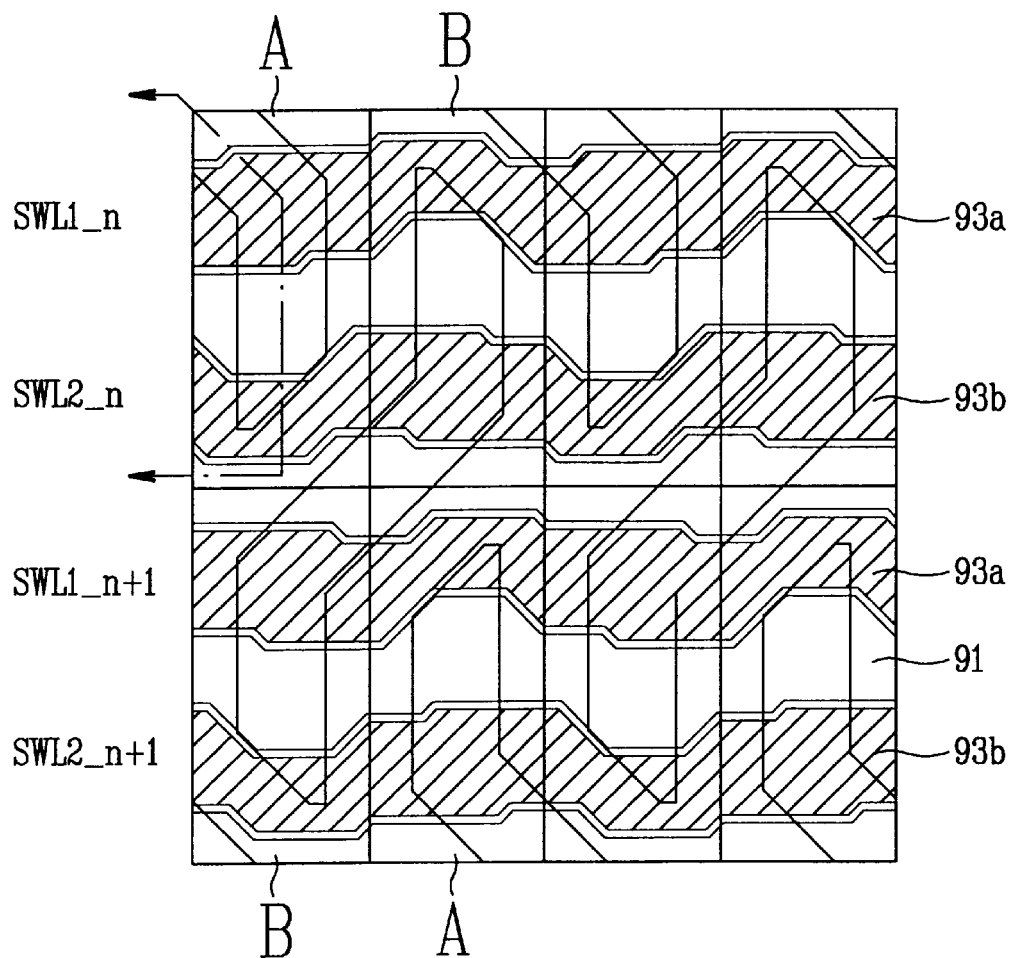
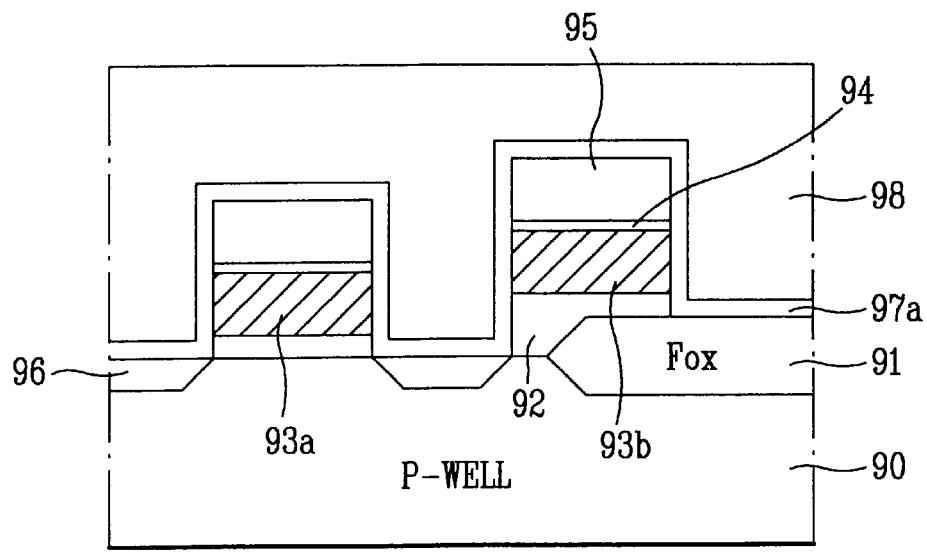

FIG.15f
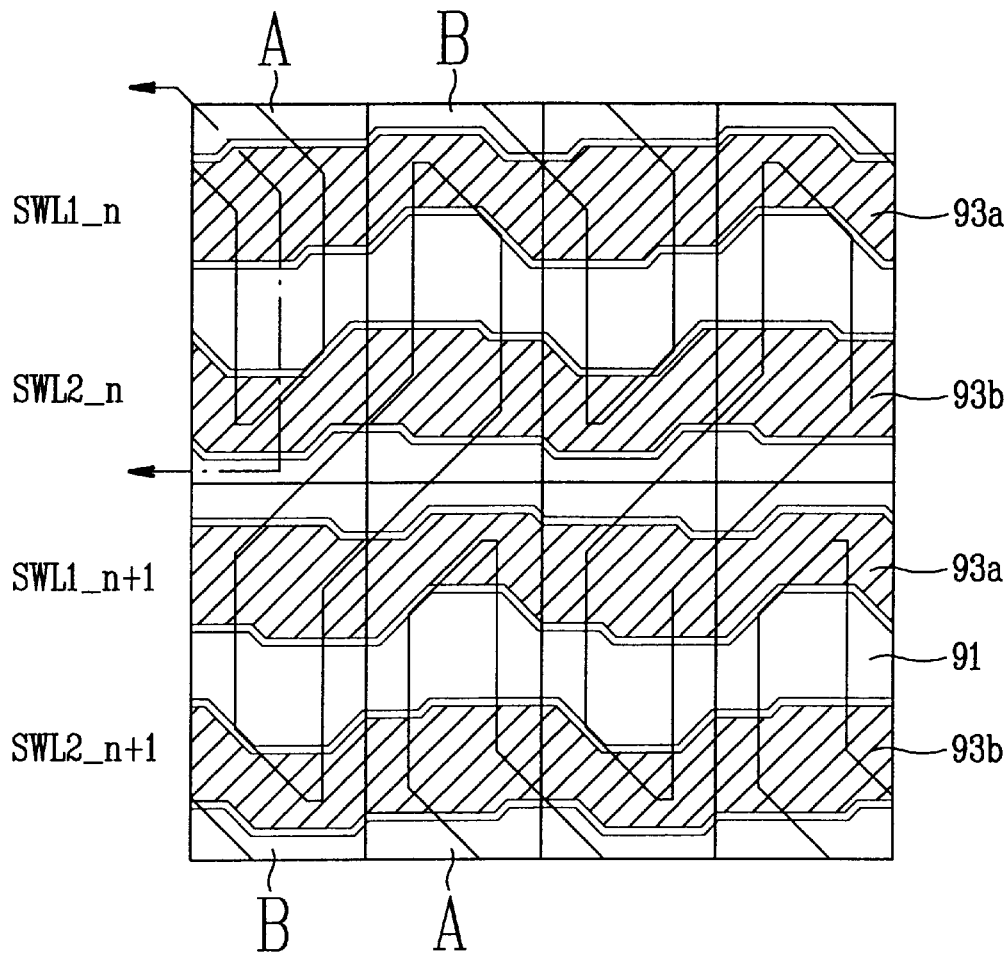
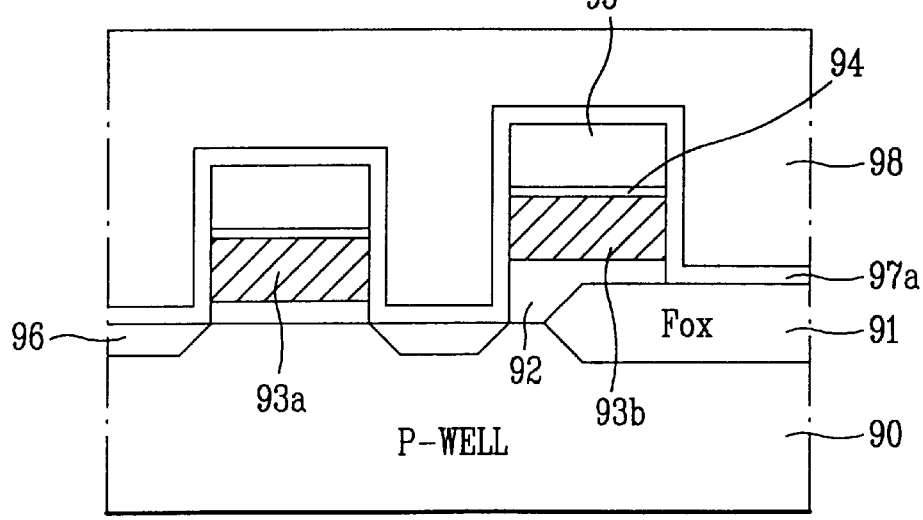

FIG.15g
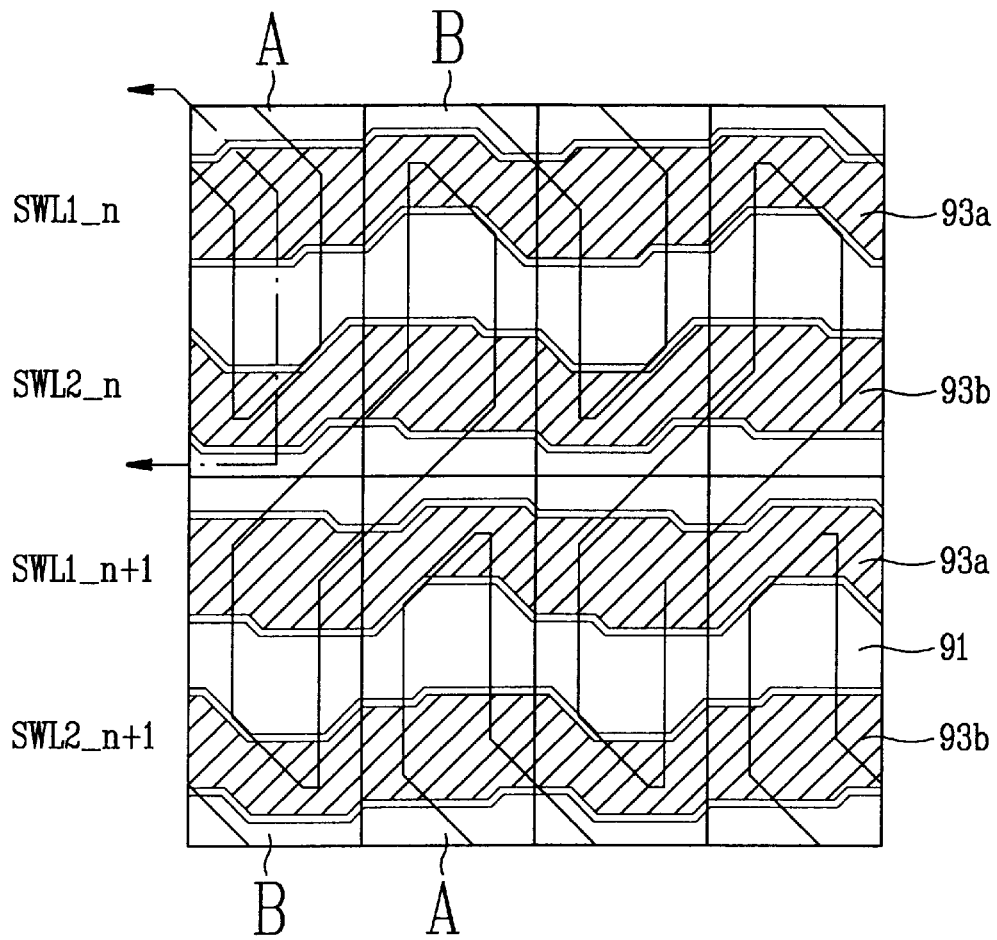
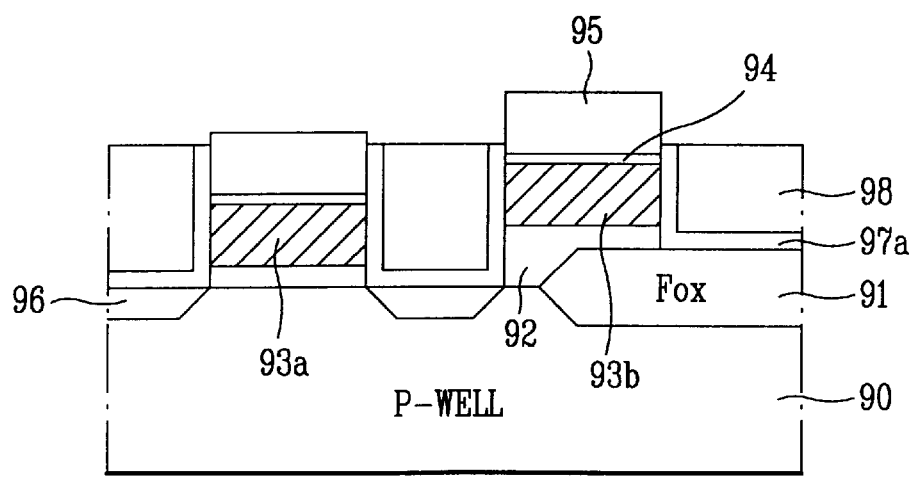

FIG.15h
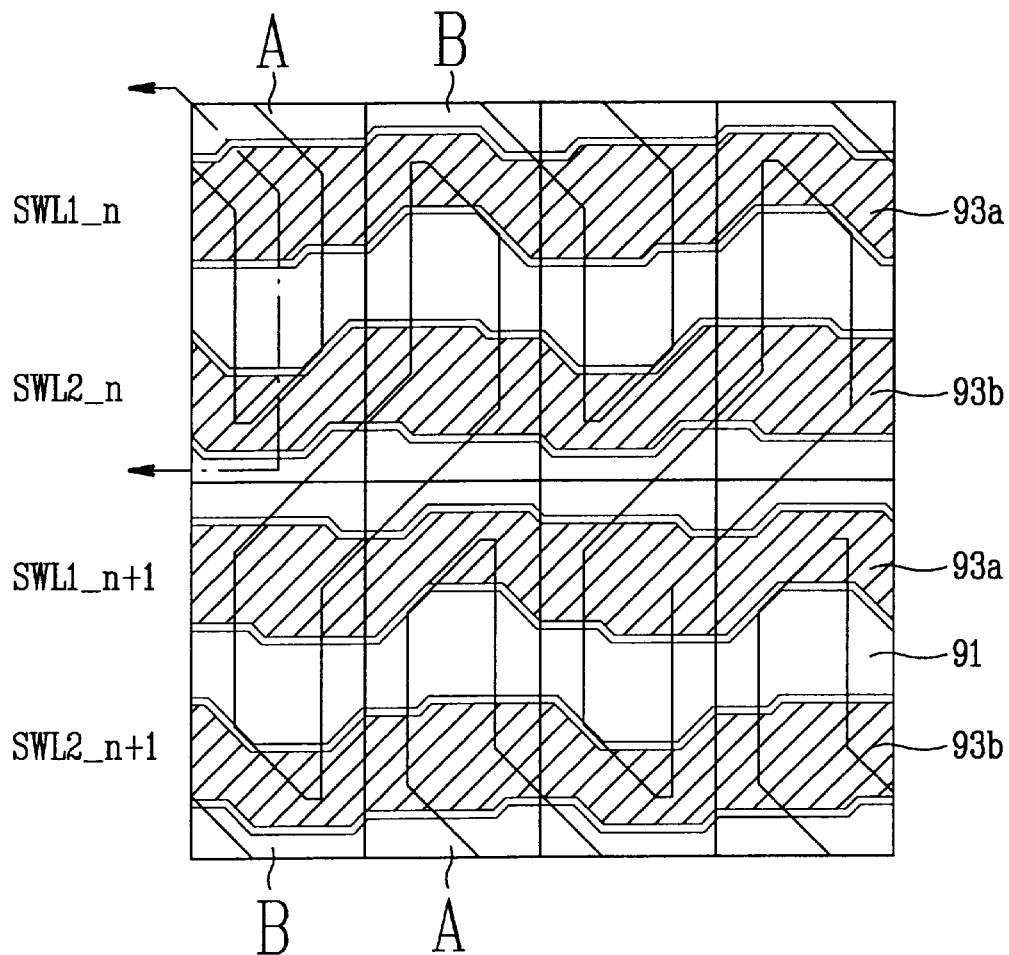
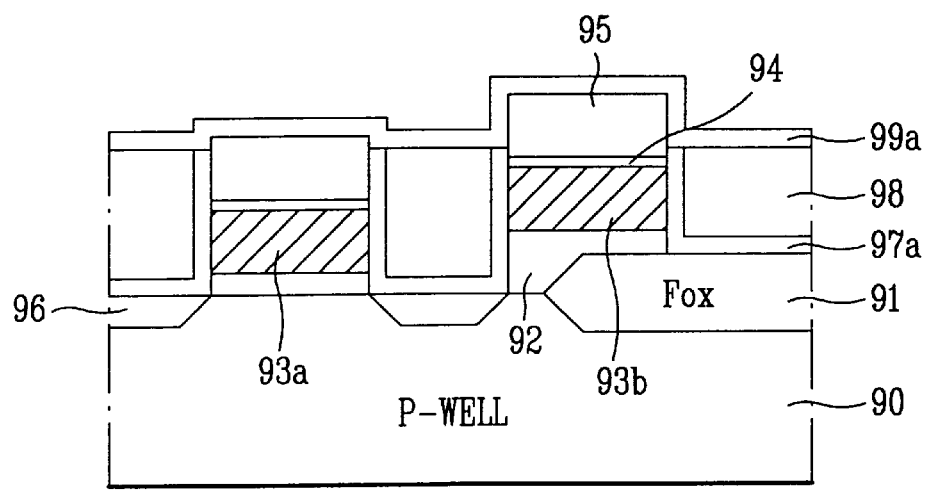

FIG.15i
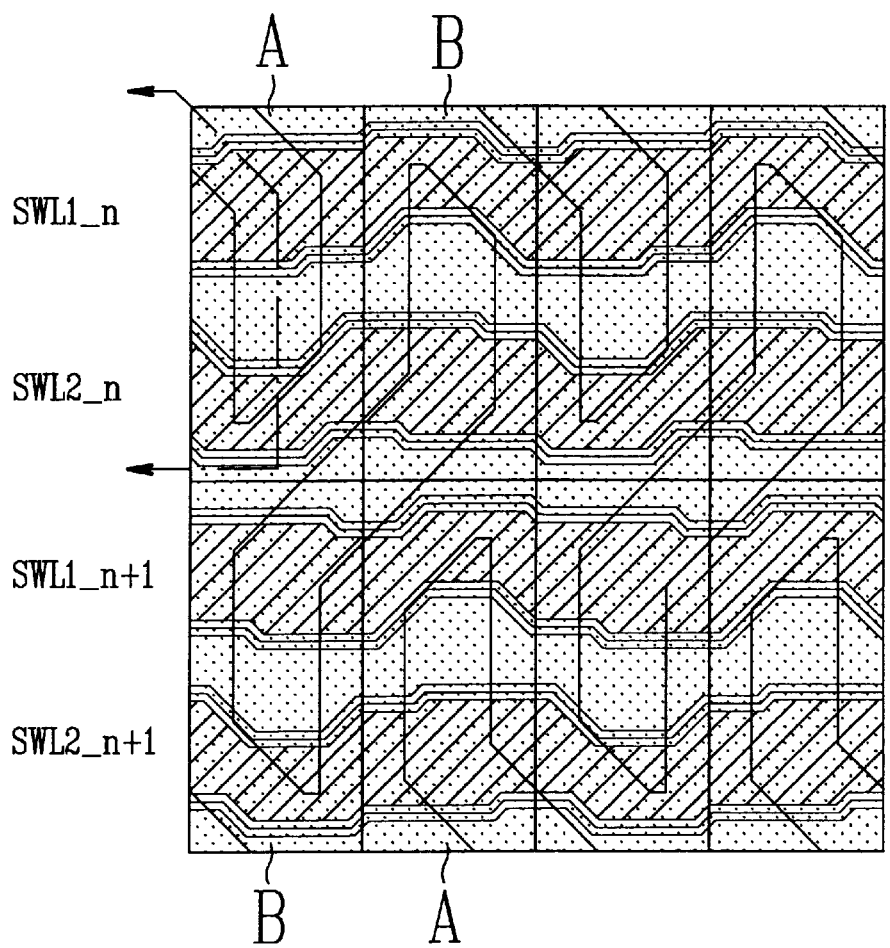
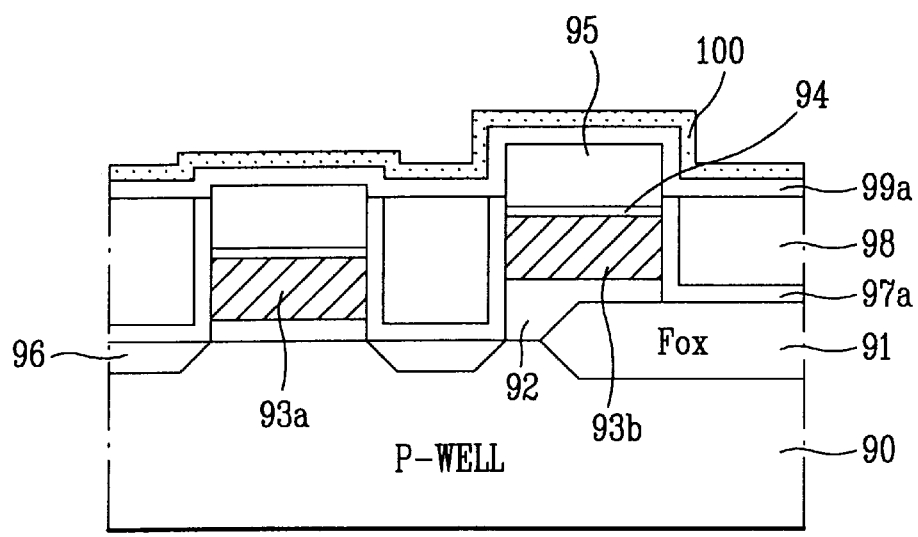

FIG.15j
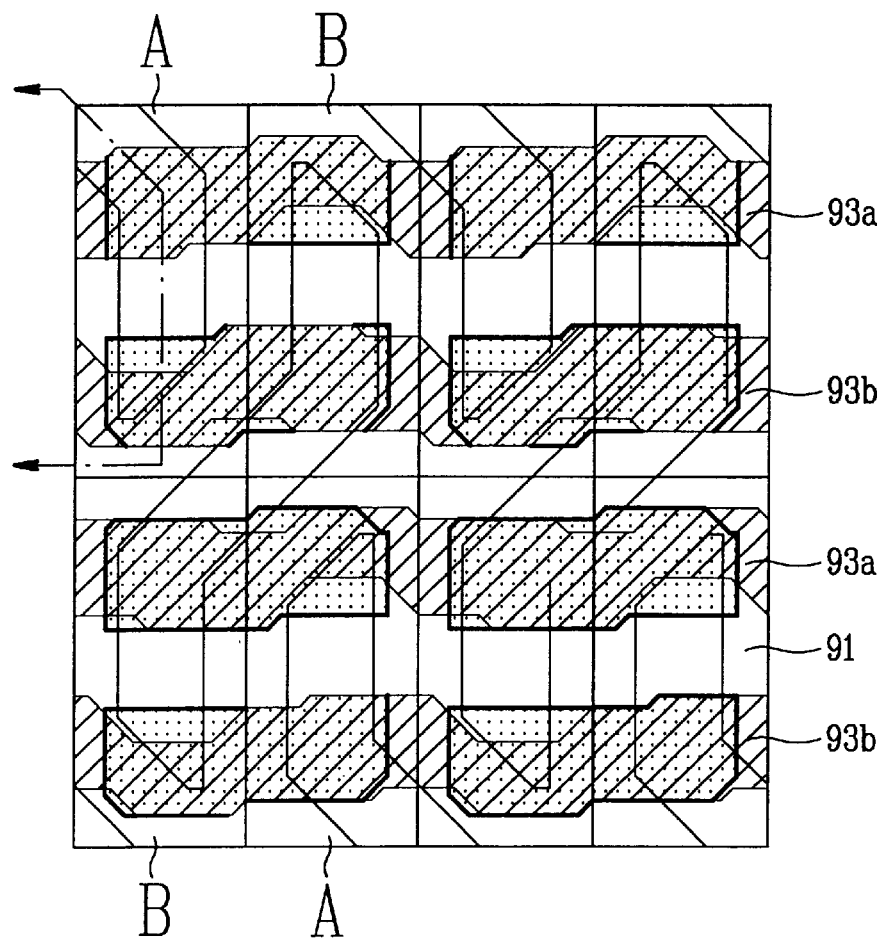
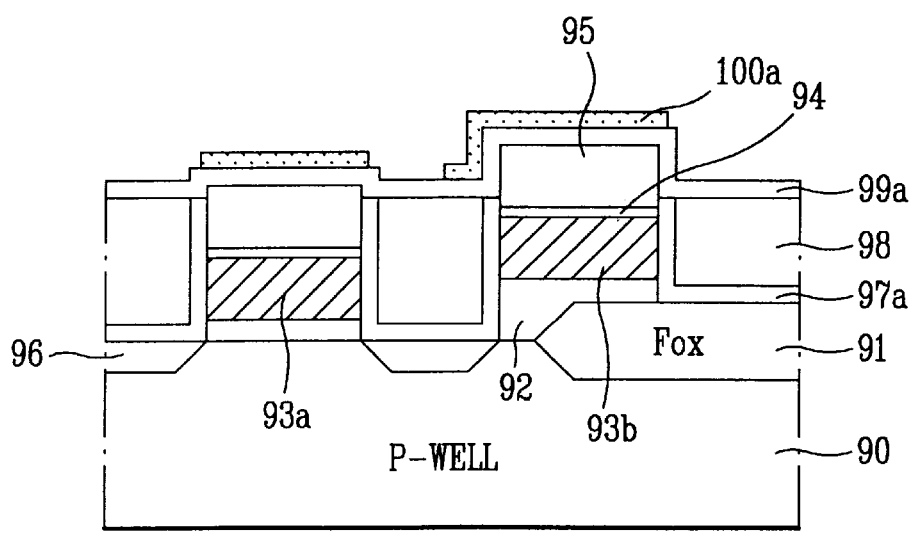

FIG.15k
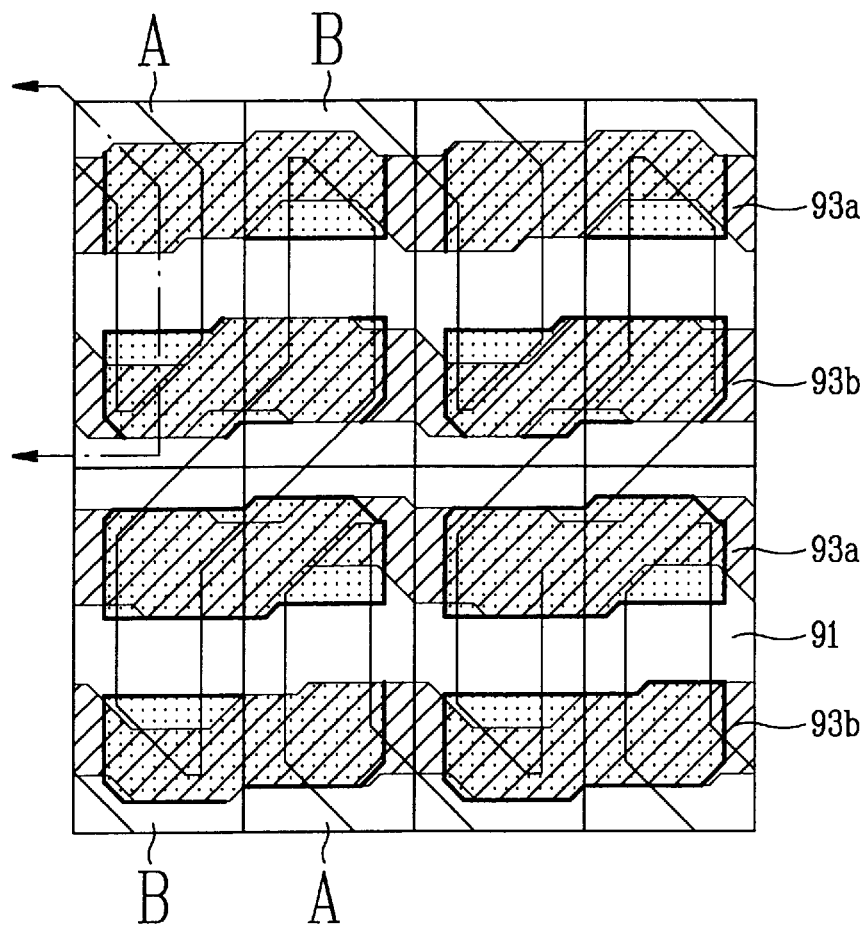
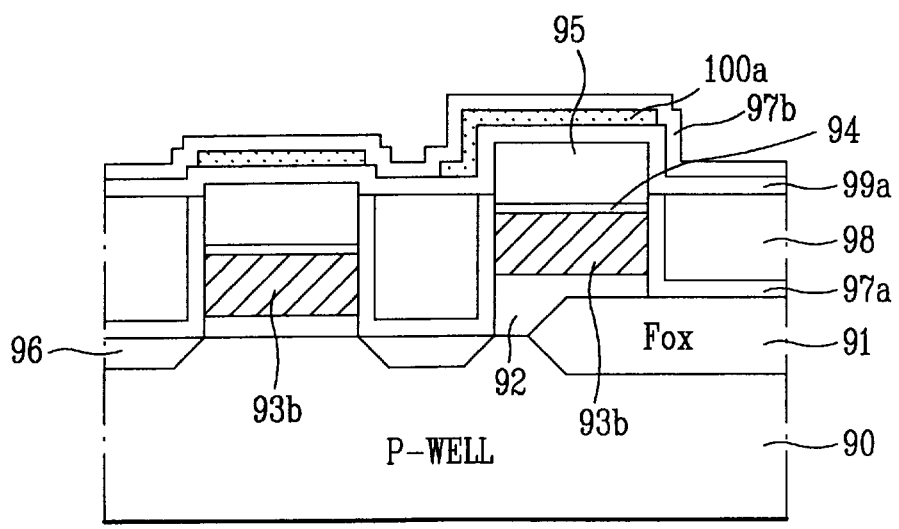

FIG.15I
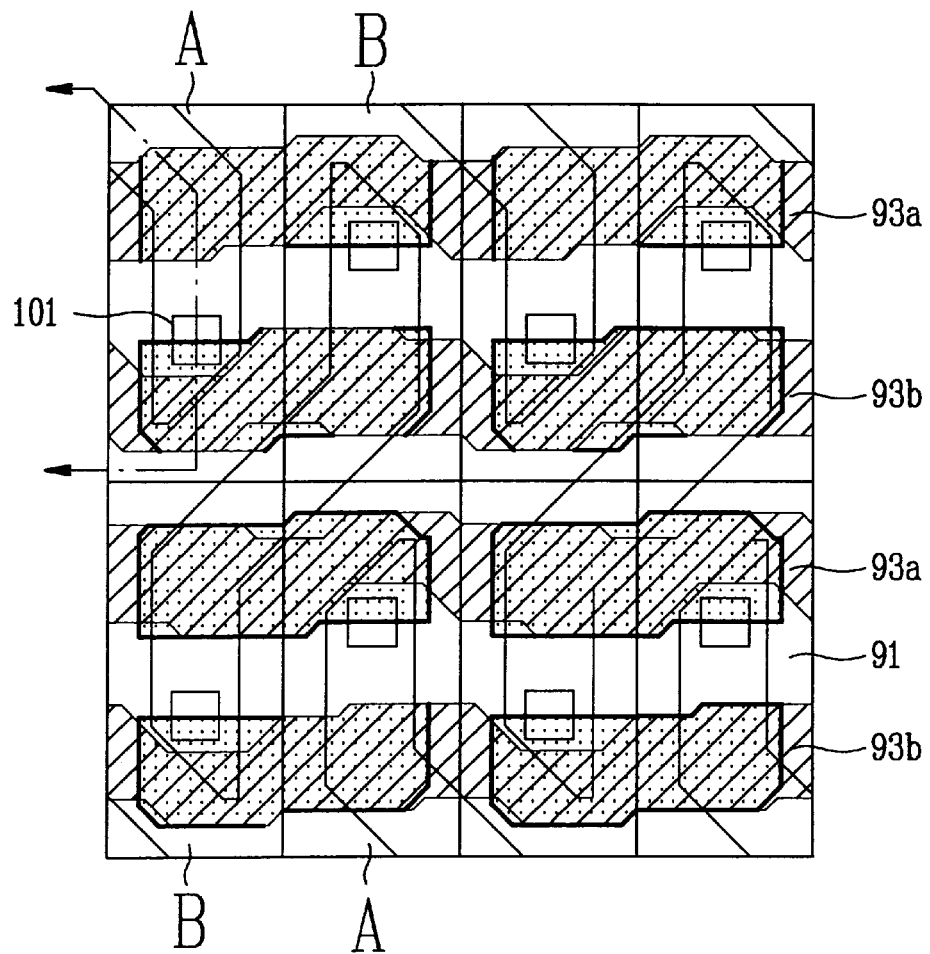
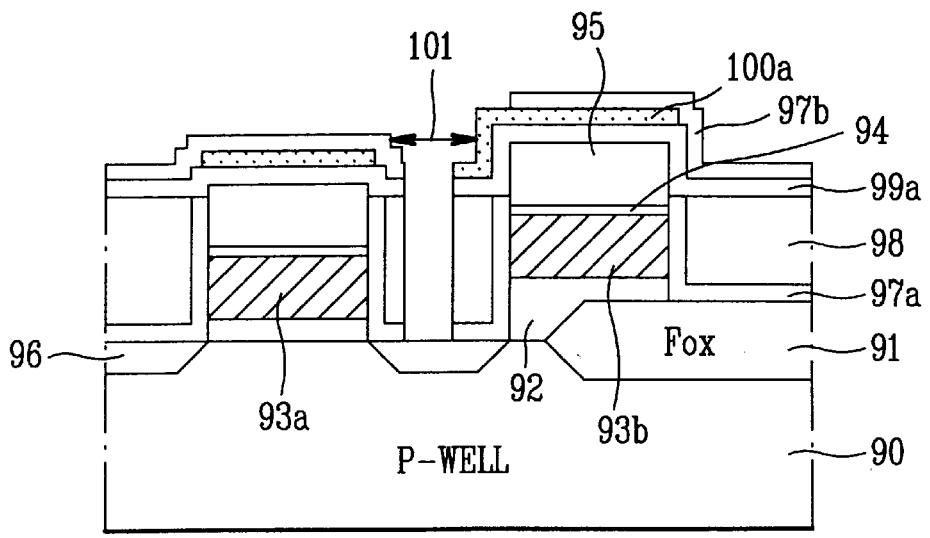

FIG.15m
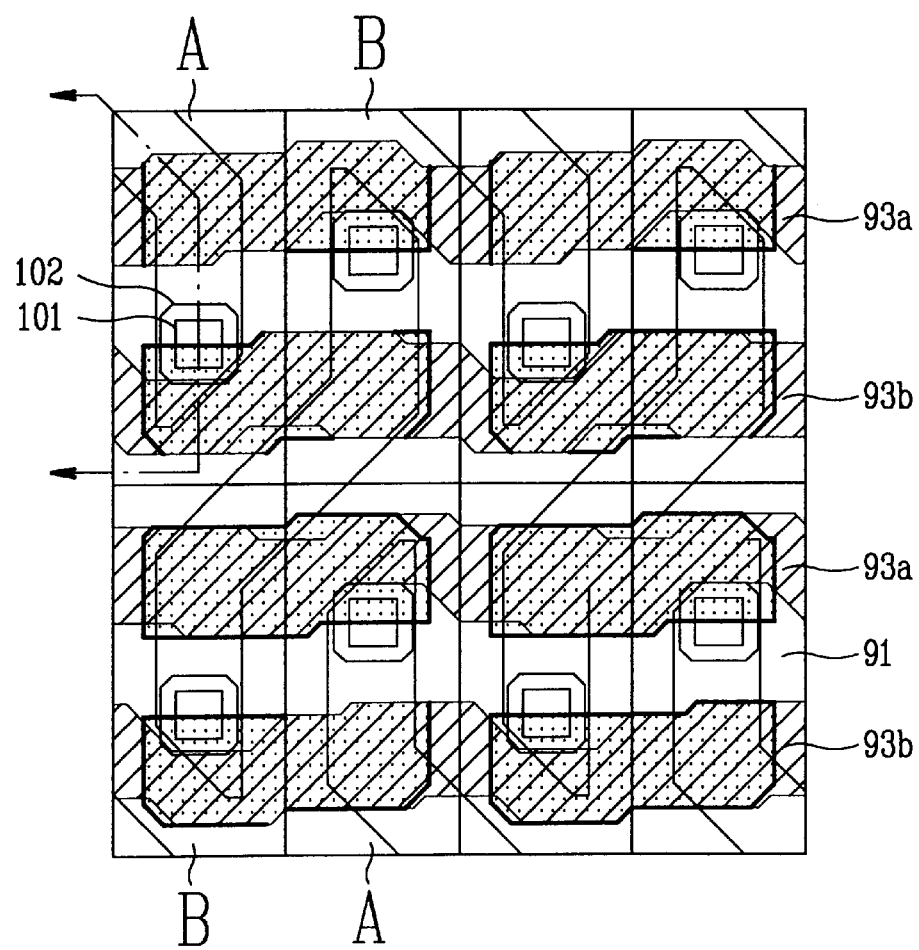
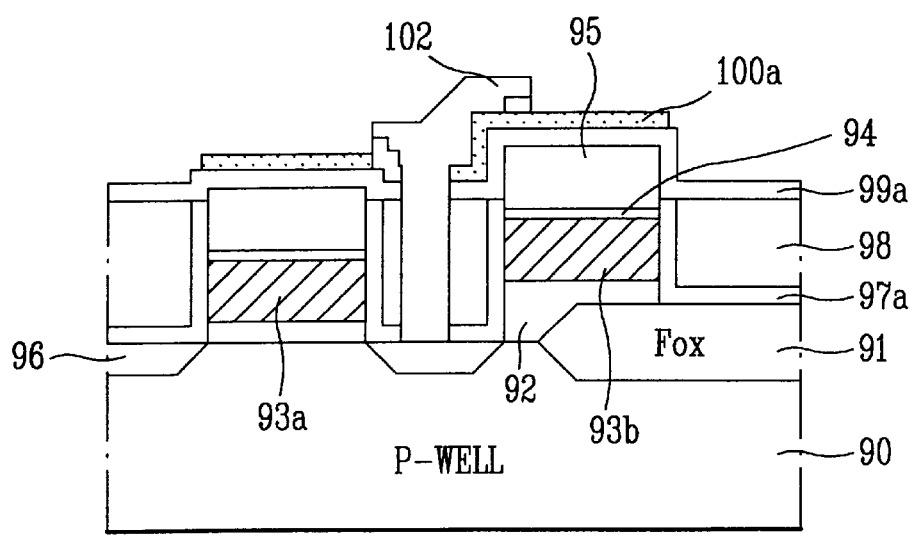

FIG.15n
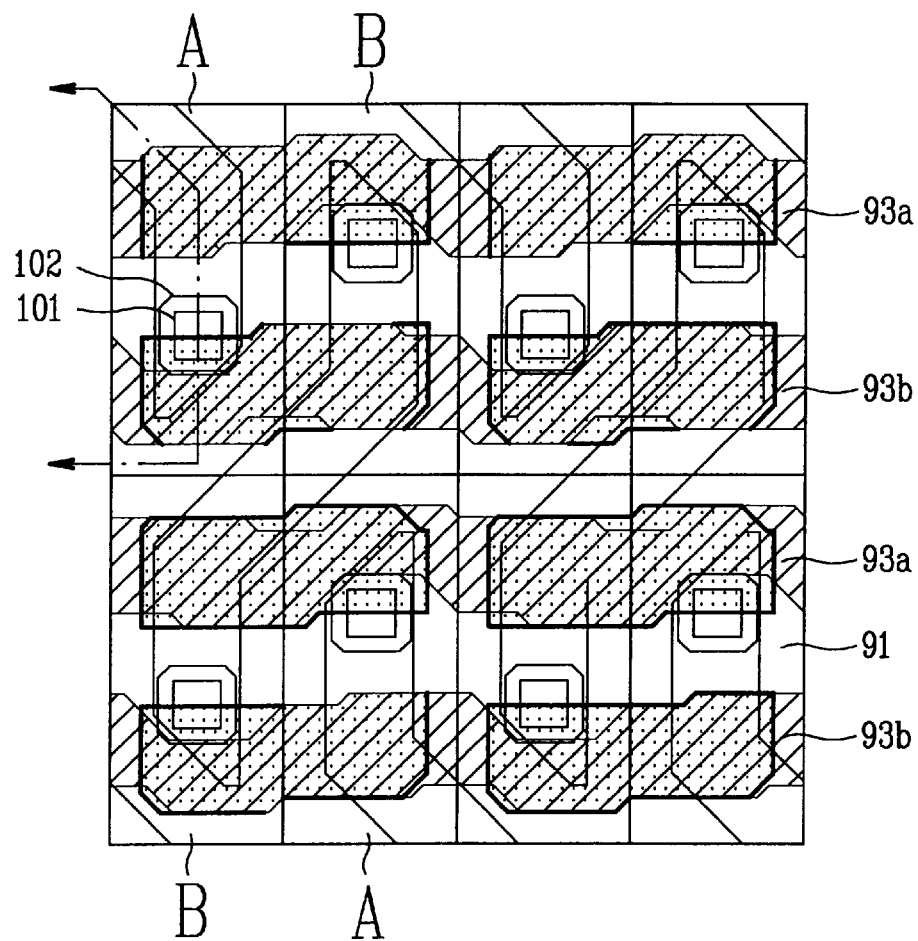
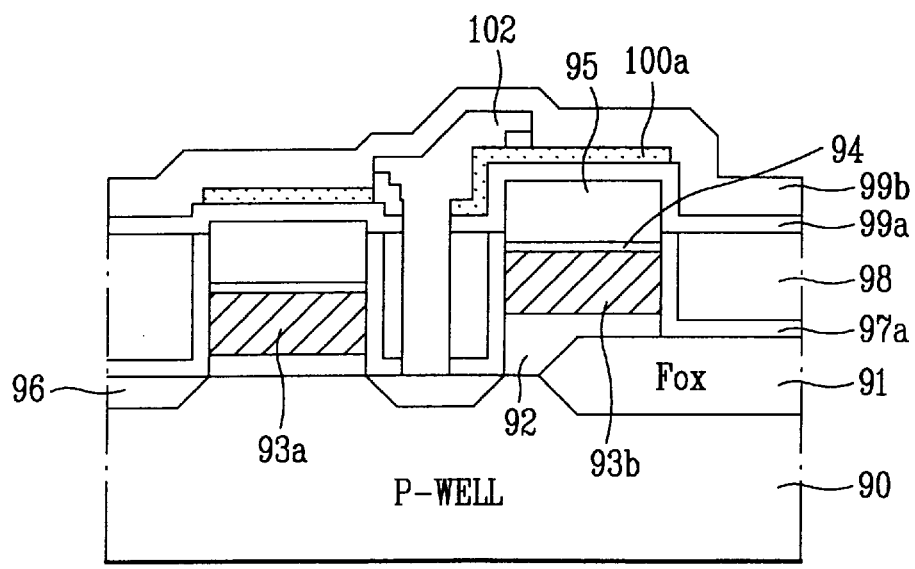

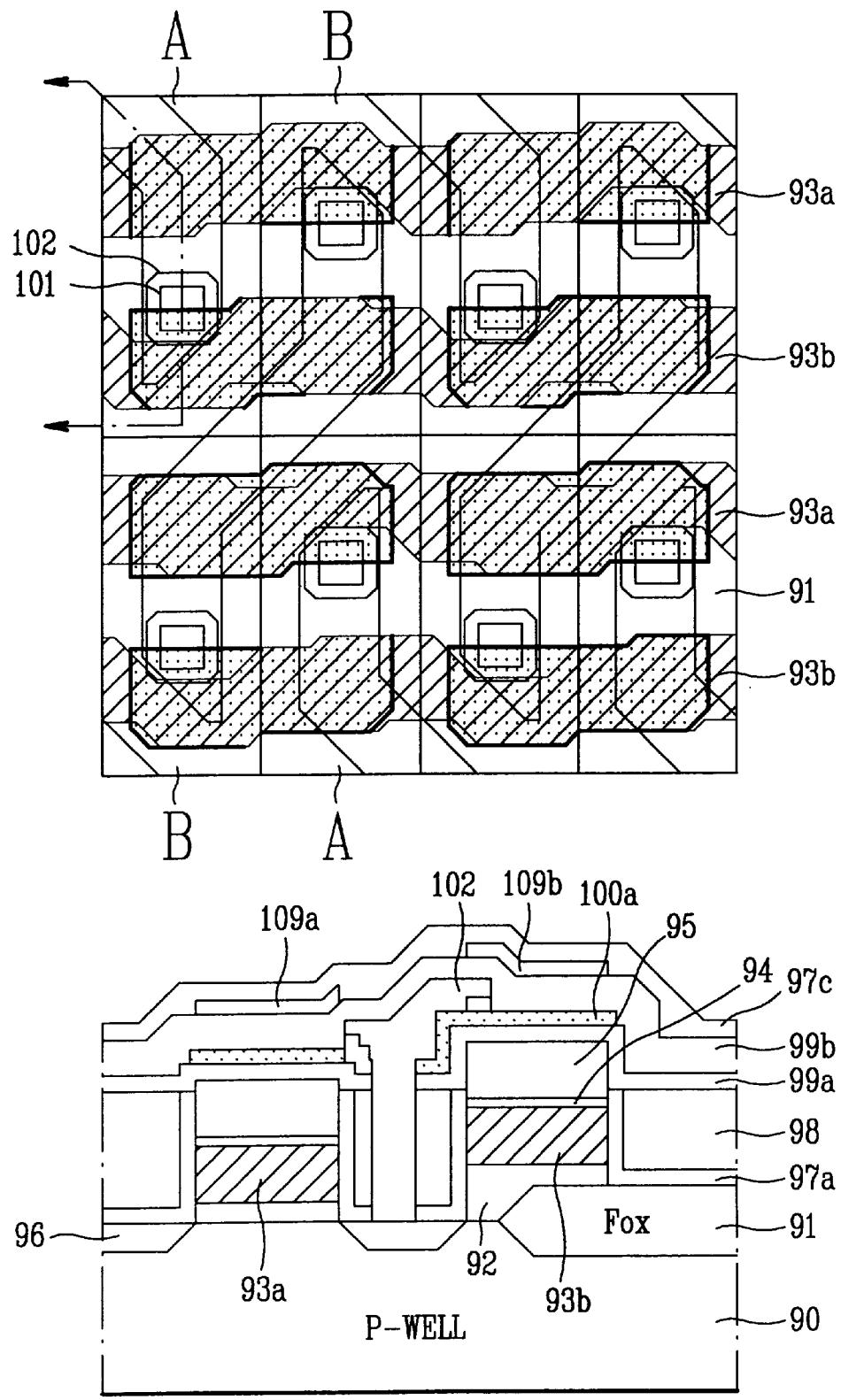

FIG.15r
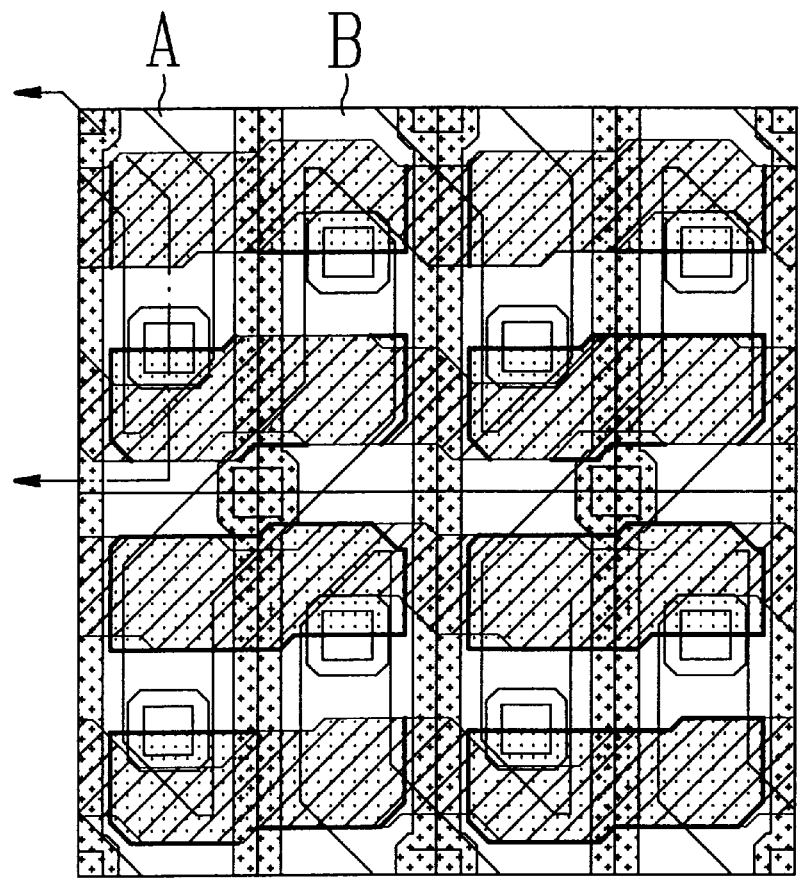
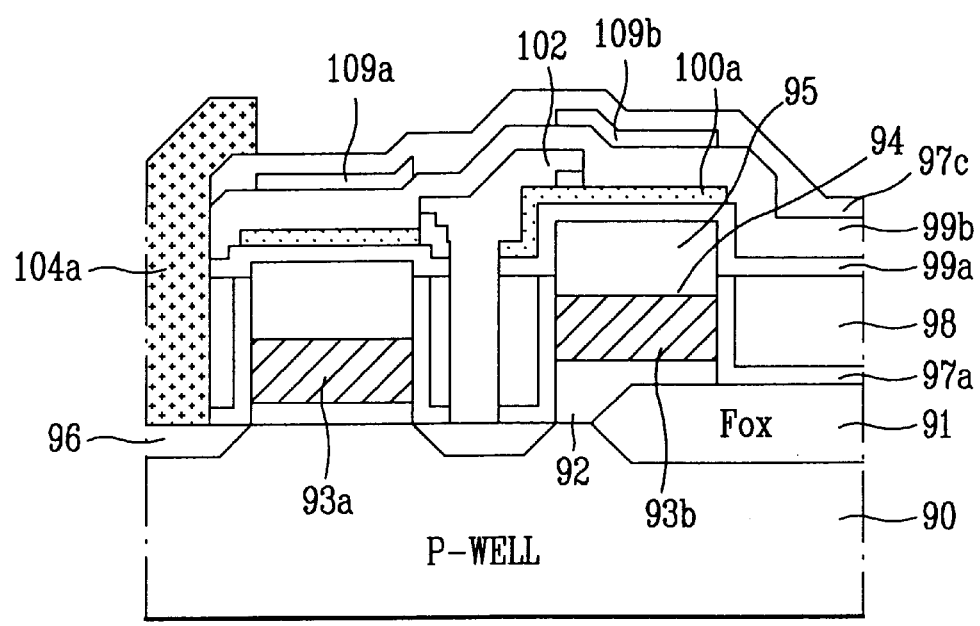

FERROELECTRIC MEMORY DEVICE WITHOUT A SEPARATE CELL PLATE LINE AND METHOD OF MAKING THE SAME

This application is a continuation-in-part of application Ser. No. 09/055,985 filed Apr. 7, 1998.

BACKGROUND OF THE INVENTION

1. Field of the Invention

The present invention relates to a memory device and, more particularly, to a ferroelectric memory device method thereof.

2. Background of the Related Art

A ferroelectric random access memory (FRAM) has the data processing speed as fast as a DRAM, which is widely used as a semiconductor memory device, and stores data even in a power-off state. The FRAM has a structure similar to the DRAM and employs ferroelectric as the capacitor material to use its high residual polarization characteristic. With this characteristic, the data stored in the FRAM is not erased even when electric field applied thereto is removed.

As shown in FIG. 1, a polarization induced by electric field does not disappear, even when the electric field is removed, due to existence of spontaneous polarization but remains in a specific amount (states of d and a). The states d and a correspond to data 1 and 0, respectively, for the memory device.

FIG. 2 illustrates the configuration of the unit cell of a conventional ferroelectric memory device. FIG. 3 illustrates the configuration of the cell array of the conventional ferroelectric memory device. FIG. 4 illustrates operation waveforms of the conventional ferroelectric memory device.

An ideal structure of an FRAM using a ferroelectric layer is the one which is similar to DRAM. However, it has the problem in terms of integration, which is difficult to solve if new materials for forming an electrode and barrier are not used. Such problems occur because capacitors cannot be directly formed on a silicon substrate or polysilicon layer to make the area of FRAM larger than the DRAM with the same capacitance. Furthermore, when electric field is repeatedly applied to the ferroelectric to reiterate polarization inversion, the amount of residual polarization is reduced, which results in fatigue of the thin film. Such a fatigue deteriorates the reliability of device.

The FRAM structure shown in FIG. 2 has been used with regard to such matters, including substitutes for electrode materials currently developed, integration, stability of ferroelectric thin film and operation reliability. The unit cell of the conventional FRAM consists of first and second NMOS transistors 1 and 3 whose gates are commonly connected to a word line 5, and first and second ferroelectric capacitors 2 and 4 formed using a ferroelectric material. The drain and source of the first transistor 1 are respectively connected to a bit line (Bit__n) 6 and a first node 1 (N1). The drain and source of the second transistor 3 are respectively connected to a /bit line (BitB__n) 7 and a second node 2 (N2). The electrodes of the first ferroelectric capacitor 2 are connected to the first node 1 (N1) and a cell plate line 8, and the electrodes of the second ferroelectric capacitor 4 are connected to the second node 2 (N2) and the cell plate line 3.

The unit cell of the conventional FRAM forms the cell array of FIG. 3. The word lines and plate lines are arranged in parallel in the direction of the row, and the bit lines 5 and /bit lines are arranged in parallel in the direction of the column. Each memory cell is located at the point where each row and each column intersect each other. Access to each memory cell can be performed by selecting both the row and column on which the memory cell is placed.

The operation of the conventional FRAM is described with reference to FIG. 4. A chip enable signal CSBpad is enabled from a level "HIGH" to a level "LOW", to start decoding of the address signal. A word line driving signal applied to a selected word line transit from a level "LOW" to a level "HIGH" to select a cell. Before the word lines are activated to allow memory cell data to be loaded on corresponding bit line and /bit line, the bit line and /bit line become an equivalent potential of VSS according to a control signal EQ for the equivalent potential.

Thereafter, the word line driving signal is enabled from a level "LOW" to level "HIGH", to electrically connect the selected memory cell to the bit line and /bit line. Upon connection of the selected memory cell to the bit line and /bit line, a pulse of a level "HIGH" is applied to the plate line P/L, to load the data stored in the ferroelectric capacitor on bit line and /bit line. In this state, a sense amplifier enable signal SAN (for turning on the NMOS transistor of a sense amplifier) transits from a level "LOW" to a level "HIGH", and a sense amplifier enable signal SAP (for turning on the PMOS transistor of the sense amplifier) transits from a level "HIGH" to a level "LOW", such that the voltage of the bit line and /bit line is amplified.

To recover the data destroyed during data reading operation, the signal CSBpad is transferred from a level "HIGH" to a level "LOW", being disabled while the word lines is being activated. The signal CSBpad is disabled from a level "HIGH" to a level "LOW" and the signal applied to the plate line is transferred from a level "HIGH" to a level "LOW", to restore the data destroyed.

In the conventional FRAM, as described above, the word line and the plate line are separately constructed, to complicate the structure of the memory cell, which increases its area. Thus, the word line and plate line receive control signals different from each other, which creates difficulty in the control of the control signals in the input/output operation of data.

SUMMARY OF THE INVENTION

Accordingly, the present invention is directed to a ferroelectric memory device that substantially obviates at least the problems and disadvantages of the related art.

An object of the present invention is to provide a nonvolatile ferroelectric memory device designed with an effective layout.

a further object of the invention is to eliminate a separate cell plate line.

To accomplish the object of the present invention, there is provided a nonvolatile ferroelectric memory device, including: first and second split word lines formed over first and second active regions of a semiconductor substrate, isolated from each other, the first and second split word lines being arranged in the first direction; source and drain regions formed in the first active region placed on both side of the first split word line and the second active region placed on both sides of the second split word line; a conductive barrier layer, a first capacitor electrode and a ferroelectric layer, sequentially formed on the first and second split word lines; two second capacitor electrodes one of which is connected to one of the source and drain regions of the second active region and formed over the first split word line, the other one being connected to one of the source and drain regions of the first active region and formed over the second split word line; and first and second bit lines arranged perpendicular to the first and second split word lines in the second direction, the first bit line being connected to the other one of the source and drain regions of the first active region, the second bit line being connected to the other one of the source and drain regions of the second active region.

To accomplish another object of the invention a method of fabricating a nonvolatile ferroelectric memory device, comprising the steps of: sequentially forming a gate oxide layer, polysilicon layer for forming gates and word lines, conductive barrier layer and first capacitor electrode layer on a semiconductor substrate having first and second active regions isolated from each other by an isolation layer; selectively etching the stacked layers, to form first and second split word lines across the first and second active regions; forming source and drain regions in exposed portions of the first and second active regions using the first and second split word lines as a mask, and sequentially forming a first oxide layer and planarizing insulation layer on the overall surface of the substrate; improving viscosity of the planarizing insulation layer through heat treatment, removing the planarizing insulation layer by a predetermined thickness using etchback process, to expose the first capacitor electrode, and forming a ferroelectric layer and second capacitor electrode layer on the overall surface of the substrate; patterning the second capacitor electrode layer and forming a second oxide layer on the overall surface of the substrate; forming contact holes to expose the drain regions of the first and second active regions, forming a contact plug which comes into contact with the drain region of the first active region and second capacitor electrode layer placed over the second split word line through one of the contact hole, and forming another contact plug which comes into contact with the drain region of the second active region and second capacitor electrode layer placed over the first split word line through the other contact hole; and forming a third oxide layer on the overall surface of the substrate including the contact plug, forming contact holes to expose the source regions of the first and second active regions, and forming first and second bit lines perpendicular to the first and second split word lines, the first and second bit lines coming into contact with the source regions through the contact holes.

The first split word line and first capacitor electrode, placed over the first split word line, are connected to each other at a predetermined portion of a peripheral circuit region, and the second split word line and first capacitor electrode, placed over the second split word line, are connected to each other at a predetermined portion of the peripheral circuit region. The first and second capacitor electrodes are formed of a metal such as Pt. The planarizing insulation layer for filling the space between the first and second split a word lines is formed of SOG or BPSG. The heat treatment is carried out to the planarizing insulation layer at a temperature of 800 to 900° C., to shrink its volume by 20 to 30%, improving its viscosity. The contact plugs are formed in such a manner that portions of the second oxide layer, ferroelectric layer, planarizing insulation layer and first oxide layer, placed on the drain regions of the first and second active regions, are selectively removed, to form the contact holes, simultaneously, to expose a portion of the second capacitor electrode, and a material for forming the contact plugs is deposited to completely fill the contact holes and patterned so as to come into contact with the drain regions and second capacitor electrode.

The contact holes for exposing the source regions of the first and second active regions are formed in such a manner that the third oxide layer is formed on the overall surface of the substrate including the contact plugs, and portions of the third oxide layer, second oxide layer, ferroelectric layer, planarizing insulation layer and first oxide layer, placed on the source regions, are selectively removed.

The object of the present invention can be achieved in a whole or in parts by a method of fabricating a nonvolatile ferroelectric memory device, comprising the steps of: sequentially forming a gate oxide layer, polysilicon layer for forming gates and word lines, conductive barrier layer and first capacitor electrode layer on a semiconductor substrate having first and second active regions isolated from each other by an isolation layer; selectively etching the stacked layers, to form first and second split word lines across the first and second active regions; forming source and drain regions in exposed portions of the first and second active regions using the first and second split word lines as a mask, and sequentially forming a first oxide layer and photoresist layer on the overall surface of the substrate; removing the photoresist layer, filled between the first and second split word lines, by a predetermined thickness using etchback, removing the first oxide layer to expose the first capacitor electrode, and completely removing remaining photoresist layer; forming a ferroelectric layer and second capacitor electrode layer on the overall surface of the substrate including the exposed first capacitor electrode, patterning the second capacitor electrode layer, and forming a second oxide layer on the overall surface of the substrate; forming contact holes to expose the drain regions of the first and second active regions, forming a conductive connection layer which connects the drain region of the first active region to the second capacitor electrode placed over the second split word line through one of the contact hole, and forming another conductive connection layer which connects the drain region of the second active region to the second capacitor electrode placed over the first split word line through the other contact hole; and forming a third oxide layer on the overall surface of the substrate including the conductive connection layer to bury the space between the first and second split word lines, forming contact holes to expose the source regions of the first and second active regions, and forming first and second bit lines perpendicular to the first and second split word lines, the first and second bit lines coming into contact with the source regions through the contact holes.

The objects of the present invention can be achieved in a whole or in parts by a nonvolatile ferroelectric memory device, comprising: first and second split word lines parallel with each other; first and second shunt split word lines branched from the first and second split word lines respectively; a first transistor whose gate is connected to the first split word line; a second transistor whose gate is connected to the second split word line; a bit line connected to one electrode of the first transistor and arranged perpendicular to the first and second split word lines; a bit line connected to one electrode of the second transistor, arranged parallel with the bit line and perpendicular to the first and second split word lines; a first ferroelectric capacitor, one electrode of the first ferroelectric capacitor being connected to the other electrode of the first transistor, the other electrode of the first ferroelectric capacitor being connected to the second shunt split word line; and a second ferroelectric capacitor, one electrode of the second ferroelectric capacitor being connected to the other electrode of the second transistor, the other electrode of the second ferroelectric capacitor being connected to the first shunt split word line.

The objects of the present invention can be achieved in a whole or in parts by a nonvolatile ferroelectric memory device, comprising: first and second split word lines formed over first and second active regions of a semiconductor substrate, isolated from each other, the first and second split word lines being arranged in the first direction; source and drain regions formed in the first active region placed on both sides of the first split word line and second active region placed on both sides of the second split word line; first and second bit lines isolated from neighboring layers and arranged perpendicular to the first and second split word lines in the second direction, the first bit line being connected to one of the source and drain regions of the first active region, the second bit line being connected to one of the source and drain regions of the second active region; two first capacitor electrodes formed over the first and second split word lines in a cylindrical shape with the bottom and cylinder, one of the first capacitor electrodes being connected to the other one of the source and drain regions of the first active region, the other one of the first capacitor electrodes being connected to the other one of the source and drain regions of the active region; a ferroelectric layer formed on the inner walls of the first capacitor electrodes; second capacitor electrodes filled in the first capacitor electrodes; and a first shunt split word line formed over the first split word line and connected to the second capacitor electrode of the second active region, and second shunt split word line formed over the second split word line and connected to the second capacitor electrode of the first active region.

When it is assumed that the semiconductor substrate is divided into rectangular blocks with longer and shorter sides, and among neighboring four blocks placed at a certain region, the first, second, third and fourth clockwise are respectively called a block A, block B, block A and block B, and this four-block structure is repeated in the substrate, the first active region is formed over one blocks A and the other block A, arranged adjacent in diagonal direction, and the second active region is formed over one block B horizontally located next to the block A, and the other block B vertically located next to the block A, the two blocks Bs being arranged in diagonal direction. The first direction is perpendicular to the longer sides of the blocks A and B, and second direction is parallel with the longer sides of the blocks A and B. Each first capacitor electrode connected to one of the source and drain regions of each of the first and second active regions has a flat shape, not having the cylindrical portion.

The objects of the present invention can be achieved in a whole or in parts by a method of fabricating a nonvolatile ferroelectric memory device, comprising the steps of: forming a gate oxide layer and polysilicon layer for forming gates and word lines on a semiconductor substrate having first and second active regions isolated from each other by an isolation layer, and selectively etching them, forming first and second split word lines across the first and second active regions; forming source and drain regions in exposed portions of the active regions using the first and second split word lines as a mask, and forming a first interlevel insulating layer on the overall surface of the substrate; forming bit line contact holes to expose the source regions of the first and second active regions, and forming first and second bit lines perpendicular to the first and second split word lines, coming into contact with the source regions through the bit line contact holes; forming a second interlevel insulating layer, forming contact holes to expose the drain regions of the first and second active regions, forming first capacitor electrodes in a cylindrical shape, coming into contact with the drain regions through the contact holes; forming a ferroelectric layer on the overall surface of the substrate on which the first capacitor electrodes are formed, and forming second capacitor electrodes to be filled in the cylinders of the first capacitor electrodes; and forming a third interlevel insulating layer on the overall surface of the substrate including the second capacitor electrodes, forming contact holes to expose portions of the second capacitor electrodes, forming a metal layer on the overall surface of the substrate and selectively etching it, to form first and second shunt split word lines.

Before the third interlevel insulating layer is formed, portions of second capacitor electrodes, ferroelectric layer and first capacitor electrodes in the cylindrical shape are removed by a predetermined thickness by CMP process, isolating capacitors by the unit cell. A process of forming the first capacitor electrodes comprises the steps of: selectively removing the second interlevel insulating layer, first and second bit lines, placed on the drain regions, to form capacitor contact holes; forming a conductive layer and interlevel insulating layer on the overall surface of the substrate including the capacitor contact holes, and patterning them to be left only on regions where capacitors will be formed; and forming another conductive layer on the overall surface of the substrate including the patterned interlevel insulating layer, and etching back it, to be left on the sides of the patterned interlevel insulating layer in the form of sidewall.

The first shunt split word line and first split word line come into contact with each other at a predetermined point of a peripheral circuit region around a cell array, to receive the same signal, and the second shunt split word line and second split word line come into contact with each other at a predetermined point of the peripheral circuit region around the cell array, to receive the same signal. Each first capacitor electrode connected to the drain region of each of the first and second active regions has a flat shape, not having the cylindrical portion.

The objects of the present invention can be achieved in a whole or in parts by a nonvolatile ferroelectric memory device, comprising: first and second split word lines parallel with each other; first and second shunt split word lines branched from the first and second split word lines respectively; a first transistor whose gate is connected to the first split word line; a second transistor whose gate is connected to the second split word line; a bit line connected to one electrode of the first transistor and arranged perpendicular to the first and second split word lines; a bit line connected to one electrode of the second transistor, arranged parallel with the bit line and perpendicular to the first and second split word lines; a first lower ferroelectric capacitor one electrode of the first lower ferroelectric capacitor being connected to the other electrode of the first transistor, the other electrode of the first lower ferroelectric capacitor being connected to the second split word line; a first upper ferroelectric capacitor, one electrode of the first upper ferroelectric capacitor being connected to the other electrode of the first transistor, the other electrode of the first upper ferroelectric capacitor being connected to the second shunt split word line; a second lower ferroelectric capacitor, one electrode of the second lower ferroelectric capacitor being connected to the other electrode of the second transistor, the other electrode of the second lower ferroelectric capacitor being connected to the first split word line; and a second upper ferroelectric capacitor, one electrode of the second upper ferroelectric capacitor being connected to the other electrode of the second transistor, the other electrode of the second upper ferroelectric capacitor being connected to the first shunt split word line.

The present invention can be achieved in a whole or in parts by a nonvolatile ferroelectric memory device, comprising: first and second split word lines formed over first and second active regions of a semiconductor substrate, isolated from each other, the first and second split word lines being arranged in the first direction; source and drain regions formed in the first active region placed on both sides of the first split word line and second active region placed on both sides of the second split word line; a conductive barrier layer, first capacitor electrode layer and first ferroelectric layer sequentially formed on the first and second split word lines; a second capacitor electrode formed over the first split word line and connected to one of the source and drain regions of the second active region, and another second capacitor electrode formed over the second split word line and connected to one of the source and drain regions of the first active region; a second ferroelectric layer formed on the second capacitor electrodes; a first shunt split word line formed over the first split word line and connected to the second capacitor electrode on the second active region, and second shunt split word line formed over the second split word line and connected to the second capacitor electrode on the first active region; and first and second bit lines arranged perpendicular to the first and second split word lines, the first bit line being connected to one of the source and drain regions of the first active region, the second bit line being connected to one of the source and drain regions of the second active region.

The present invention can be achieved in a whole or in parts by a method of fabricating a nonvolatile ferroelectric memory device, comprising the steps of: sequentially forming a gate oxide layer, polysilicon layer for forming gates and word lines, conductive barrier layer and first capacitor electrode layer on a semiconductor substrate having first and second active regions isolated from each other by an isolation layer; selectively etching the stacked layers, to form first and second split word lines across the first and second active regions; forming source and drain regions in exposed portions of the first and second active regions using the first and second split word lines as a mask, and sequentially forming a first oxide layer and planarizing insulation layer on the overall surface of the substrate; improving viscosity of the planarizing insulation layer through heat treatment, removing the planarizing insulation layer by a predetermined thickness using etchback process, to expose the first capacitor electrode 95, and forming a first ferroelectric layer and second capacitor electrode layer on the overall surface of the substrate; patterning the second capacitor electrode layer and forming a second oxide layer on the overall surface of the substrate; forming contact holes to expose the drain regions of the first and second active regions, forming a contact plug which comes into contact with the drain region of the first active region and second capacitor electrode layer placed over the second split word line through one of the contact hole, and forming another contact plug which comes into contact with the drain region of the second active region and second capacitor electrode layer placed over the first split word line through the other contact hole; forming a second ferroelectric layer on the overall surface of the substrate including the contact plug, forming a first shunt split word line over the first split word line, being connected to the second capacitor electrode on the second active region, and forming a second shunt split word line over the second split word line, being connected to the second capacitor electrode on the first active region; and forming a third oxide layer on the overall surface of the substrate, forming contact holes to expose the source regions of the first and second active regions, and forming first and second bit lines perpendicular to the first and second split word lines, the first and second bit lines coming into contact with the source regions through the contact holes.

The first split word line, first capacitor electrode, placed over the first split word line, and first shunt split word line are connected to one another at a predetermined portion of a peripheral circuit region, and the second split word line, first capacitor electrode, placed over the second split word line, and second shunt split word line are connected to one another at a predetermined portion of the peripheral circuit region.

The planarizing insulation layer for filling the space between the first and second split word lines is formed of SOG or BPSG. The heat treatment is carried out to the planarizing insulation layer at a temperature of 800 to 900° C., to shrink its volume by 20 to 30%, improving its viscosity.

The contact plugs are formed in such a manner that portions of the second oxide layer, ferroelectric layer, planarizing insulation layer and first oxide layer, placed on the drain regions of the first and second active regions, are selectively removed, to form the contact holes, simultaneously, to expose a portion of the second capacitor electrode, and a material for forming the contact plugs is deposited to completely fill the contact holes and patterned so as to come into contact with the drain regions and second capacitor electrode. The contact holes for exposing the source regions of the first and second active regions are formed in such a manner that the third oxide layer is formed on the overall surface of the substrate including the contact plugs, and portions of the third oxide layer, second oxide layer, second ferroelectric layer, first ferroelectric layer, planarizing insulation layer and first oxide layer, placed on the source regions, are selectively removed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 9a to 9p illustrate layouts and fabrication steps of the ferroelectric memory according to a first preferred embodiment of the present invention;

FIGS. 12a to 12i illustrate alternative layouts and fabrication steps of the ferroelectric memory according to a second preferred embodiment of the present invention;

FIGS. 13a to 13i illustrate alternative layouts and fabrication steps of the ferroelectric memory according to a second preferred embodiment of the present invention;

DETAILED DESCRIPTION OF PREFERRED EMBODIMENTS

Figure 1:
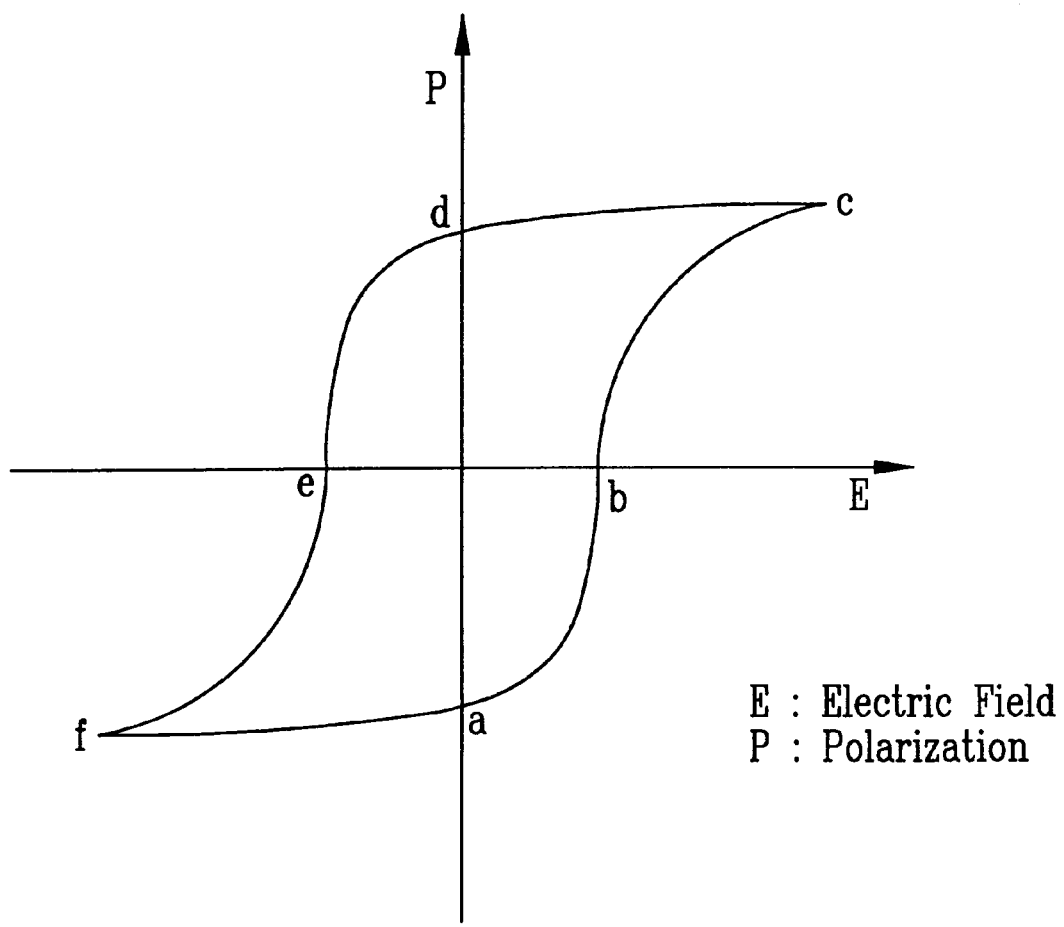
FIG. 1 is a characteristic diagram illustrating hysteresis loop of a conventional ferroelectric.
Figure 2:
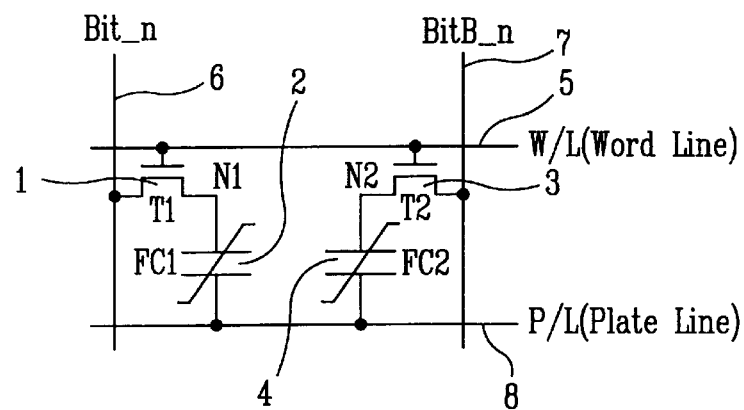
FIG. 2 illustrates the configuration of the unit cell of a conventional ferroelectric memory device.
Figure 3:
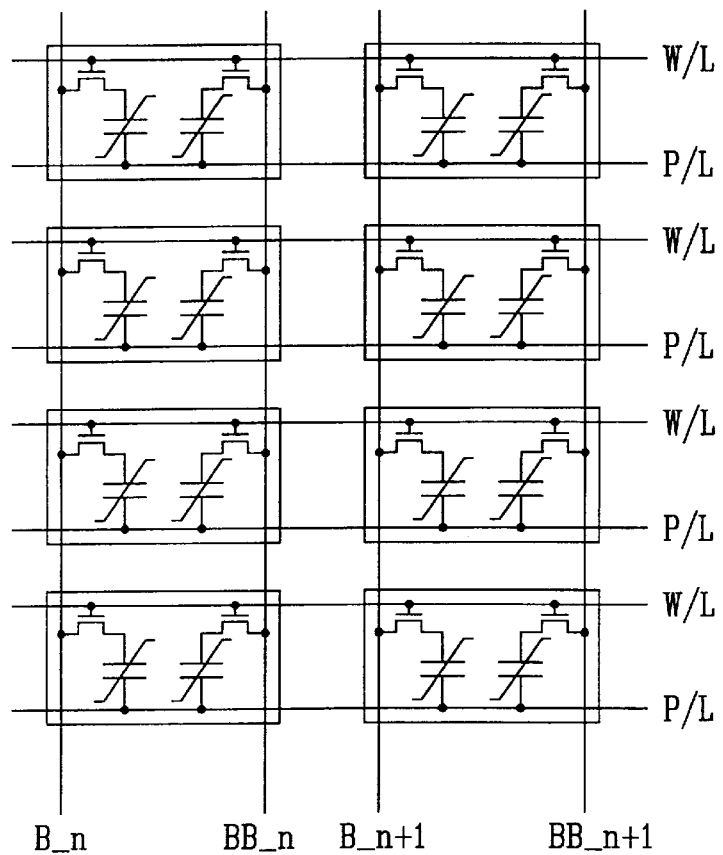
FIG. 3 illustrates the configuration of the cell array of the conventional ferroelectric memory device.
Figure 4:
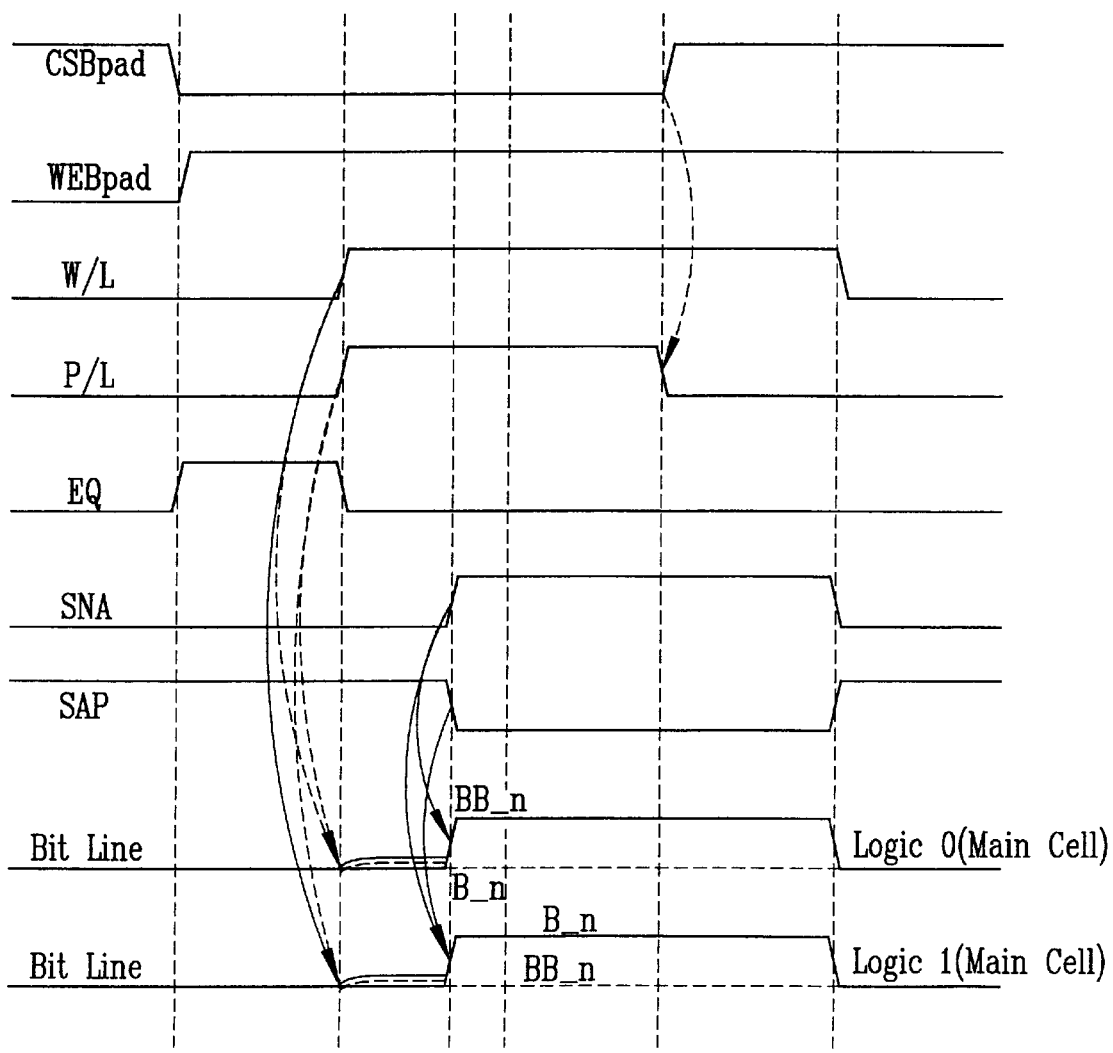
FIG. 4 illustrates operation waveforms of the conventional ferroelectric memory device.
Figure 5:
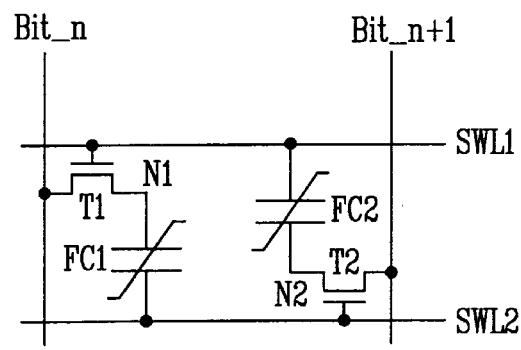
FIG. 5 illustrates the configuration of the unit cell of a ferroelectric memory device according to a preferred embodiment of the present invention.
Figure 6:
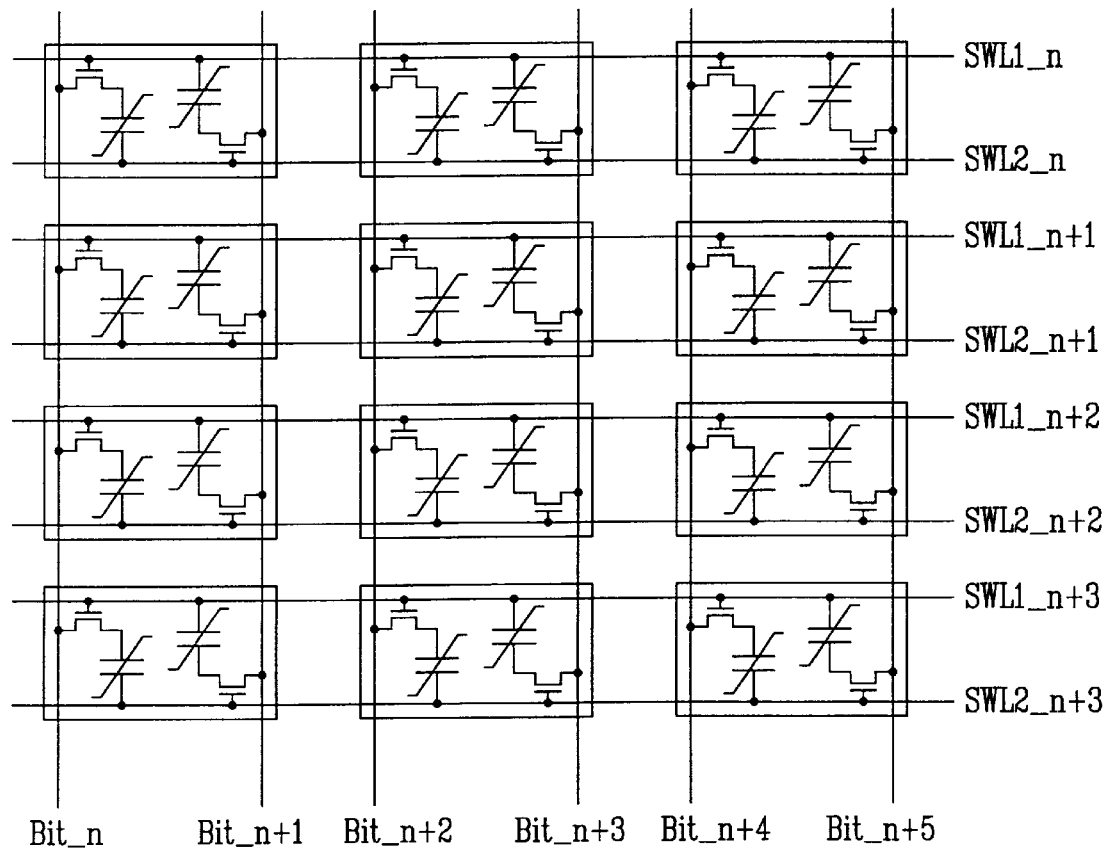
FIG. 6 illustrates the configuration of the cell array of the ferroelectric memory device according to a preferred embodiment of the present invention.
Figure 7:
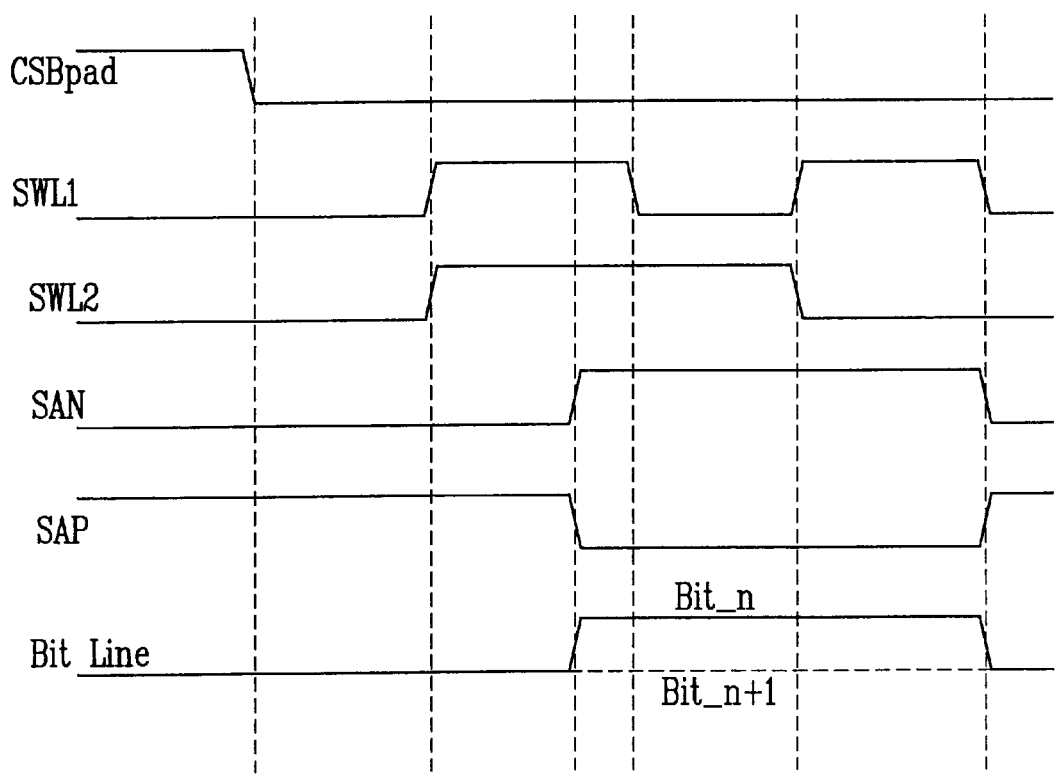
FIG. 7 illustrates operation waveforms of the ferroelectric memory device according to a preferred embodiment of the present invention.

FIG. 5 illustrates the configuration of a unit cell of a ferroelectric memory device, e.g., nonvolatile, according to a preferred embodiment of the present invention. FIG. 6 illustrates the configuration of the cell array of the ferroelectric memory device according to a preferred embodiment of the present invention. FIG. 7 illustrates operation waveforms of the ferroelectric memory device according to a preferred embodiment of the present invention.

First of all, there will be explained below the structure of unit cell of a ferroelectric memory device without a separate cell plate line according to a preferred embodiment of the present invention. Referring to FIG. 5, two pieces of data per unit memory cell can be stored. A pair of word lines SWL1 and SWL2 corresponds to one row, and a pair of bit lines Bit_n and Bit_n+1 forms two columns.

First and second split word lines SWL1 and SWL2 are arranged in parallel. A first transistor T1 of a unit cell includes a gate connected to a first split word line SWL1, and a second transistor T2 includes a gate connected to a second split word line SWL2. A bit line Bit_n, which is arranged perpendicular to first and second split word lines SWL1 and SWL2, is connected to an electrode of the first transistor T1, and a bit line Bit_n+1 which is arranged in parallel with the bit line Bit_n and perpendicular to the first and second split word lines SWL1 and SWL2, is connected to an electrode of second transistor T2.

A first ferroelectric capacitor FC1 includes a second electrode connected to the source electrode of first transistor T1, and a first electrode connected to the second split word line SWL2. A second ferroelectric capacitor FC2 includes a second electrode connected to the source electrode of the second transistor T2, and a first electrode connected to the first split word line SWL1. The unit cell is repeatedly arranged in row and column direction to construct the cell array shown in FIG. 6.

The data input/output operation of the FRAM of the preferred embodiment is described with reference to FIG. 7. In a write mode, a binary logic "0" is stored in the first and second ferroelectric capacitors FC1 and FC2 from a level "LOW" applied to the bit lines Bit_n and Bit_n+1 when the driving signals SWLS1 and SWLS2 for the first and second split word lines SWL1 and SWL2 are in a level "HIGH." A binary logic "1" is stored in the first and second ferroelectric capacitors FC1 and FC2 from a level "HIGH" applied to a corresponding bit line when only one of the driving signals SWLS1 and SWLS2 is in a level "HIGH".

In a read mode, the data stored in the first and second ferroelectric capacitors FC1 and FC2 is loaded on the bit lines Bit_n and Bit_n+1. If a logic "0" is stored in the first ferroelectric capacitor FC1 and a logic "1" is stored in the second ferroelectric capacitor FC2, the voltage applied to the bit line Bit_n rises less than the voltage applied to bit line Bit_n+1. When the logic "1" is stored in the second ferroelectric capacitor FC2, a lot of residual polarization charges are loaded on bit line Bit_n+1 while the logic "1" is changed into logic "0", to increase the voltage applied to bit line Bit_n+1. Accordingly, the data needs to be restored in the second ferroelectric capacitor FC2, where the logic "1" is changed into the logic "0", i.e., the occurrence of a polarization destruction.

A "LOW" signal is applied to the first split word line SWL1 and a "HIGH" signal is applied to the second split word line SWL2 to restore the logic "1" in second ferroelectric capacitor FC2. Thus, a level "HIGH" data of the bit line Bit_n+1 applies a "HIGH" voltage to the second electrode of the second ferroelectric capacitor FC2 according to the signal SWLS2 through the second transistor T2 turned on, and applies a "LOW" voltage to the first electrode of second ferroelectric capacitor FC2, which serves as the reference electrode according to signal SWLS1, restore the logic "1" in the second ferroelectric capacitor FC2.

On the other hand, when the logic "1" is stored in the first ferroelectric capacitor FC1 and the logic "0" is stored in the second ferroelectric capacitor FC2, the logic "1" of the first ferroelectric capacitor FC1 is changed into a logic "0" when both of the driving signals SWLS1 and SWLS2 for the first and second split word lines SWL1 and SWL2 remain at a level "HIGH", destroying the data stored. To restore the logic "1" destroyed in the first ferroelectric capacitor FC1, a "HIGH" signal is applied to the first split word line SWL1 and a "LOW" signal is applied to the second split word line SWL2.

By doing so, a level "HIGH" data of the bit line Bit_n applies a "HIGH" voltage to the second electrode of the first ferroelectric capacitor FC1 according to the signal SWLS1 through the first transistor T1 turned on, and applies a "LOW" voltage to the first electrode of the first ferroelectric capacitor FC1, which serves as the reference electrode according to signal SWLS2, to restore the logic "1" in the first ferroelectric capacitor FC1.

The storage of logic "1" in writing mode is similar to that in reading mode. In other words, the driving signal SWLS1 has a "HIGH" level and the driving signal SWLS2 has a "LOW" level so as to store the logic "1" in the first ferroelectric capacitor FC1. To store the logic "1" in the second ferroelectric capacitor FC2, the driving signal SWLS1 has a "LOW" level and the driving signal SWLS2 has a "HIGH" level.

In the FRAM with the split word lines which operates as above in writing and reading modes, the split word lines SWL1 and SWL2 are connected as a pair to a word line driver and this pair of split word lines is repeatedly arranged to accomplish the cell array. With the cell array having the split word lines, the two word lines SWL1 and SWL2 are enabled simultaneously. The word lines SWL1_n and SWL2_n form one pair and the word lines SWL1_n+1 and SWL2_n+1 form another pair.

Figure 8:
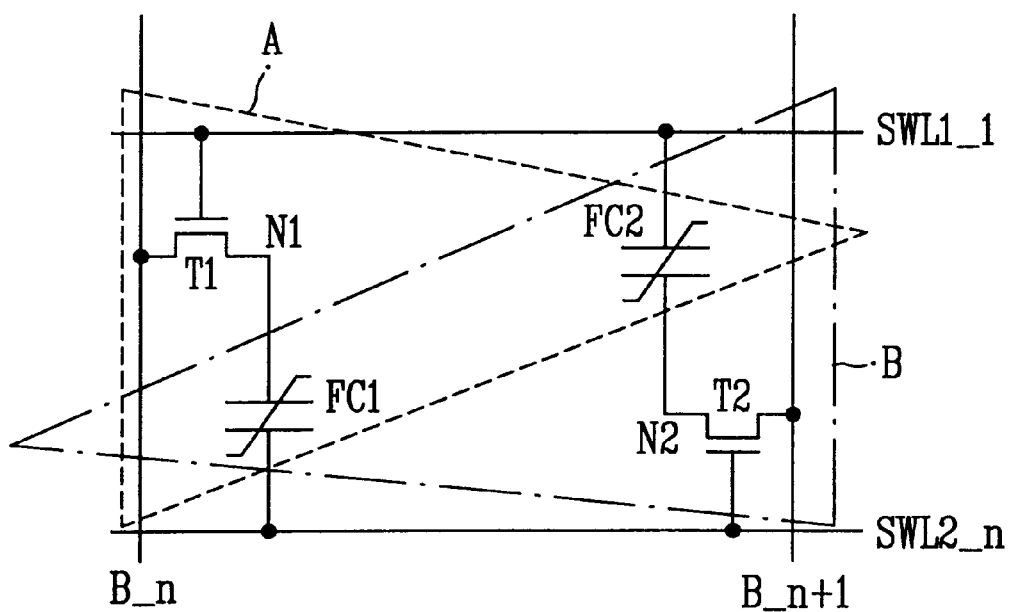
FIG. 8 illustrates an example of block division of the ferroelectric memory layout according to a first preferred embodiment of the present invention.

The following is a description related to the layouts and fabrication steps of the cell array having the split word lines according to the preferred embodiment of the present invention. FIG. 8 illustrates an example of a block division layout of the ferroelectric memory according to the first preferred embodiment of the present invention.

In the first preferred embodiment of the present invention, each unit SWL (split word line) cell (a basic unit for storing two pieces of data) is defined as blocks A and B. The unit SWL cell is formed over adjacent two active regions (block A and block B) isolated from each other by an isolation layer. The layout block A includes the first transistor T1, the first ferroelectric capacitor FC1, the second ferroelectric capacitor FC2, the bit line Bit_n and the first node 1 (N1), and the layout block B includes the second transistor T2, the first ferroelectric capacitor FC1, the second ferroelectric capacitor FC2, bit line Bit_n +1 and the second node 2 (N2).

The cross sections for the method steps of the ferroelectric memory device having the above-described layout structure according to the first preferred embodiment of the present invention are illustrated in FIGS. 9a to 9p. A semiconductor substrate 90 having active regions is defined by an isolation layer 91 formed on an isolation region. First and second split word lines 93a and 93b are isolated from the substrate by a gate oxide layer 92 and formed over the active regions in the first direction. Source and drain regions 96 are formed in portions of the semiconductor substrate 90, and are placed on both sides of each of first and second split word lines 93a and 93b. A conductive barrier layer 94 is deposited on the first and second split word lines 93a and 93b, having the same size as the split word lines, prior to forming a first capacitor electrode 95.

A first oxide layer 97a is formed on a portion of the side of the first capacitor electrode 95. A planarizing insulation layer 98 is buried between the first and second split word lines 93a and 93b and has the same height as the first oxide layer 97a. A ferroelectric layer 99 is formed on the first capacitor electrode 95. A second capacitor electrode 100a is formed, and a contact plug 102 comes into contact with the second capacitor electrode 100a and one of the source and drain regions 96. First and second bit lines 104a and 104b are isolated from their neighboring layers by the second and third oxide layers 97b and 97c which are arranged over the active regions in the second direction, and come into contact with the other source and drain regions 96.

As described above, one unit SWL cell is constructed in such a manner that one active region includes ferroelectric capacitor FC2 whose electrodes are connected to transistor T1 and transistor T2, and neighboring active region includes ferroelectric capacitor FC1 whose electrodes are connected to transistor T2 and transistor T1. Ferroelectric capacitors FC1 and FC2 have the same configuration, and are arranged symmetrically.

When the semiconductor substrate 91 is divided into rectangular blocks with longer and shorter sides, and among the neighboring four blocks placed at a certain region, the first, second, third and fourth clockwise blocks are respectively referred to as a first block A, a first block B, a second block A and a second block B. This four-block structure is repeated in the substrate. One active region is formed for the first block A and the second block A, which are arranged in a diagonal direction. An active region is formed for the first block B horizontally located next to the first block A, and the second block B is vertically located next to the first block A. The first and second two blocks B are arranged in a diagonal direction.

One SWL unit cell is constructed in such a manner that two transistors are respectively formed on the active region of the first block A and active region of the first block B horizontally located next to the first block A, and two ferroelectric capacitors are also formed on the two active regions respectively. A first direction is perpendicular to the longer sides of the blocks A and B, and a second direction is parallel to the longer sides of the blocks A and B.

A method of fabricating the ferroelectric memory device according to the first preferred embodiment of the present invention is described with reference to FIGS. 9a to 9p. Referring to FIG. 9a, an isolation layer 91 is formed on a predetermined portion of semiconductor substrate 90 through a field oxidation process, to define the active regions on which cell transistors and ferroelectric capacitors will be formed.

Referring to FIG. 9b, in order to form the first and second split word lines SWL1 and SWL2 constructing one SWL unit cell, a gate oxide layer 92, a polysilicon layer 93 for forming the gates and word lines, a conductive barrier layer 94 and a first capacitor electrode layer 95 are sequentially formed on the overall surface of semiconductor substrate 90 including the active regions. The stacked layers are patterned through photolithography, to form the first and second split word lines 93a and 93b.

The conductive barrier layer 94 may be oxidized by subsequent heat treatment, resulting in a material layer with a high resistance. To prevent this, the patterned first capacitor electrode 95 and the polysilicon layer 93 for forming the gates and word lines come into contact with each other on a portion of a peripheral circuit region. The first capacitor electrode 95 is preferably formed of a metal, preferably Pt.

Referring to FIG. 9c, N+ impurities are implanted into exposed active regions using the patterned first and second split word lines 93a and 93b as a mask, and a heat treatment is performed to form the source and drain regions 96. Referring to FIG. 9d, a first thin oxide layer 97a is formed on the overall surface of the substrate on which first and second split word lines 93a and 93b are formed. Referring to FIG. 9e, a planarizing insulation layer 98 is formed on the first thin oxide layer 97a, which fills the areas between the first and second split word lines 93a and 93b. The planarizing insulation layer 98 may be formed of SOG or BPSG.

Referring to FIG. 9b, in order to form the first and second split word lines SWL1 and SWL2 constructing one SWL unit cell, a gate oxide layer 92, a polysilicon layer 93 for forming the gates and word lines, a conductive barrier layer 94 and a first capacitor electrode layer 95 are sequentially formed on the overall surface of semiconductor substrate 90 including the active regions. The stacked layers are patterned through photolithography, to form the first and second split word lines 93a and 93b.

The conductive barrier layer 94 may be oxidized by subsequent heat treatment, resulting in a material layer with a high resistance. To prevent this, the patterned first capacitor electrode 95 and the polysilicon layer 93 for forming the gates and word lines come into contact with each other on a portion of a peripheral circuit region. The first capacitor electrode 95 is preferably formed of a metal, preferably Pt.

Referring to FIG. 9c, N+ impurities are implanted into exposed active regions using the patterned first and second split word lines 93a and 93b as a mask, and a heat treatment is performed to form the source and drain regions 96. Referring to FIG. 9d, a first thin oxide layer 97a is formed on the overall surface of the substrate on which first and second split word lines 93a and 93b are formed. Referring to FIG. 9e, a planarizing insulation layer 98 is formed on the first thin oxide layer 97a, which fills the areas between the first and second split word lines 93a and 93b. The planarizing insulation layer 98 may be formed of SOG or BPSG.

Referring to FIGS. 9f and 9g, when planarizing insulation layer 98 is formed of SOG, it is heat-treated at 800 to 900° C. to shrink its volume by 20 to 30%. By doing so, the SOG is prevented from flowing during subsequent heat cycles, thereby preventing deterioration of the device. After improving the viscosity of the planarizing insulation layer 98, it is removed by a predetermined thickness by an etchback process. Here, a portion of the first oxide layer 97a, placed on the first capacitor electrode 95, is also removed to expose the first capacitor electrode 95.

Referring to FIG. 9h, a ferroelectric layer 99 is formed on the overall surface of the substrate including the exposed first capacitor electrode 95. Referring to FIG. 9i, a metal, such as Pt, is deposited on the ferroelectric layer 99 to form the second capacitor electrode layer 100. Referring to FIG. 9j, the second capacitor electrode layer 100 is patterned to form a second capacitor electrode 100a, serving as the capacitor plate electrode.

Referring to FIG. 9k, a second oxide layer 97b is formed on the overall surface of the substrate including the second capacitor electrode 100a. Referring to FIG. 9l, portions of the second oxide layer 97b, the ferroelectric layer 99, the planarizing insulation layer 98 and the first oxide layer 97a, which are placed on one of the source and drain regions formed on both sides of first and second split word lines 93a and 93b, are selectively removed, thereby forming a contact hole 101.

Referring to FIG. 9m, a contact plug 102 is formed to fill the contact hole 101. Referring to FIG. 9n, a third oxide layer 97c is formed on the overall surface of the substrate including the contact plug 102. Referring to FIG. 9o, portions of the third oxide layer 97c, the second oxide layer 97b, the ferroelectric layer 99, the planarizing insulation layer 98 and the first oxide layer 97a, which are placed on the other source and drain regions formed on both sides of the first and second split word lines 93a and 93b, are selectively removed, thereby forming a contact hole 103 for allowing the bit line to come into contact with the other electrode of the cell transistor. Referring to FIG. 9p, a metal for forming the bit line is deposited on the overall surface of the substrate including the contact hole 103 and patterned, to form the first and second bit lines 104a and 104b perpendicular to the first and second split word lines 93a and 93b.

FIGS. 10a–10q illustrate another plan and cross section view of the ferroelectric memory having the block layout layer structure of FIG. 8 according to the first preferred embodiment of the present invention. As illustrated in FIG. 10q, which is the final semiconductor layout, a semiconductor substrate 90 has the active regions defined by an isolation layer 91 formed on an isolation region. First and second split word lines 93a and 93b are isolated from the substrate by a gate oxide layer 92 and are formed over the active region in the first direction.

Source and drain regions 96 are formed in portions of semiconductor substrate 90 and are placed on both sides of first and second split word lines 93a and 93b. A conductive barrier layer 94 is deposited on the first and second split word lines 93a and 93b, and has the same size as the split word lines. A first capacitor electrode 95, a first oxide layer 97a formed on a portion of the side of first capacitor electrode 95 and semiconductor substrate 90, and ferroelectric layer 99 are formed on first capacitor electrode 95 and a second capacitor electrode 100a.

A conductive connection layer 102a comes into contact with a second capacitor electrode 100a and one of source and drain regions 96. A first and second bit lines 104a and 104b, which are isolated from their neighboring layers by second and third oxide layers 97b and 97c and are arranged over the active region in the second direction, come into contact with the other source and drain regions 96. A third oxide layer 97c is formed sufficiently thick so as to bury the space between first and second split word lines 93a and 93b, improving flatness of the substrate.

One unit SWL cell is constructed in such a manner that one active region includes the ferroelectric capacitor FC2 whose electrodes are connected to the transistors T1 and T2, and neighboring active region includes the ferroelectric capacitor FC1 whose electrodes are connected to the transistors T2 and T1. Ferroelectric capacitors FC1 and FC2 have the same configuration, being arranged symmetrically.

When the semiconductor substrate 91 is divided into rectangular blocks with longer and shorter sides, and the neighboring four blocks placed at a certain region, the first, second, third and fourth blocks, clockwise, are respectively referred to as first block A, first block B, second block A and second block B. This four-block structure is repeated in the substrate with one active region formed over adjacent first block A and the second block A, which are arranged in diagonal direction. The adjacent active region is formed on the first block B horizontally located next to the first block A, and the second block B is vertically located next to the second block A. These first and blocks B are arranged diagonally from each other. The first direction is perpendicular to the longer sides of the blocks A and B, and second direction is parallel with the longer sides of the blocks A and B.

FIGS. 10a to 10q illustrate the method according to a second preferred embodiment of the present invention. Referring to FIG. 10a, an isolation layer 91 is formed on a predetermined portion of semiconductor substrate 90 through a field oxidation process to define the active regions on which cell transistors and ferroelectric capacitors will be formed. Referring to FIG. 10b, in order to form the first and second split word lines SWL1 and SWL2 constructing one SWL unit cell, a gate oxide layer 92, a conductive material layer 93 for forming the gates and word lines, a conductive barrier layer 94 and a first capacitor electrode layer 95 are sequentially formed on the overall surface of semiconductor substrate 90 including the active regions.

The stacked layers are patterned through photolithography to form the first and second split word lines 93a and 93b. The conductive barrier layer 94 may be oxidized by a subsequent heat treatment, to be changed into a material layer with a high resistance. To prevent this, the patterned first capacitor electrode 95 and the conductive material layer 93 for forming the gates and word lines come into contact with each other on a portion of the peripheral circuit region. The first capacitor electrode 95 is preferably formed of a metal like Pt.

Referring to FIG. 10c, N+ impurities are implanted into the exposed active regions using the patterned first and second split word lines 93a and 93b as a mask, and heat treated to form the source and drain regions 96. Referring to FIG. 10d, a first thin oxide layer 97a is formed on the overall surface of the substrate on which the first and second split word lines 93a and 93b are formed. Referring to FIG. 10e, a photoresist layer 98a is formed on the first thin oxide layer 97a to fill the area between the first and second split word lines 93a and 93b.

Referring to FIGS. 10f and 10g, a photoresist layer 98a is removed by a predetermined thickness by an etchback process, and a portion of the first oxide layer 98a, which is placed on first capacitor electrode 95 is etched back, to expose first capacitor electrode 95. The photoresist layer 98a is then removed, as shown in FIG. 10h. Referring to FIG. 10i, a ferroelectric layer 99 is formed on the overall surface of the substrate including the exposed first capacitor electrode 95. Referring to FIG. 10j, a metal layer, such as Pt, is deposited on the ferroelectric layer 99 to form a second capacitor electrode layer 100.

Referring to FIG. 10k, the second capacitor electrode layer 100 is patterned to form a second capacitor electrode 100a serving as the capacitor plate electrode. Referring to FIG. 10l, a second oxide layer 97b is formed on the overall surface of the substrate including the second capacitor electrode 100a. Referring to FIG. 10m, portions of the second oxide layer 97b, the ferroelectric layer 99 and the first oxide layer 97a, placed on one of the source and drain regions formed on both sides of first and second split word lines 93a and 93b, are selectively removed, thereby forming a contact hole 101 for allowing one electrode of the capacitor to come into contact with one electrode of the cell transistor.

Figure 10O:
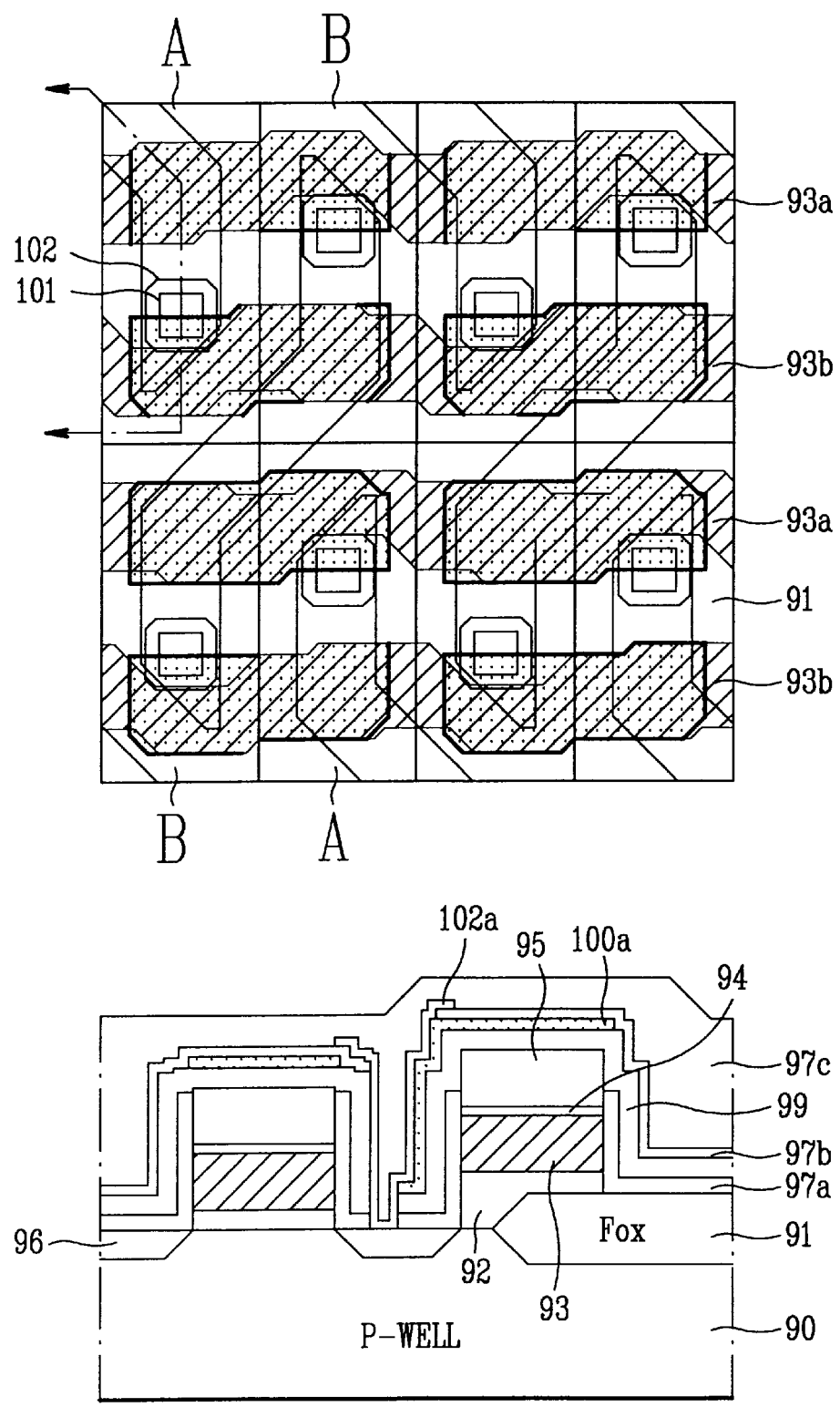
FIGS. 10a to 10q illustrate alternative layouts and fabrication steps of the ferroelectric memory according to the first preferred embodiment of the present invention.

Referring to FIG. 10n, a conductive connection layer 102a is formed on the inner wall of the contact hole 101 and on a portion of second oxide layer 97b. Referring to FIG. 10o, a third oxide layer 97c is formed with a sufficient thickness on the overall surface of the substrate including the conductive connection line 102a, fill the area between the first and second split word lines 93a and 93b.

Referring to FIG. 10p, portions of the third oxide layer 97c, the second oxide layer 97b, the ferroelectric layer 99 and the first oxide layer 97a, which are placed on the other source and drain regions formed on both sides of the first and second split word lines 93a and 93b, are selectively removed, thereby forming a contact hole 103 for allowing a bit line to come into contact with the other electrode of the cell transistor. Referring to FIG. 10q, a metal layer is deposited on the overall surface of the substrate including the contact hole 103 and patterned, to form first and second bit lines 104a and 104b perpendicular to the first and second split word lines 93a and 93b.

Figure 11:
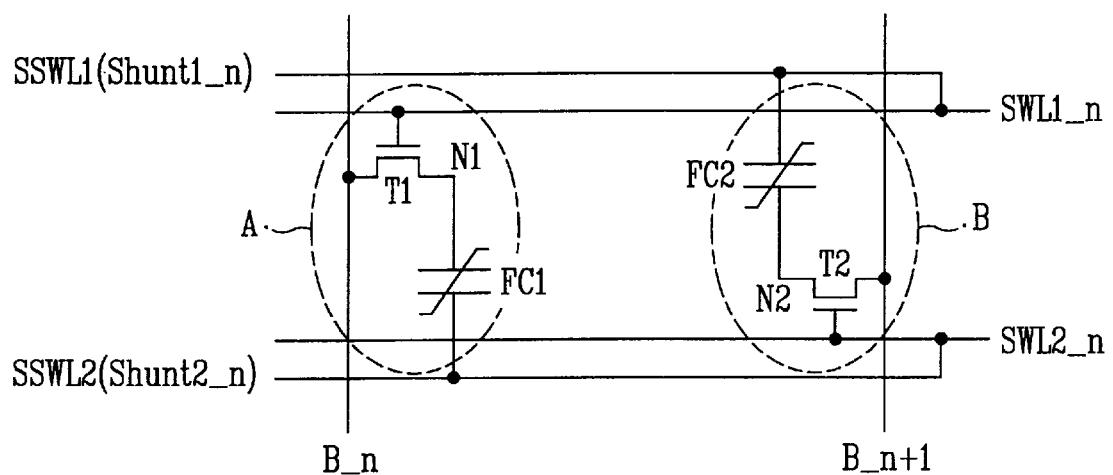
FIG. 11 illustrates an alternative block division of the ferroelectric memory layout according to a second preferred embodiment of the present invention.

FIG. 11 illustrates another example of a block layout of the ferroelectric memory device according to the second preferred embodiment of the present invention. Shunt split word lines SSWL1 and SSWL2, each of which is connected to one capacitor of each ferroelectric capacitor, are added to split word lines SWL1 and SWL2. Two pieces of data can be stored per unit SWL memory cell, where a pair of split word lines SWL1 and SWL2 including the shunt split word lines SSWL1 and SSWL2 corresponds to one row, and a pair of bit lines Bit_n and Bit_n+1 comprises two columns.

The unit SWL memory cell includes the first and second split word lines SWL1 and SWL2 arranged parallel with each other, and the first and second shunt split word lines SSWL1 and SSWL2 branching from the first and second split word lines SWL1 and SWL2 respectively. A first transistor T1 includes a gate connected to the first split word line SWL1, and a second transistor T2 includes a gate connected to the second split word line SWL2.

A bit line Bit_n is connected to one electrode, e.g., drain, of the first transistor T1 and the bit line Bit_n is arranged perpendicular to the first and second split word lines SWL1 and SWL2. A bit line Bit_n+1 is connected to one electrode, e.g., drain, of the second transistor T2, and is arranged parallel with the bit line Bit_n and perpendicular to the first and second split word lines SWL1 and SWL2.

A first ferroelectric capacitor FC1 includes a second electrode connected to the other electrode, e.g., source, of the first transistor T1, and the first electrode connected to the second shunt split word line SSWL2. A second ferroelectric capacitor FC2 includes a second electrode connected to the other electrode, e.g., source, of the second transistor T2, and a first electrode connected to the first shunt split word line SSWL1.

In this second preferred embodiment of the present invention, the unit SWL cell (the basic unit for storing two pieces of data) is formed over an area covering two blocks A and B. The block A corresponds to an active region isolated by the isolation layer, and the block B corresponds to the adjacent active region. The block A includes the first transistor T1, the first ferroelectric capacitor FC1, the bit line Bit_n, the node 1 (N1) and the first shunt split word line SSWL1, and the block B includes the second transistor T2, the second ferroelectric capacitor FC2, the bit line Bit_n+1, the node 2 (N2) and the second shunt split word line SSWL2.

Figure 12G:
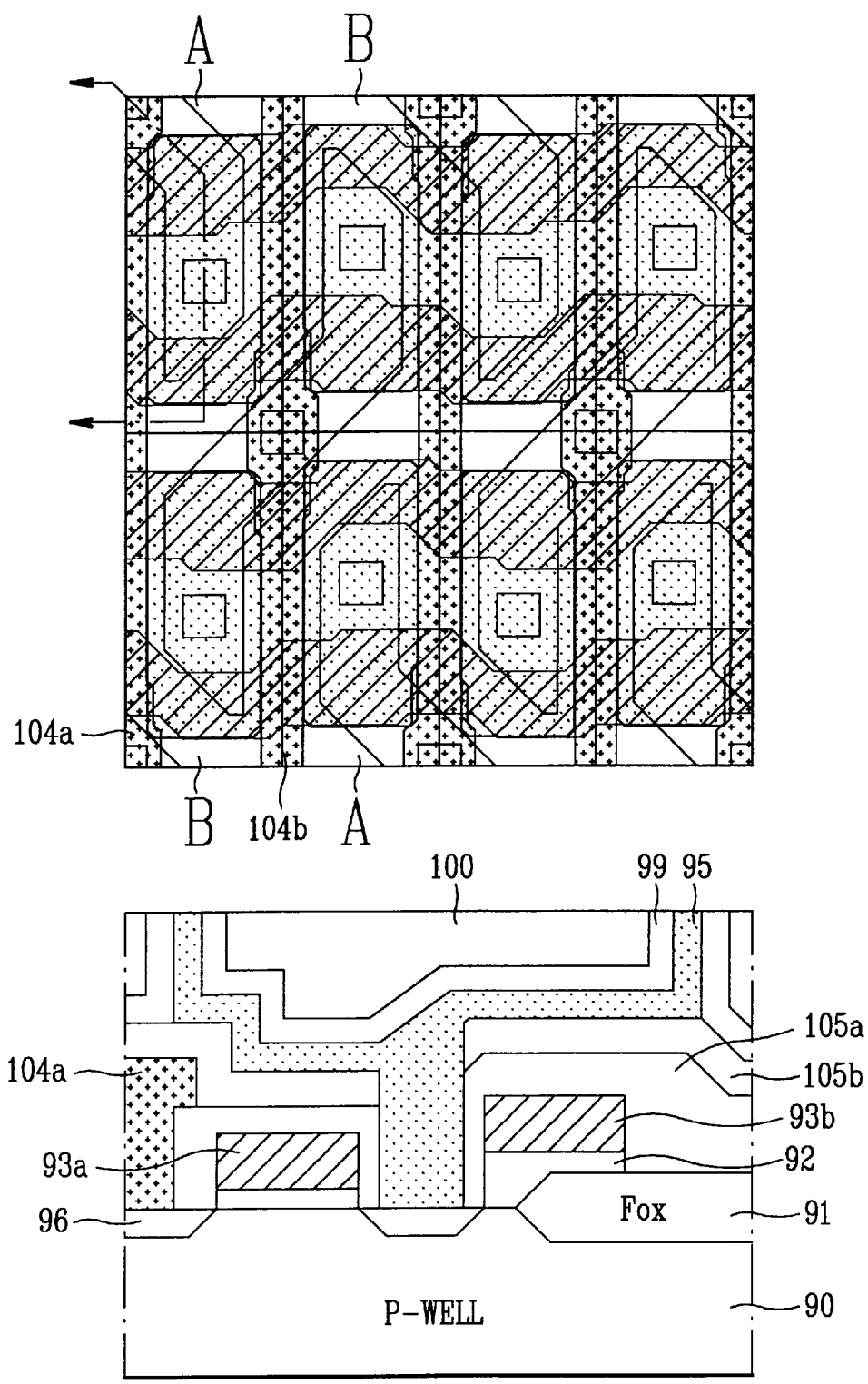

The plan view and cross section of the ferroelectric memory according to the second preferred embodiment of the present invention are illustrated in FIGS. 12a to 12i with reference to FIG. 12i illustrating the resulting device, a semiconductor substrate 90 includes active regions defined by an isolation layer 91 formed on a predetermined isolation region. The first and second split word lines 93a and 93b are isolated from the substrate by a gate oxide layer 92 and are formed over the active regions in the first direction. The source and drain regions 96 are placed on both sides of the first and second split word lines 93a and 93b.

A first interlevel insulating layer 105a is formed on a predetermined region of the substrate other than the regions of the source and drain regions 96. The first and second bit lines 104a and 104b are isolated from neighboring layers by first and second interlevel insulating layers 105a and 105b and are arranged on the active regions in the second direction, which come into contact with one of source and drain regions 96.

A first capacitor electrode 95 is formed over the first and second split word lines 93a and 93b in a cylindrical shape (bottom and cylinder), and comes into contact with the other source and drain regions 96. A ferroelectric layer 99 is formed on the inner wall of the first capacitor electrode 95, and a second capacitor electrode 100 filled in the cylinder of the first capacitor electrode 95 on which ferroelectric layer 99 is formed. The first and second shunt split word lines 109a and 109b are partly isolated from the second capacitor electrode 100 by a third interlevel insulating layer 105c, and come into contact with a predetermined portion of the second capacitor electrode 100.

One unit SWL cell is constructed in such a manner that one active region includes the transistor T1 and the ferroelectric capacitor FC1 having the second electrode connected to the source of the transistor T1, and a neighboring active region includes the transistor T2 and ferroelectric capacitor FC2 having the second electrode connected to the source of the transistor T2. Ferroelectric capacitors FC1 and FC2 have the same configuration, and are arranged symmetrically. The division of the blocks A and B are the same as the previous embodiments.

Referring to FIG. 12a, an isolation layer 91 is formed on a predetermined portion of the semiconductor substrate 90 through field oxidation, to define active regions on which cell transistors and ferroelectric capacitors will be formed. Referring to FIG. 12b, a gate oxide layer 92 and a polysilicon layer for forming gates and word lines are sequentially formed on the overall surface of semiconductor substrate 90, and then patterned through photolithography, to form the first and second split word lines 93a and 93b.

Referring to FIG. 12c, N+ impurities are implanted into exposed active regions using the first and second split word lines 93a and 93b as a mask, and heat treated to form the source and drain regions 96. Referring to FIG. 12d, the first interlevel insulating layer 105a is formed on the overall surface of the substrate on which first and second split word lines 93a and 93b are formed, and a portion of the first interlevel insulating layer, placed on one of source and drain regions 96, is selectively removed, to form a bit line contact hole 106. Referring to FIG. 12e, a metal layer 104 is deposited on the overall surface of the first interlevel insulating layer 105a including the bit line contact hole 106, to be buried in the bit line contact hole 106. Thereafter, the metal layer is patterned to form the first and second bit lines 104a and 104b perpendicular to the first and second split word lines 93a and 93b.

Referring to FIG. 12f, the second interlevel insulating layer 105b is formed on the overall surface of the substrate including the first and second bit lines 104a and 104b. Portions of the second interlevel insulating layer 105b, the first bit line 104a (second bit line 104b in case of block B) and the first interlevel insulating layer 105 are selectively removed to form a capacitor contact hole 107. Referring to FIG. 12g, a conductive layer and an interlevel insulating layer (not shown) are formed on the overall surface of the substrate including capacitor contact hole 107, and then patterned to be left only on regions where the capacitors will be formed.

Another conductive layer is formed on the overall surface of the substrate including the patterned interlevel insulating layer and etched back, to be buried in capacitor contact hole 107 and to be left on the sides of the patterned interlevel insulating layer in the form of sidewall, forming first capacitor electrode 95 in a cylindrical shape. Subsequently, a ferroelectric layer 99 is formed on the overall surface of the substrate on which first capacitor electrode 95 is formed, and second capacitor electrode layer 100 is formed thereon to be buried in the cylinder of the first capacitor electrode 95. Portions of the second capacitor electrode layer 100, the ferroelectric layer 99 and the cylinder-shape first capacitor electrode 95 are removed by a predetermined thickness using CMP process, isolating the capacitors by the unit cell.

Figure 12H:
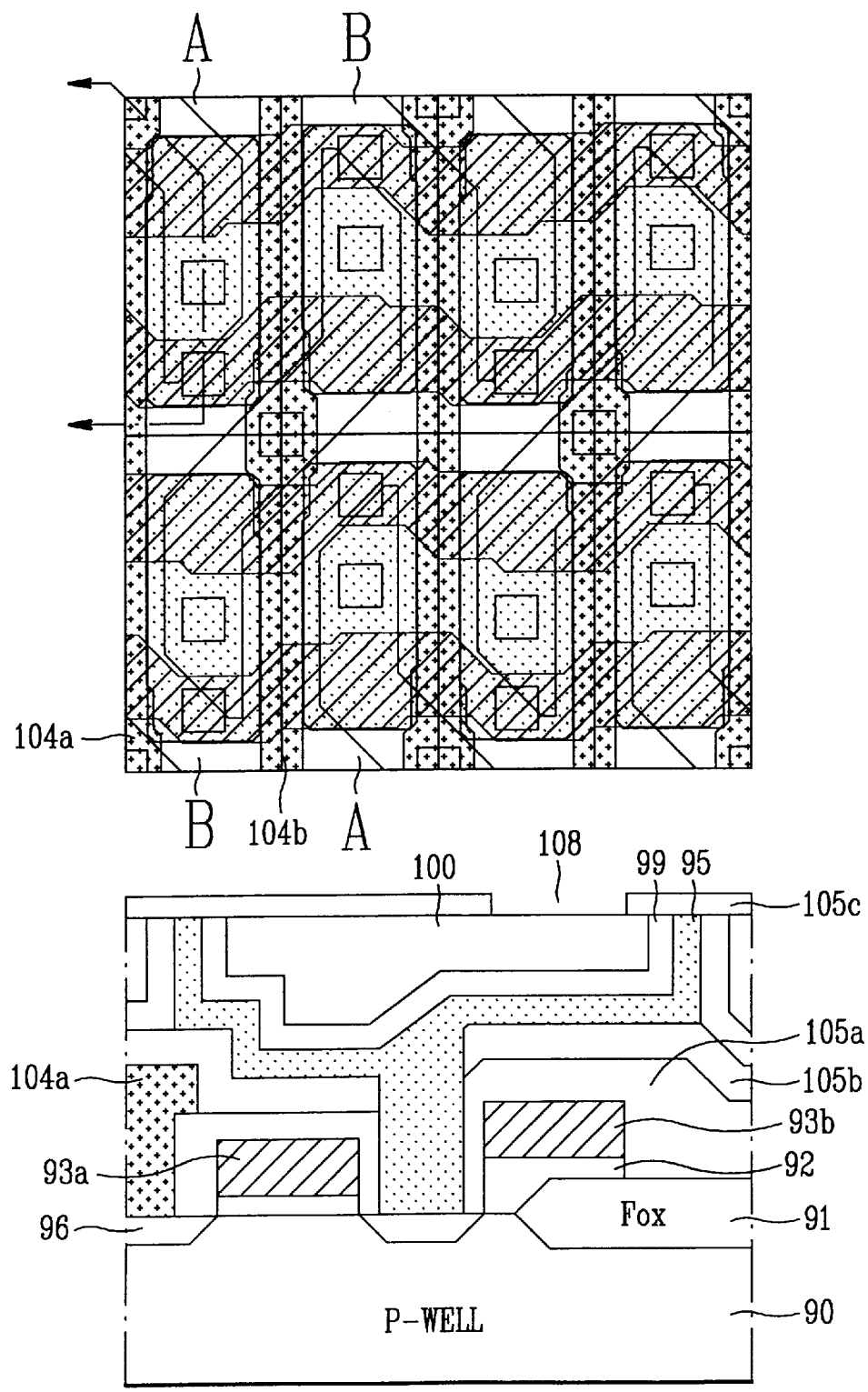

Referring to FIG. 12h, a third interlevel insulating layer 105c is formed on the overall surface of the substrate. A portion of the third interlevel insulating layer 105c, placed on the second capacitor electrode 100, is selectively removed, to form a shunt split word line contact hole 108. Referring to FIG. 12i, a metal layer is formed on the third interlevel insulating layer 105c including shunt split word line contact hole 108, and selectively etched, to form the first and second shunt split word lines 109a and 109b. The first shunt split word line 109a and the first split word line 93a come into contact with each other at a predetermined point of a peripherical region around the cell array, to receive the same signal. Similarly, a second shunt split word line 109b and a second split word line 93b come into contact with each other at a predetermined point of a peripherical region around the cell array, so that the same signal can be applied to the two lines.

Figure 13H:
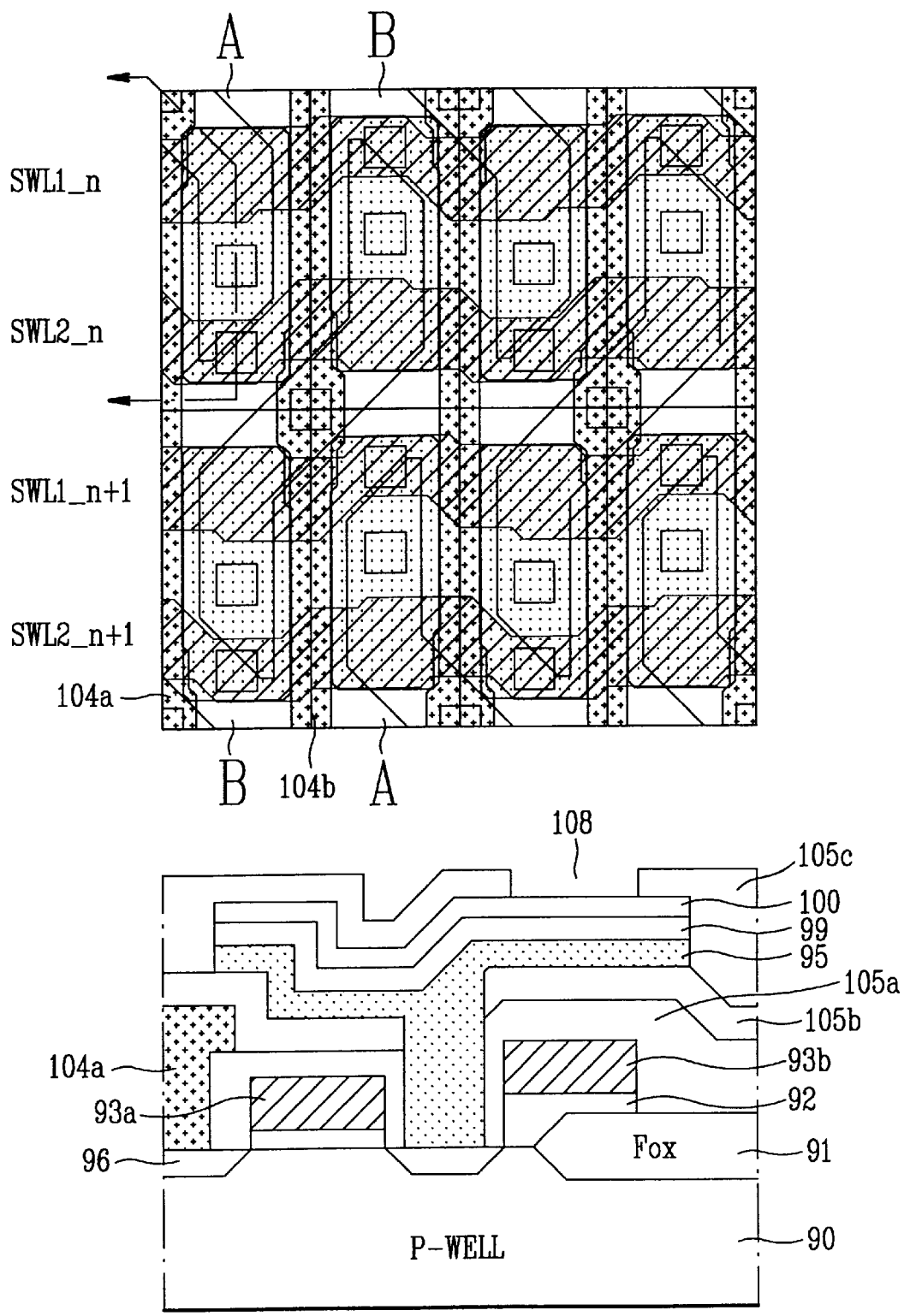

An alternate method of fabricating the ferroelectric memory device with the unit SWL cell configuration of FIG. 11 according to the second preferred embodiment of the present invention is illustrated in FIGS. 13a to 13i. Referring to FIG. 13a, an isolation layer 91 is formed on a predetermined portion of semiconductor substrate 90 through field oxidation to define active regions on which cell transistors and ferroelectric capacitors will be formed. Referring to FIG. 13b, a gate oxide layer 92 and a polysilicon layer for forming the gates and the word lines are sequentially formed on the overall surface of the semiconductor substrate 90, and then patterned through photolithography, to form the first and second split word lines 93a and 93b.

Referring to FIG. 13c, N+ impurities are implanted into the exposed active regions using the first and second split word lines 93a and 93b as a mask, and heat treated to form source and drain regions 96. Referring to FIG. 13d, a first interlevel insulating layer 105a is formed on the overall surface of the substrate on which first and second split word lines 93a and 93b are formed. A portion of the first interlevel insulating layer, placed on one of the source and drain regions 96, is selectively removed, forming a bit line contact hole 106. Referring to FIG. 13e, a metal layer 104 is deposited on the overall surface of the first interlevel insulating layer 105a to be buried in the bit line contact hole 106. Thereafter, the metal layer is patterned to form the first and second bit lines 104a and 104b perpendicular to the first and second split word lines 93a and 93b.

Referring to FIG. 13f, second interlevel insulating layer 105b is formed on the overall surface of the substrate including first and second bit lines 104a and 104b. Portions of the second interlevel insulating layer 105b, the first bit line 104a (second bit line 104b in case of block B) and the first interlevel insulating layer 105 are selectively removed, to form a capacitor contact hole 107. Referring to FIG. 13g, the first capacitor electrode layer 95 is formed on the second interlevel insulating layer 105b, filling the capacitor contact hole 107. A ferroelectric layer 99 and a second capacitor electrode layer 100 are sequentially formed thereon. The second capacitor electrode layer 100, the ferroelectric layer 99 and the first capacitor layer 95 are patterned to form a capacitor.

Figure 13I:
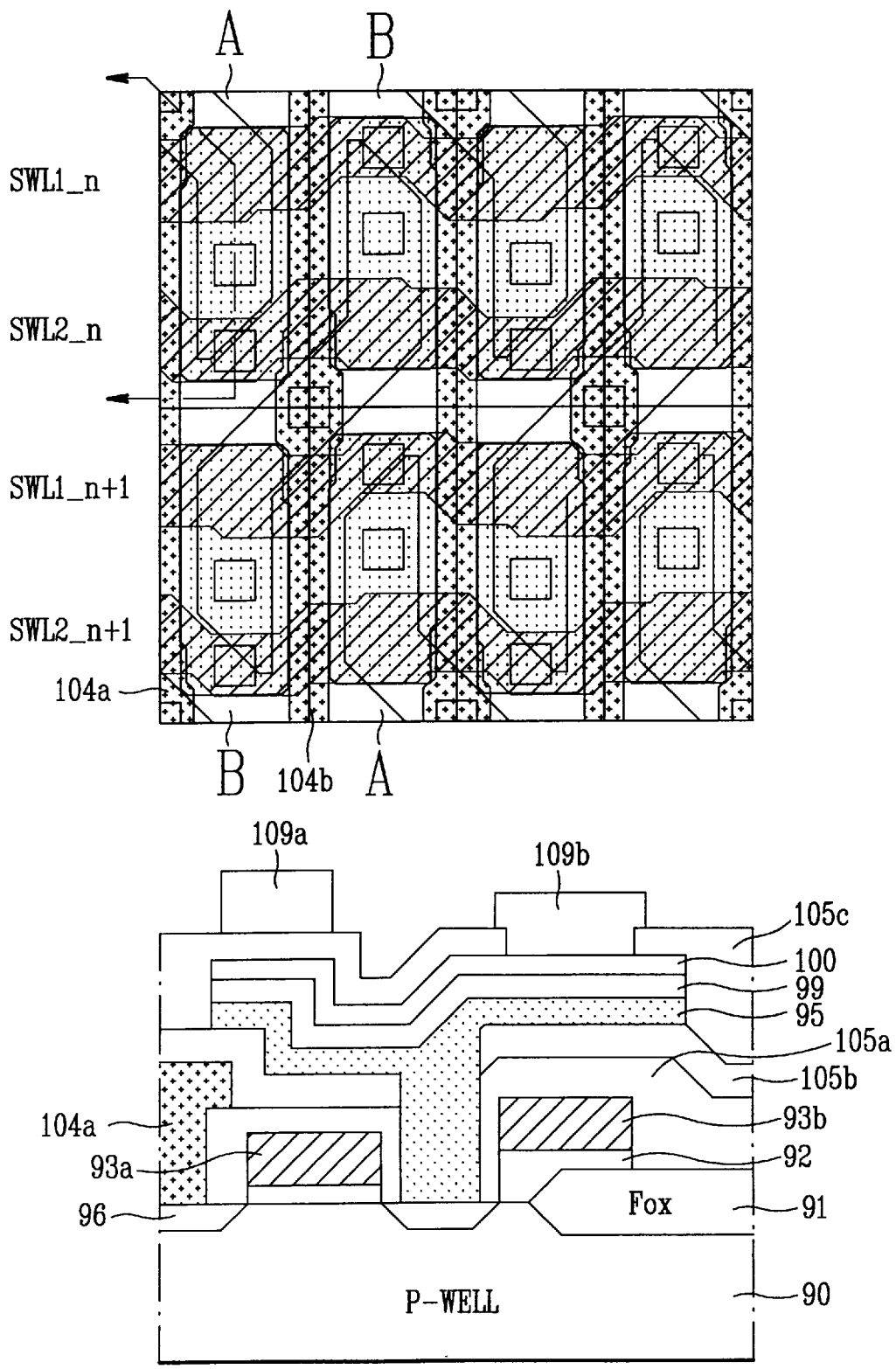

Referring to FIG. 13h, a third interlevel insulating layer 105c is formed on the overall surface of the substrate, and a portion of the third interlevel insulating layer 105c, placed on second capacitor electrode 100, is selectively removed to form a shunt split word line contact hole 108. Referring to FIG. 13i, a metal layer is formed on the third interlevel insulating layer 105c including the shunt split word line contact hole 108, and selectively etched to form the first and second shunt split word lines 109a and 109b.

The first shunt split word line 109a and the first split word line 93a come into contact with each other at a predetermined point of a peripherical region around the cell array to receive the same signal. Similarly, the second shunt split word line 109b and the second split word line 93b come into contact with each other at a predetermined point of a peripherical region around the cell array so that the same signal can be applied to the two lines.

Figure 14:
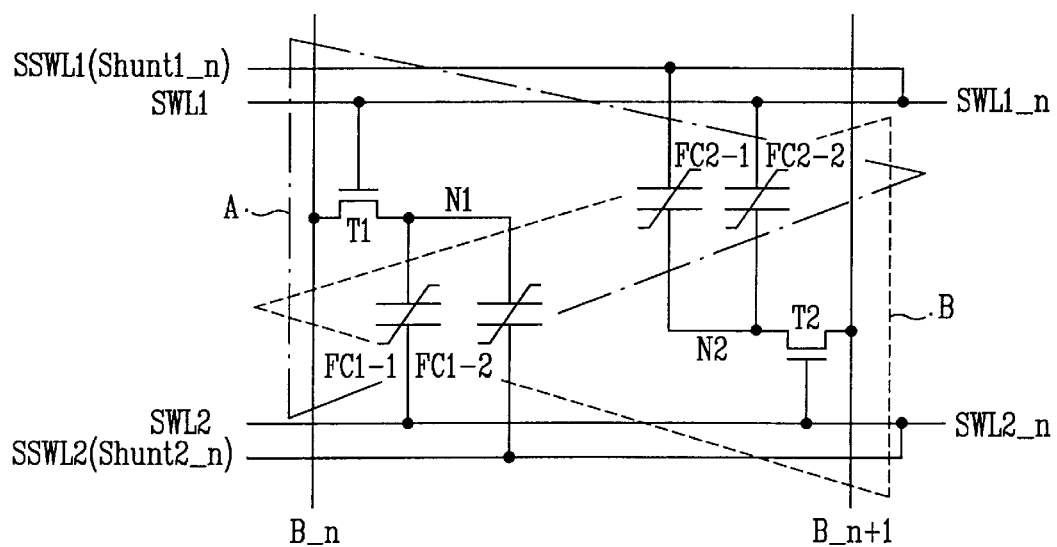
FIG. 14 illustrates another alternative block division of the ferroelectric memory layout according to a third preferred embodiment of the present invention.

FIG. 14 illustrates another example of block division layout of the ferroelectric memory device according to a third preferred embodiment of the present invention. Shunt split word lines SSWL1 and SSWL2, each of which is connected to one capacitor of each ferroelectric capacitor, are added to the split word lines SWL1 and SWL2. Referring to FIG. 14, two pieces of data can be stored per unit SWL memory cell, a pair of split word lines SWL1 and SWL2 (including shunt split word lines SSWL1 and SSWL2) corresponds to one row, and a pair of bit lines Bit_n and Bit_n+1 comprises two columns.

The unit SWL memory cell includes the first and second split word lines SWL1 and SWL2 arranged parallel with each other, and the first and second shunt split word lines SSWL1 and SSWL2 branching from the first and second split word lines SWL1 and SWL2 respectively. A first transistor T1 has a gate connected to the first split word line SWL1, and a second transistor T2 has a gate connected to the second split word line SWL2. A bit line Bit_n is connected to one electrode, e.g., drain, of first transistor T1 and is arranged perpendicular to the first and second split word lines SWL1 and SWL2. A bit line Bit_n+1 is connected to one electrode, e.g., drain of the second transistor T2, and is arranged parallel with bit line Bit_n and perpendicular to the first and second split word lines SWL1 and SWL2.

A first lower ferroelectric capacitor FC1-1 includes a second electrode connected to an electrode, e.g., source, of the first transistor T1, and a first electrode connected to the second split word line SWL2. A first upper ferroelectric capacitor FC1-2 includes a second electrode connected to an electrode, e.g., source, of the transistor T1, and a first electrode connected to the second shunt split word line SSWL2. A second lower ferroelectric capacitor FC2-1 includes a second electrode connected to an electrode, e.g., source, of the transistor T2, and a first electrode connected to the first shunt split word line SSWL1. A second upper ferroelectric capacitor FC2-2 includes a second electrode connected to an electrode, e.g., source, of the second transistor T2, and a first electrode connected to the first split word line SWL1.

In this third preferred embodiment of the present invention, the unit SWL cell (the basic unit for storing two pieces of data) is formed over an area covering two blocks A and B. The block A corresponds to an active region isolated by the isolation layer, and block B corresponds to the adjacent active region. The block A includes the first transistor T1, the first lower and upper ferroelectric capacitors FC1-1 and FC1-2, the second lower and upper ferroelectric capacitors FC2-1 and FC2-2, the bit line B_n, the node 1 (N1) and the first shunt split word line SSWL1, and the block B includes the second transistor T2, the first lower and upper ferroelectric capacitors FC1-1, FC1-2, the second lower and u8pper ferroelectric capacitors, the bit line B_n+ 1, node 2 (N2) and the second shunt split word line SSWL2.

As described above, one unit SWL cell is constructed in such a manner that one active region includes the first transistor T1 and the second lower and upper ferroelectric capacitors FC2-1 and FC2-2. The neighboring active region includes the second transistor T2 and first lower and upper ferroelectric capacitors FC1-1 and FC1-2. The second electrodes of the second lower and upper ferroelectric capacitors FC2-1 and FC2-2 are connected to the second transistor T2. The second electrodes of the first lower and upper ferroelectric capacitors FC1-1 and FC1-2 are connected to the first transistor T1. The first ferroelectric capacitors FC1-1 and FC1-2 and the second ferroelectric capacitors FC2-1 and FC2-2 have the same configuration and are arranged symmetrically. Further, the layout of blocks A and B on a substrate is the same as the previous embodiments.

A method of fabricating the ferroelectric memory device according to the third embodiment of the present invention is illustrated in FIGS. 15a to 15r. Referring to FIG. 15a, an isolation layer 91 is formed on a predetermined portion of a semiconductor substrate 90, through a field oxidation process, to define the active regions on which cell transistors and ferroelectric capacitors will be formed. Referring to FIG. 15b, in order to form the first and second split word lines SWL1 and SWL2, a gate oxide layer 92, a polysilicon layer 93, a conductive barrier layer 94 and a first capacitor electrode layer 95 are sequentially formed on the overall surface of the semiconductor substrate 90 including the active regions. The stacked layers are patterned through photolithography to form the first and second split word lines 93a and 93b.

The conductive barrier layer 94 may be oxidized by subsequent heat treatment to be changed into a material layer with a high resistance. To prevent this, the patterned first capacitor electrode 95 and the polysilicon layer 93 come into contact with each other on a predetermined portion of the peripheral circuit region. The first capacitor electrode 95 is preferably formed of a metal such as Pt.

Referring to FIG. 15c, N+ impurities are implanted into the exposed active regions using the first and second split word lines 93a and 93b as a mask, and heat treated to form the source and drain regions 96. Referring to FIG. 15d, first thin oxide layer 97a is formed on the overall surface of the substrate. Referring to FIG. 15e, a planarizing insulation layer 98 is formed on the first oxide layer 97a to fill an area between the first and second split word lines 93a and 93b. The planarizing insulation layer 98 may be formed of SOG or BPSG.

Referring to FIGS. 15f and 15g, when the planarizing insulation layer 98 is formed of SOG, it is heat-treated at a temperature of 800 to 900° C. to shrink the volume by 20 to 30%. By heat treatment, the SOG is prevented from flowing during subsequent heat cycles and a deterioration of the characteristic is prevented. After improving the viscosity, the planarizing insulation layer 98 is removed by a predetermined thickness using an etchback process. A portion of the first oxide layer 97a is also removed to expose the first capacitor electrode 95.

Referring to FIG. 15h, first ferroelectric layer 99a of the lower capacitor is formed on the overall surface of the substrate including the exposed first capacitor electrode 95. Referring to FIG. 15i, a metal layer, such as Pt, is deposited on the first ferroelectric layer 99a to form the second capacitor electrode layer 100. Referring to FIG. 15j, the second capacitor electrode layer 100 is patterned to form the second capacitor electrode 100a.

Referring to FIG. 15k, a second oxide layer 97b is formed on the overall surface of the substrate including second capacitor electrode 100a. Referring to FIG. 15l, portions of the second oxide layer 97b, the first ferroelectric layer 99a, the planarizing insulation layer 98 and the first oxide layer 97a are selectively removed to form a contact hole 101 for allowing an electrode of the capacitor to come into contact with one electrode of the cell transistor.

Figure 15O:
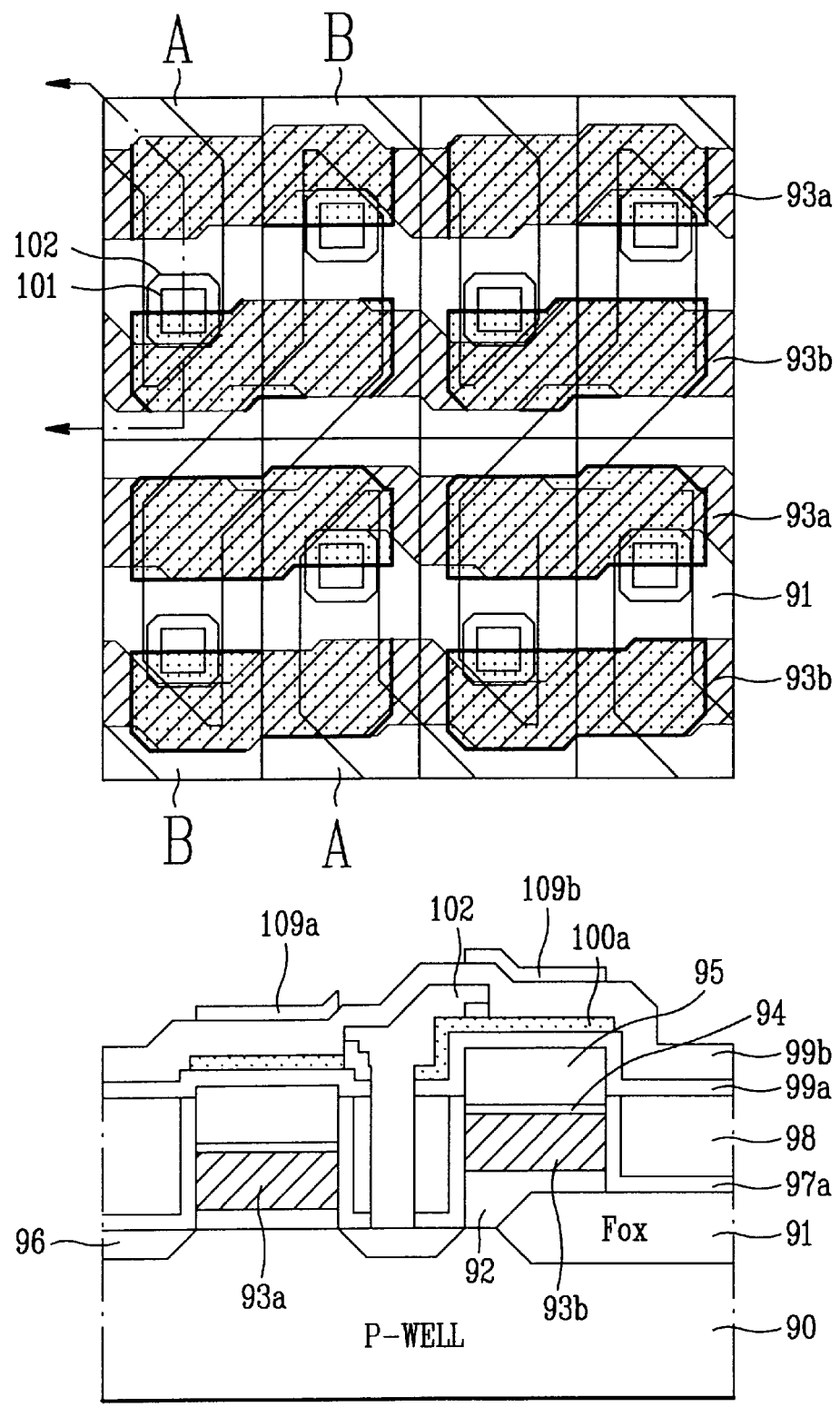
FIGS. 15a to 15r illustrate alternative layouts and fabrication steps of the ferroelectric memory according to a third preferred embodiment of the present invention.

Referring to FIG. 15m, a contact plug 102 is formed in the contact hole 101. Referring to FIG. 15n, a second ferroelectric layer 99b is formed on the overall surface of the substrate including the contact plug 102. Referring to FIG. 15o, a metal layer for forming the upper capacitor is formed on second ferroelectric layer 99b and is patterned to form the first and second shunt split word lines 109a and 109b having the same shape as the underlying split word lines 93a and 93b.

The first shunt split word line 109a and the first split word line 93a come into contact with each other at a predetermined point of a peripherical region around the cell array to receive the same signal. Similarly, the second shunt split word line 109b and the second split word line 93b come into contact with each other at a predetermined point of a peripheral region around the cell array so that the same signal can be applied to the two lines.

Figure 15Q:
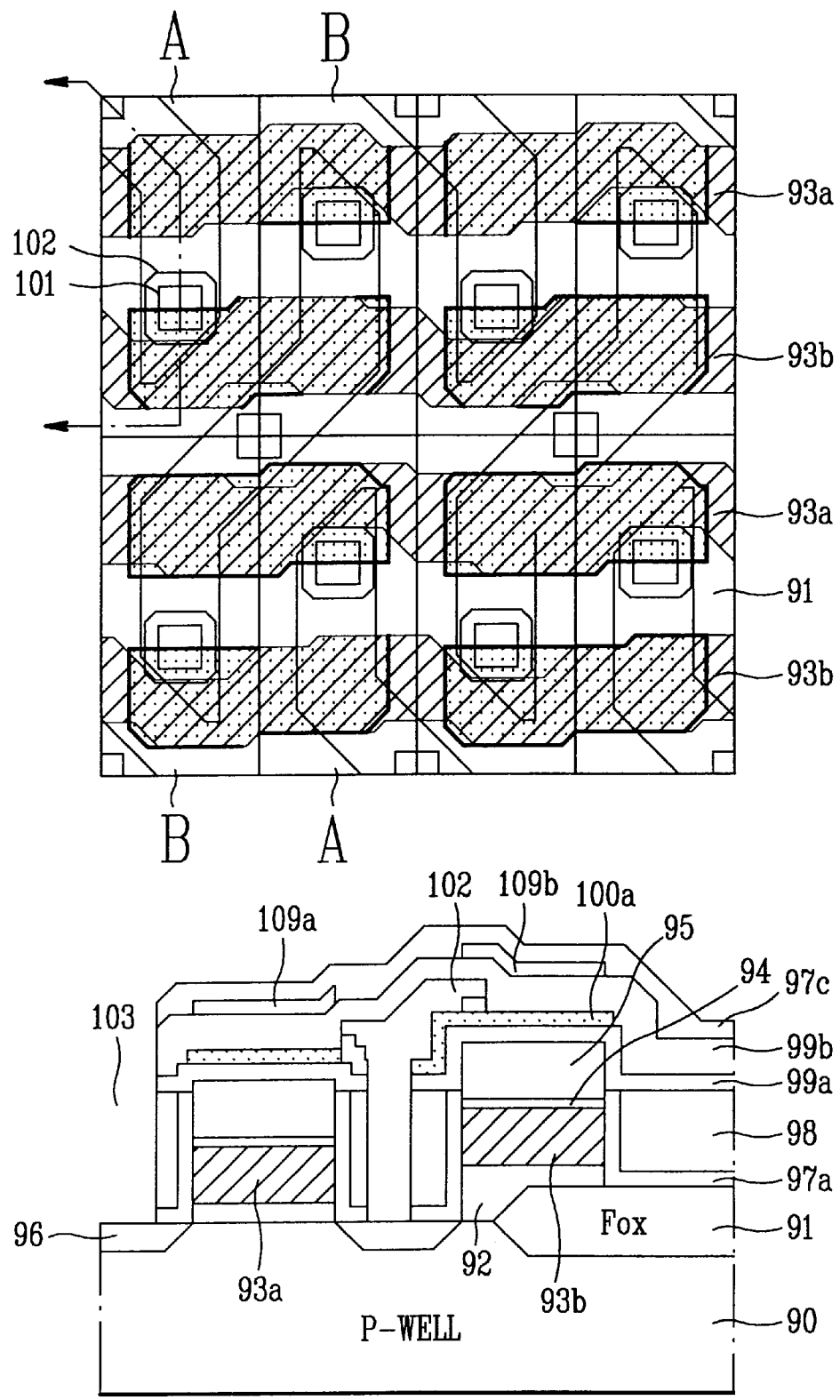

Referring to FIG. 15p, a third oxide layer 97c is formed on the overall surface of the substrate including the first and second shunt word lines 109a and 109b. Referring to FIG. 15q, portions of the third oxide layer 97c, the second ferroelectric layer 99b, the first ferroelectric layer 99a, the planarizing insulation layer 98 and the first oxide layer 97a are selectively removed to form a contact hole 103 for allowing the bit line to come into contact with the electrode of the cell transistor. Referring to FIG. 15r, a metal for forming the bit line is deposited on the overall surface of the substrate including the contact hole 103 and patterned, to form the first and second bit lines 104a and 104b perpendicular to the first and second split word lines 93a and 93b.

The ferroelectric memory device according to the preferred embodiments of the present invention has various advantages. The ferroelectric memory device does not have separate cell plate lines, which allows simplified layouts and fabrication methods. The gate electrode of the transistor is designed to be used as an electrode of the ferroelectric capacitor, resulting in simplifying of the cross section structure of the ferroelectric memory device. The transistors and ferroelectric capacitors constructing one SWL unit cell are arranged in a block or a plurality of blocks, simplifying the layout structure. Further, the device characteristic is improved.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A ferroelectric memory device, comprising:
   first and second control lines insulatively formed over first and second active regions of a semiconductor substrate in a first direction, the first and second active regions being isolated from each other;
   first electrode regions formed in the first active region on both sides of the first control line and second electrode regions formed in the second active region on both sides of the second control line;
   a first ferroelectric layer formed over the first and second control lines;
   a first conductor connected to one of the second electrode regions of the second active region and formed on the first ferroelectric layer formed over the first control line;
   a second conductor connected to one of the first electrode regions of the first active region and formed on the first ferroelectric layer formed over the second control line; and
   first and second bit lines formed in a second direction, the first bit line being connected to the other one of the first electrode regions formed in the first active region, the second bit line being connected to the other one of the second electrode regions formed in the second active region.

2. The ferroelectric memory device of claim 1, wherein the semiconductor substrate is divided into a plurality of prescribed regions, and among neighboring four prescribed regions in a clockwise direction being a first block A, a first block B, a second block A and a second block B wherein such an arrangement is repeated in the semiconductor substrate, wherein the first active regions is formed in the first block A and continues into the second block A, which is arranged adjacent in a diagonal direction, and the second active region is formed in the first block B horizontally located next to the first block A and continues into the second block B vertically located next to the first block A, the first block B and the second block B being arranged in a diagonal direction.

3. The ferroelectric memory device of claim 2, wherein each prescribed region has a rectangular shape, the first direction being perpendicular to a longer side of the rectangular shape, and the second direction is parallel with the longer side of the rectangular shape.

4. The ferroelectric memory of claim 1, wherein said first control line comprises:
   a first split word line formed over a first gate oxide; and
   a first conductive layer formed over said first split word line.

5. The ferroelectric memory of claim 4, wherein said second control line comprises:
   a second split word line formed over a second gate oxide; and
   a second conductive layer formed over said second split word line.

6. The ferroelectric memory of claim 5, wherein said second conductive layer and said second conductor serves as a first electrode and a second electrode, respectively, of a first ferroelectric capacitor, and said first conductive layer and said first conductor serves as a first electrode and a second electrode, respectively, of a second ferroelectric capacitor.

7. The ferroelectric memory of claim 6, wherein a first conductive barrier layer is formed between said first split word line and said first conductive layer, and a second conductive barrier layer is formed between said second split word line and said second conductive layer.

8. The ferroelectric memory of claim 1, wherein said first and second conductors are one of conductive connection lines and contact plugs.

9. The ferroelectric memory of claim 5, further comprising:
   a second ferroelectric layer is formed over said first and second conductors, and first and second conductive layers; and
   first and second shunt lines formed on said second ferroelectric layer.

10. The ferroelectric memory of claim 9, wherein said first shunt line is formed over said first conductive layer and is coupled to said first split word line, and said second shunt line is formed over said second conductive layer and is coupled to said second split word line.

11. The ferroelectric memory of claim 10, wherein said second conductive layer and said second conductor serve as a first electrode and a second electrode, respectively, of a first lower ferroelectric capacitor, and said second shunt line and said second conductor serve as a first electrode and a second electrode, respectively, of a first upper ferroelectric capacitor.

12. The ferroelectric memory of claim 10, wherein said first conductive layer and said first conductor serve as a first electrode and a second electrode, respectively, of a second upper ferroelectric capacitor, and said first shunt line and said first conductor serve as a first electrode and a second electrode, respectively, of a second lower ferroelectric capacitor.

13. A ferroelectric memory device, comprising:

first and second split word lines parallel with each other;

first and second shunt split word lines branching from the first and second split word lines respectively;

a first transistor having a control electrode and first and second electrodes, the control electrode being coupled to the first split word line;

a second transistor having a control electrode and first and second electrodes, the control electrode being coupled to the second split word line;

a first bit line coupled to the first electrode of the first transistor;

a second bit line coupled to the first electrode of the second transistor;

a first ferroelectric capacitor having first and second electrodes and a ferroelectric material therebetween, the second electrode of the first ferroelectric capacitor being coupled to the second electrode of the first transistor, and the first electrode of the first ferroelectric capacitor being coupled to the second shunt split word line; and a second ferroelectric capacitor having first and second electrodes and a ferroelectric material therebetween, the second electrode of the second ferroelectric capacitor being coupled to the first electrode of the second transistor, the first electrode of the second ferroelectric capacitor being coupled to the first shunt split word line.

14. The ferroelectric memory of claim 13, further comprising:

a third ferroelectric capacitor having first and second electrodes and a ferroelectric material therebetween, the second electrode of the third ferroelectric capacitor being coupled to the second electrode of the first transistor and the first electrode of the third ferroelectric capacitor being coupled to the second shunt split word line; and a fourth ferroelectric capacitor having first and second electrodes and a ferroelectric material therebetween, the second electrode of the fourth ferroelectric capacitor being coupled to the second electrode of the second capacitor and the first electrode of the fourth ferroelectric capacitor being coupled to the first shunt split word line.

15. A ferroelectric memory device, comprising:

first and second control lines insulatively formed over first and second active regions of a semiconductor substrate in a first direction, the first and second active regions being isolated from each other;

first electrode regions formed in the first active region on both sides of the first control line;

second electrode regions formed in the second active region on both sides of the second control line;

first and second bit lines isolated from neighboring layers and formed in a second direction, the first bit line being coupled to one of the first electrode regions of the first active region, and the second bit line being coupled to one of the second electrode regions of the second active region;

a first capacitor having first and second electrodes and a ferroelectric material therebetween formed over the first active region and the second electrode of the first capacitor coupled to other electrode region formed in the first active region;

a second capacitor having first and second electrodes and a ferroelectric material therebetween formed over the second active region and the second electrode of the second capacitor coupled to other electrode region formed in the second active region;

a first shunt control line coupled to the first control line and coupled to the first electrode of the second capacitor; and second shunt control line coupled to the second control line and coupled to the first electrode of the first electrode.

16. The ferroelectric memory device of claim 15, wherein the semiconductor substrate is divided into a plurality of prescribed regions, and among neighboring four prescribed regions in a clockwise direction being a first block A, a first block B, a second block A and a second block B wherein such an arrangement is repeated in the semiconductor substrate, wherein the first active regions is formed in the first block A and continues into the second block A, which is arranged adjacent in a diagonal direction, and the second active region is formed in the first block B horizontally located next to the first block A and continues into the second block B vertically located next to the first block A, the first block B and the second block B being arranged in a diagonal direction.

17. The ferroelectric memory device of claim 16, wherein each prescribed region has a rectangular shape, the first direction being perpendicular to a longer side of the rectangular shape, and the second direction is parallel with the longer side of the rectangular shape.

18. The ferroelectric memory device of claim 15, wherein said first control line and said first shunt control line are coupled to each other, and said second control line and said second shunt control line are coupled to each other.

19. The ferroelectric memory device of claim 18, wherein said first and second directions are perpendicular to each other.

20. The ferroelectric memory device of claim 15, wherein said first control line comprises a first split word line formed over a first gate oxide and said second control line comprises a second split word line, a first insulation layer being formed over said first and second split word lines.

21. The ferroelectric memory device of claim 15, wherein each of said first and second capacitors comprises the second electrode of a conductive material having a cylindrical shape and coupled to the other electrode region, a ferroelectric layer formed on inner walls of the cylindrical shape, and the first electrode of a conductive material filled within the inner walls of the ferroelectric layer.

22. The ferroelectric memory device of claim 15, wherein each of said first and second capacitors comprises the second electrode of a conductive material overlapping said first and second control lines and coupled to the other electrode region, a ferroelectric layer formed over the second electrode, and the first electrode of a conductive material formed over the ferroelectric layer.

* * * * *